(12) United States Patent
Yu et al.

(10) Patent No.: US 9,405,621 B2
(45) Date of Patent: Aug. 2, 2016

(54) GREEN EMMC DEVICE (GED) CONTROLLER WITH DRAM DATA PERSISTENCE, DATA-TYPE SPLITTING, META-PAGE GROUPING, AND DIVERSION OF TEMP FILES FOR ENHANCED FLASH ENDURANCE

(71) Applicant: Super Talent Technology, Corp., San Jose, CA (US)

(72) Inventors: Frank Yu, Palo Alto, CA (US);
Abraham C. Ma, Fremont, CA (US);
Shimon Chen, Los Gatos, CA (US)

(73) Assignee: Super Talent Technology, Corp., San Jose, CA (US)

( * ) Notice: Subject to any disclaimer, the term of this patent is extended or adjusted under 35 U.S.C. 154(b) by 203 days.

(21) Appl. No.: 14/298,808

(22) Filed: Jun. 6, 2014

(65) Prior Publication Data

US 2014/0310574 A1 Oct. 16, 2014

Related U.S. Application Data

(63) Continuation-in-part of application No. 13/730,797, filed on Dec. 28, 2012, now Pat. No. 8,954,654, and a continuation-in-part of application No. 13/927,435, filed on Jun. 26, 2013, now Pat. No. 9,223,642.

(51) Int. Cl.
*G06F 12/00* (2006.01)
*G06F 13/00* (2006.01)
(Continued)

(52) U.S. Cl.
CPC .......... *G06F 11/1072* (2013.01); *G06F 3/0616* (2013.01); *G06F 3/0619* (2013.01); *G06F 3/0659* (2013.01); *G06F 3/0679* (2013.01); *G06F 3/0685* (2013.01); *G06F 12/0246* (2013.01); *G06F 12/0871* (2013.01);
(Continued)

(58) Field of Classification Search
CPC ....... G06F 3/06; G06F 12/02; G06F 11/1072; G06F 12/0246; G06F 12/0804; G06F 12/0871; G06F 2212/401; G06F 2212/402; G06F 2212/7203; G06F 2212/7208; G06F 3/0616; G06F 3/0619; G06F 3/0659; G06F 3/0679; G06F 3/0685
USPC ......................................................... 711/103
See application file for complete search history.

(56) References Cited

U.S. PATENT DOCUMENTS 6,000,006 A * 12/1999 Bruce ................. G06F 11/1068
711/103
6,523,102 B1 * 2/2003 Dye ...................... G06F 12/023
709/247

(Continued)

*Primary Examiner* — Sheng-Jen Tsai
(74) *Attorney, Agent, or Firm* — Stuart T. Auvinen; gPatent LLC

(57) ABSTRACT

A controller for a Super Enhanced Endurance Device (SEED) or Solid-State Drive (SSD) increases flash endurance using a DRAM buffer. Host accesses to flash are intercepted by the controller and categorized as data types of paging files, temporary files, meta-data, and user data files, using address ranges and file extensions read from meta-data tables. Paging files and temporary files are optionally written to flash. Full-page and partial-page data are grouped into multi-page meta-pages by data type in the DRAM before storage by lower-level flash devices such as eMMC, UFS, or iSSD. Caches in the DRAM buffer for storing each data type are managed and flushed to the flash devices by the controller. Write dates are stored for pages or blocks for management functions. A spare/swap area in DRAM reduces flash wear. Reference voltages are adjusted when error correction fails.

17 Claims, 54 Drawing Sheets

(51) Int. Cl.
*G06F 13/28*     (2006.01)
*G06F 11/10*     (2006.01)
*G06F 3/06*      (2006.01)
*G11C 29/00*     (2006.01)
*G06F 12/02*     (2006.01)
*G11C 11/56*     (2006.01)
*G06F 12/08*     (2016.01)
*G11C 13/00*     (2006.01)

(52) U.S. Cl.
CPC .......... G11C11/56 (2013.01); G11C 29/72 (2013.01); *G06F 12/0804* (2013.01); *G06F 2212/401* (2013.01); *G06F 2212/402* (2013.01); *G06F 2212/7203* (2013.01); *G06F 2212/7208* (2013.01); *G11C 13/0004* (2013.01); *G11C 29/765* (2013.01); *G11C 2211/5641* (2013.01)

(56) References Cited

U.S. PATENT DOCUMENTS

| | | | | |
|---|---|---|---|---|
| 6,661,421 B1* | 12/2003 | Schlapp | .................... | G06T 1/60 345/501 |
| 9,223,642 B2* | 12/2015 | Yu | ........................ | G06F 11/00 |
| 2006/0136656 A1* | 6/2006 | Conley | ................ | G06F 12/0246 711/103 |
| 2010/0161883 A1* | 6/2010 | Kurashige | ............. | G06F 3/0619 711/103 |
| 2010/0174846 A1* | 7/2010 | Paley | .................. | G06F 12/0246 711/103 |
| 2010/0174847 A1* | 7/2010 | Paley | .................. | G06F 12/0246 711/103 |
| 2011/0055458 A1* | 3/2011 | Kuehne | ............... | G06F 12/0246 711/103 |
| 2011/0219208 A1* | 9/2011 | Asaad | ..................... | G06F 15/76 712/12 |
| 2011/0276744 A1* | 11/2011 | Sengupta | ............ | G06F 12/0866 711/103 |
| 2012/0284587 A1* | 11/2012 | Yu | ......................... | G06F 3/0608 714/773 |
| 2013/0145085 A1* | 6/2013 | Yu | ....................... | G06F 12/0246 711/103 |
| 2013/0163328 A1* | 6/2013 | Karakulak | ............. | G11C 16/10 365/185.2 |
| 2013/0205076 A1* | 8/2013 | Schuette | ............ | G06F 12/0246 711/103 |
| 2013/0297880 A1* | 11/2013 | Flynn | ..................... | G06F 1/183 711/128 |
| 2013/0318196 A1* | 11/2013 | Yamamoto | .......... | G06F 12/0871 709/215 |
| 2014/0006688 A1* | 1/2014 | Yu | .......................... | G11C 16/10 711/103 |
| 2014/0281151 A1* | 9/2014 | Yu | ............................. | G06F 1/30 711/103 |
| 2015/0106556 A1* | 4/2015 | Yu | ........................ | G06F 3/0608 711/103 |

* cited by examiner

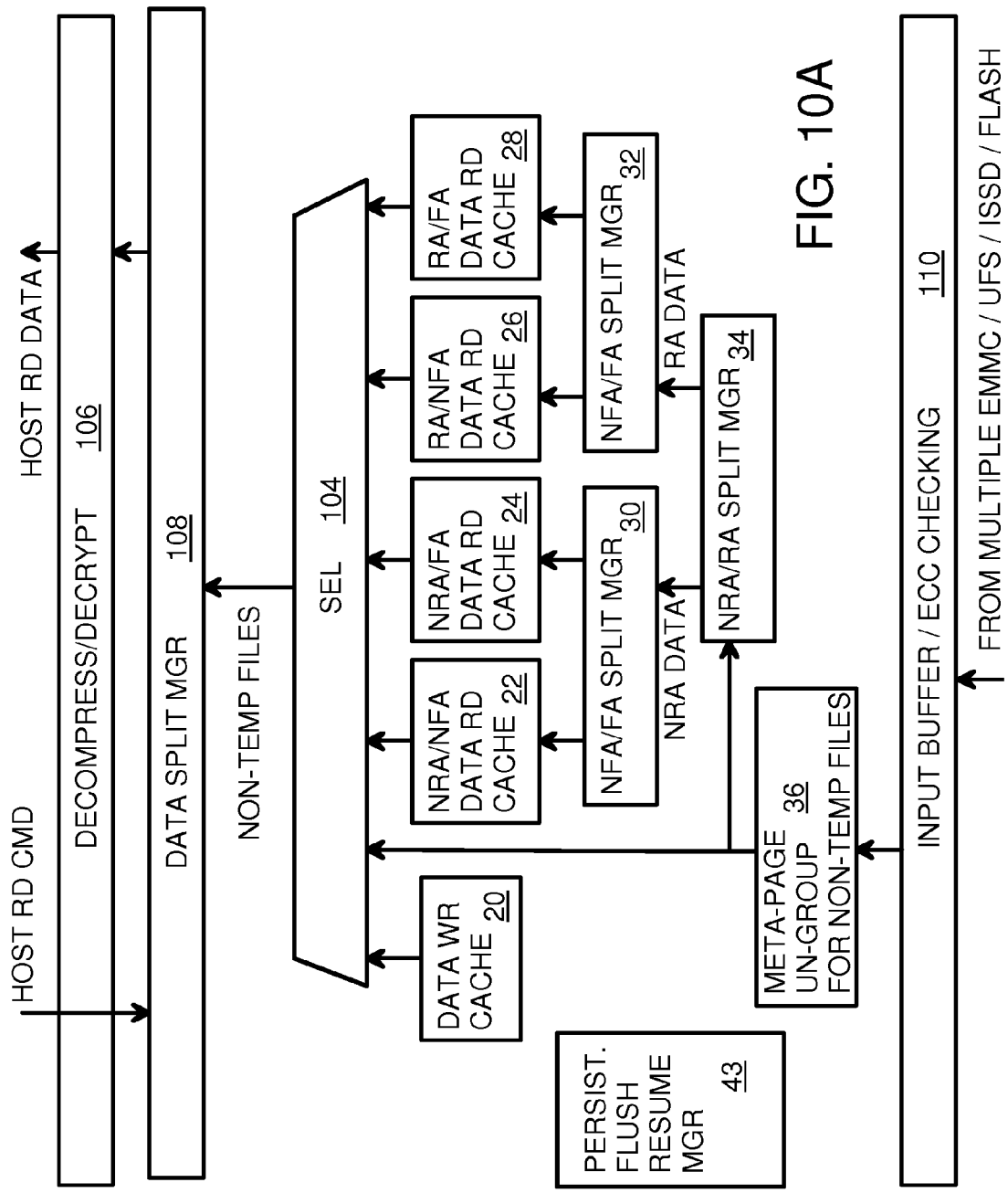

FIG. 11

SEED SSD DRAM 194

| Section | Ref |
|---|---|
| SEED SSD SYSTEM USE | 284 |
| CACHE FOR META DATA & TBLS | 140 |
| CACHE FOR TEMP FILES | 142 |
| CACHE FOR PAGING FILES | 144 |
| CACHE FOR NON-TEMP DATA WRITE | 234 |
| DATA IN BUFFER | 280 |
| NRA/NFA DATA READ CACHE | 290 |
| NRA/FA DATA READ CACHE | 291 |
| RA/NFA DATA READ CACHE | 292 |
| RA/FA DATA READ CACHE | 293 |
| META-PAGE GROUPING BFRS & TBLS | 282 |
| META-PAGE UN-GROUPING BFRS | 278 |
| MAPPING TBLS | 148 |
| FLUSH/RESUME MGR | 277 |
| S.M.A.R.T. DATA COLLECTOR | 170 |

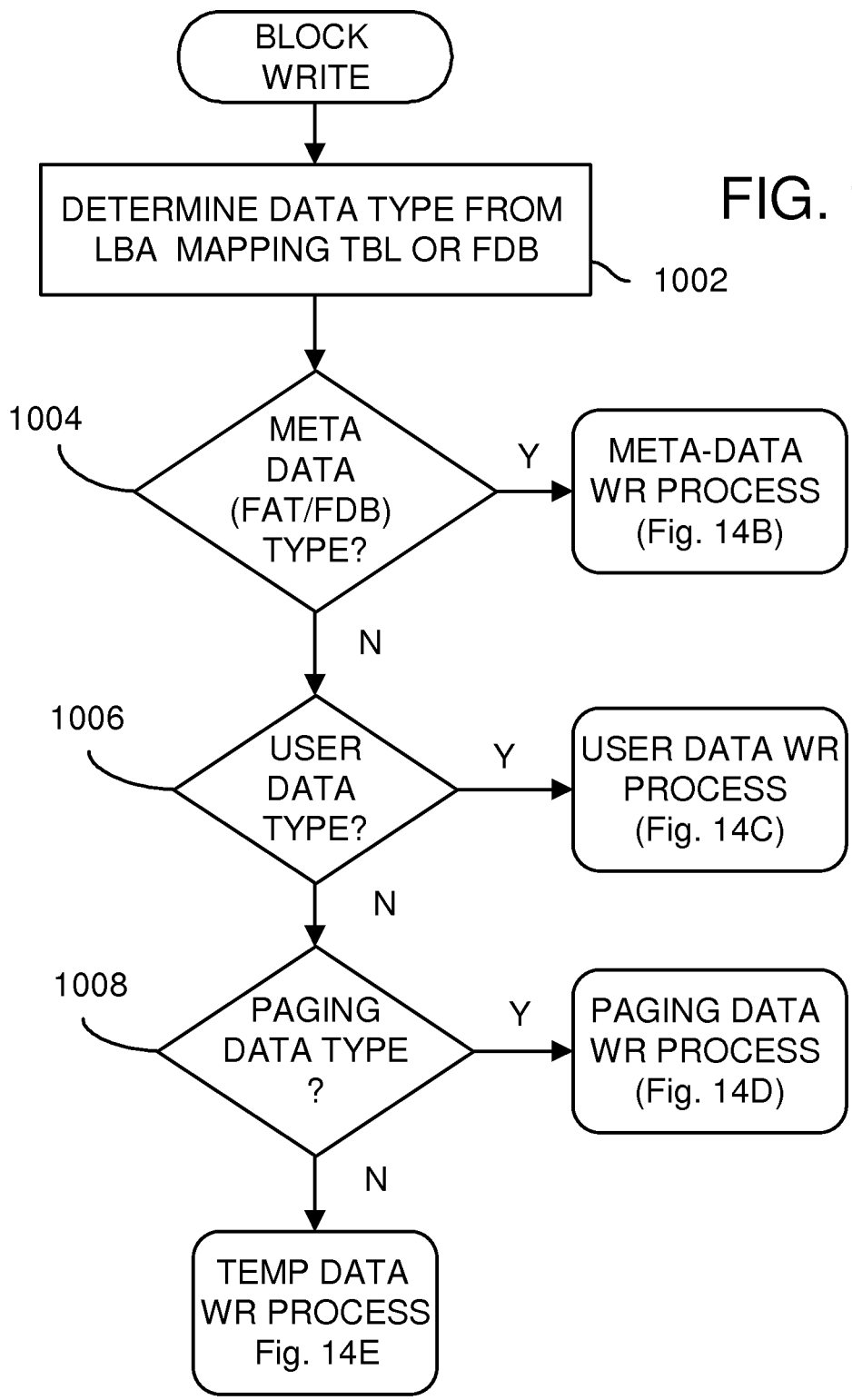

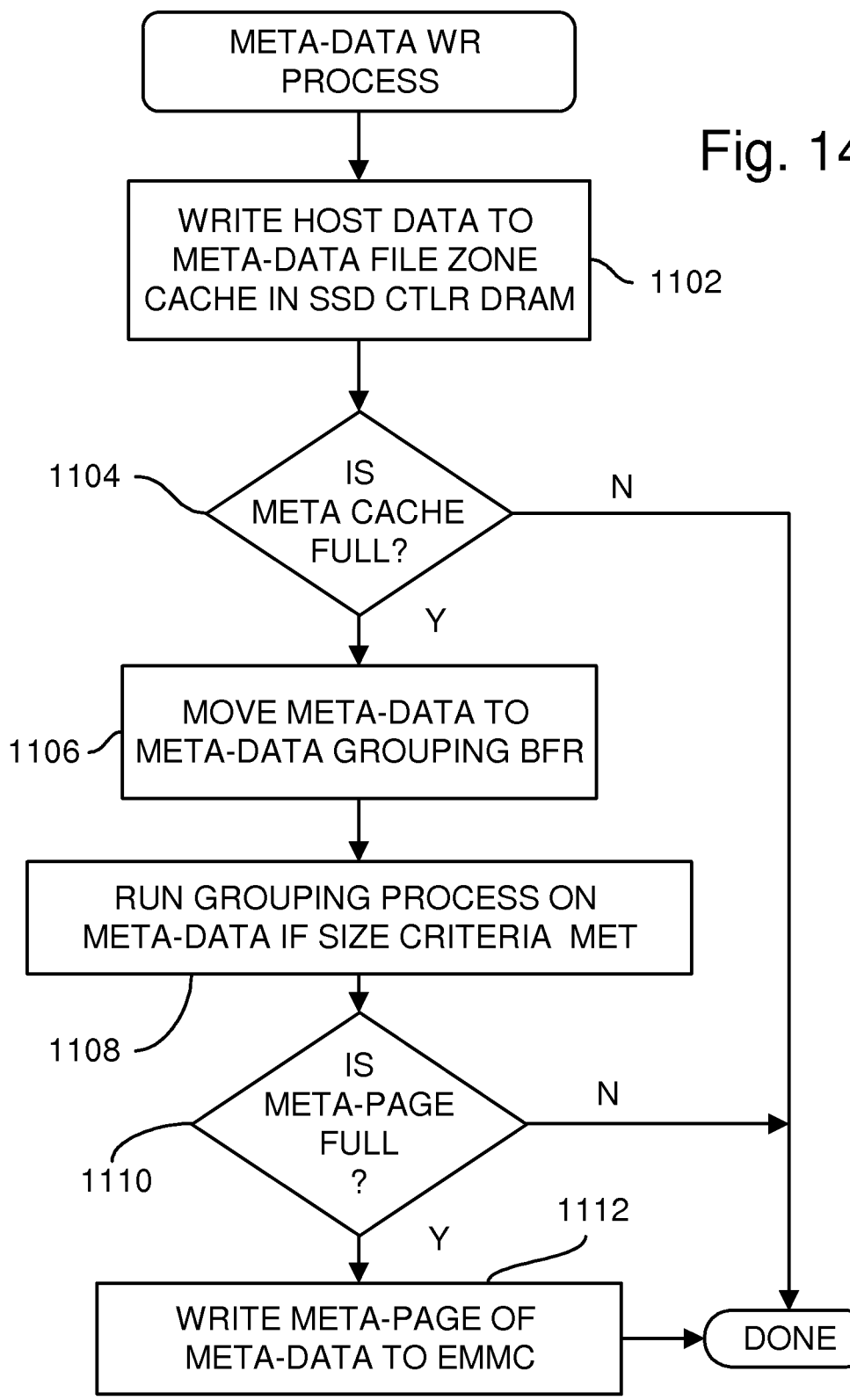

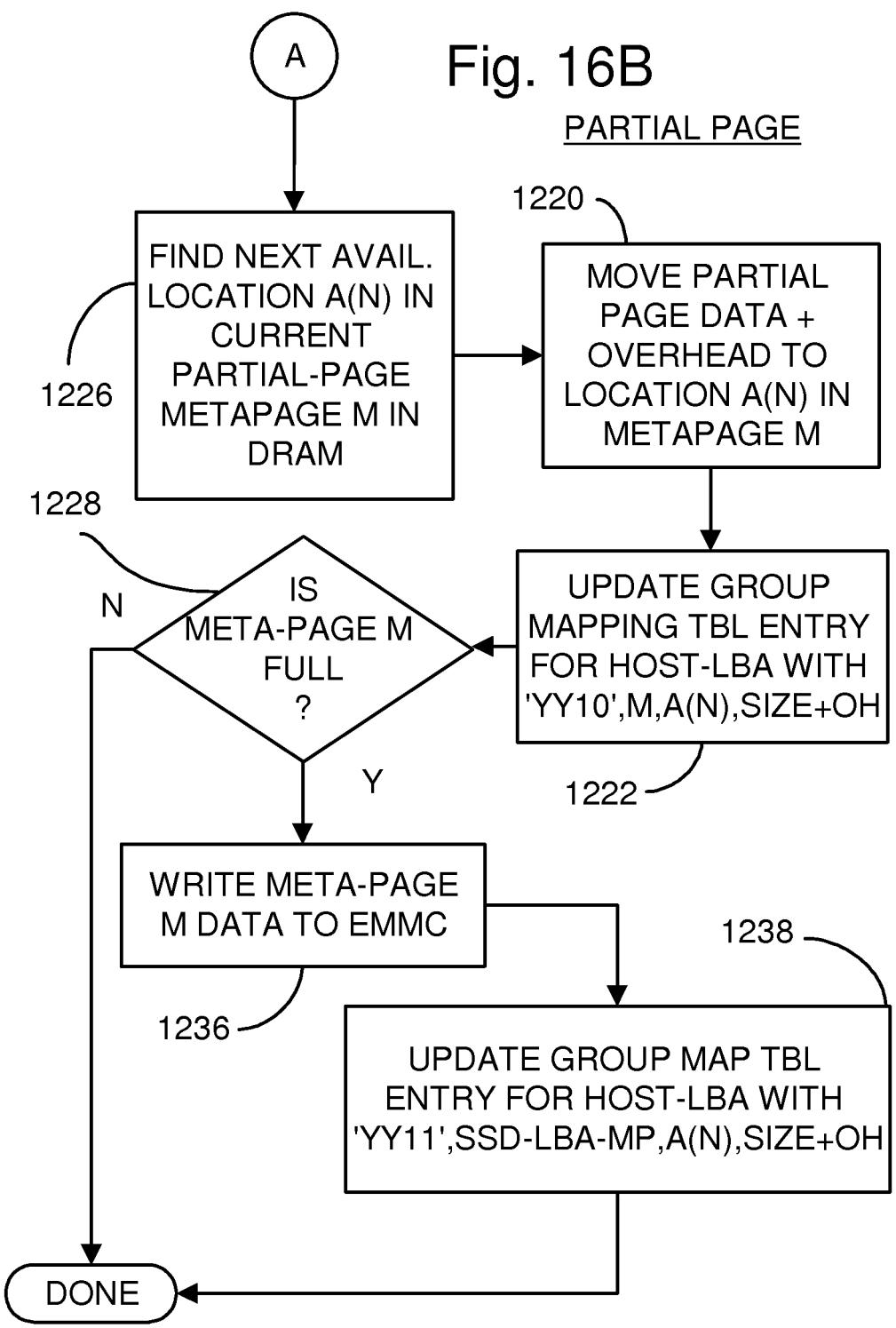

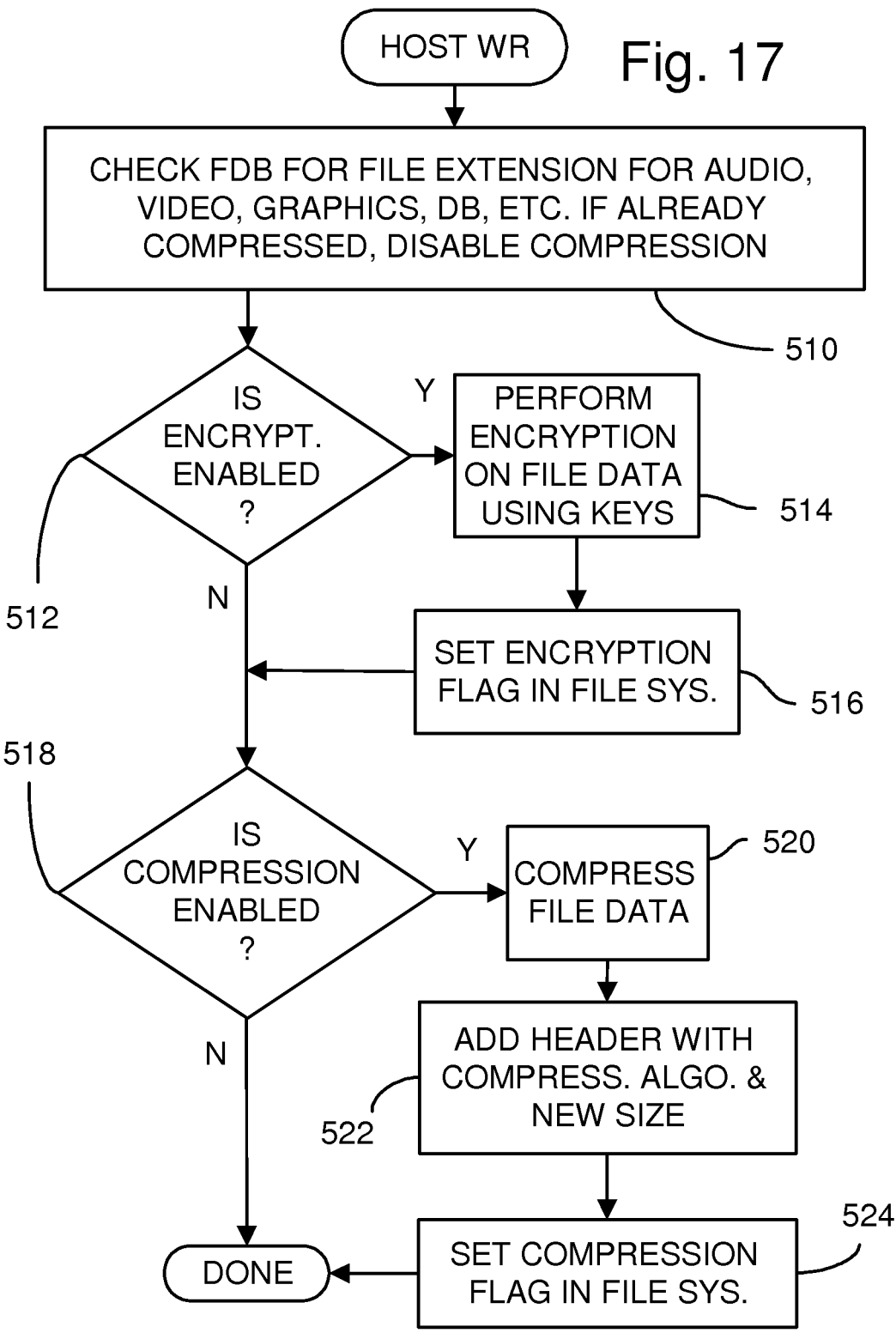

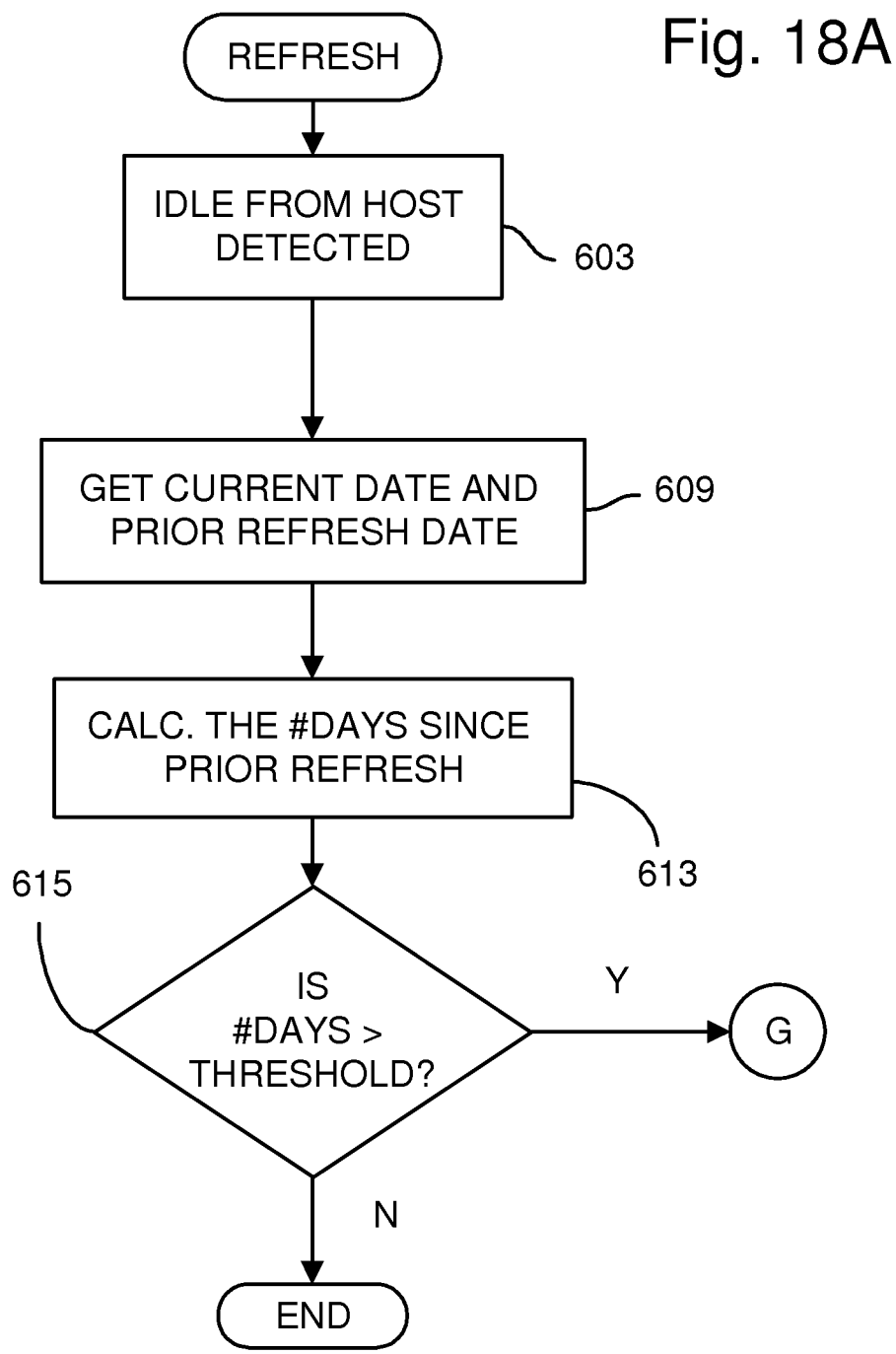

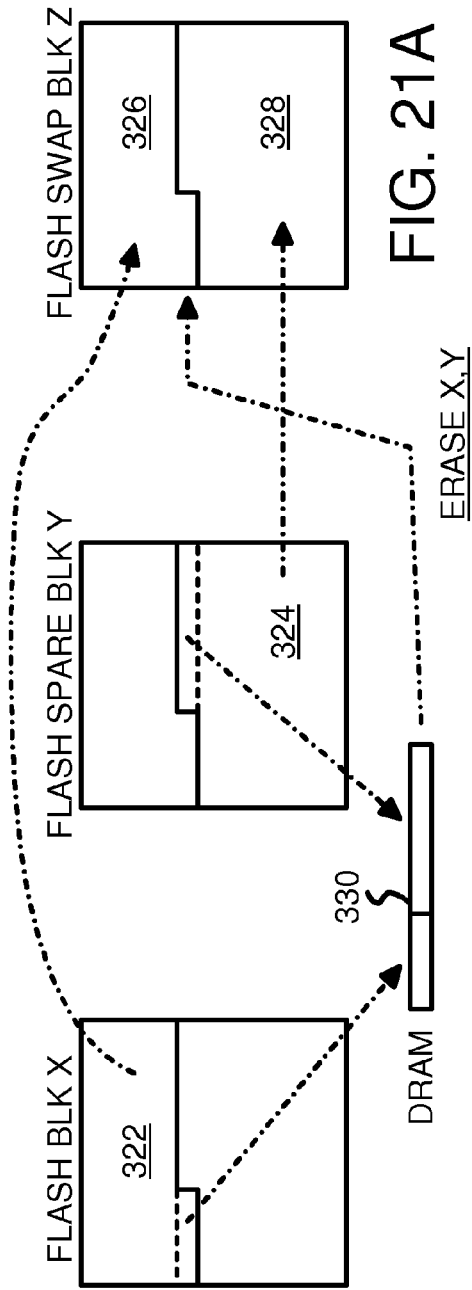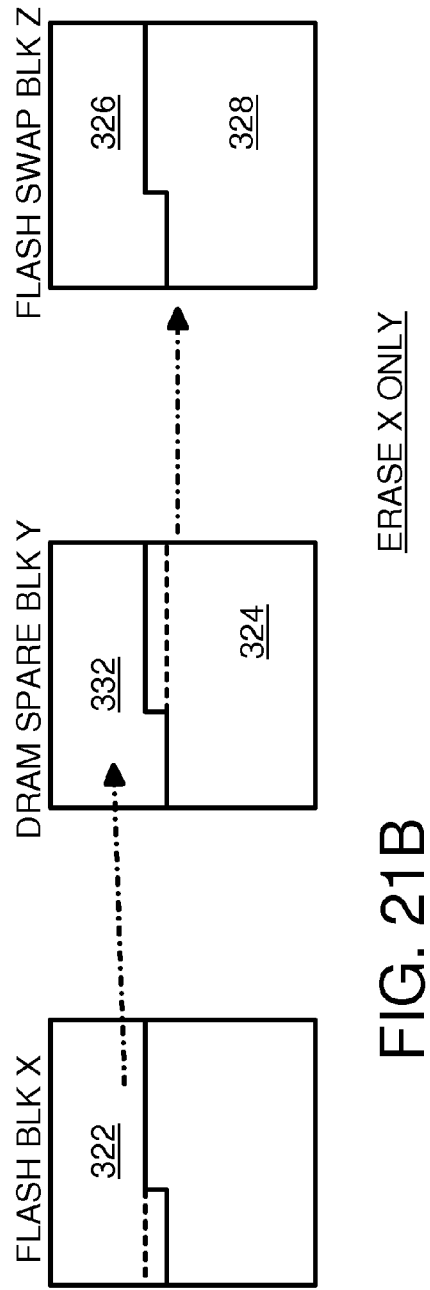

FIG. 23A

BLK WRITE DATE STORED

| BLK STATUS $3^b$ | ERASE CNT $13^b$ | WR DATE $16^b$ |
|---|---|---|

BAD BLK/ERASE CNT TABLE
471

| PG STATUS $3^b$ |
|---|

473

PAGE STATUS TABLE

FIG. 23B

PAGE WRITE DATE STORED

| BLK STATUS | ERASE CNT |
|---|---|
| $3^b$ | $13^b$ |

BAD BLK/ERASE CNT TABLE
471'

| PG STATUS | WR DATE |
|---|---|
| $3^b$ | $16^b$ |

PAGE STATUS TABLE
473'

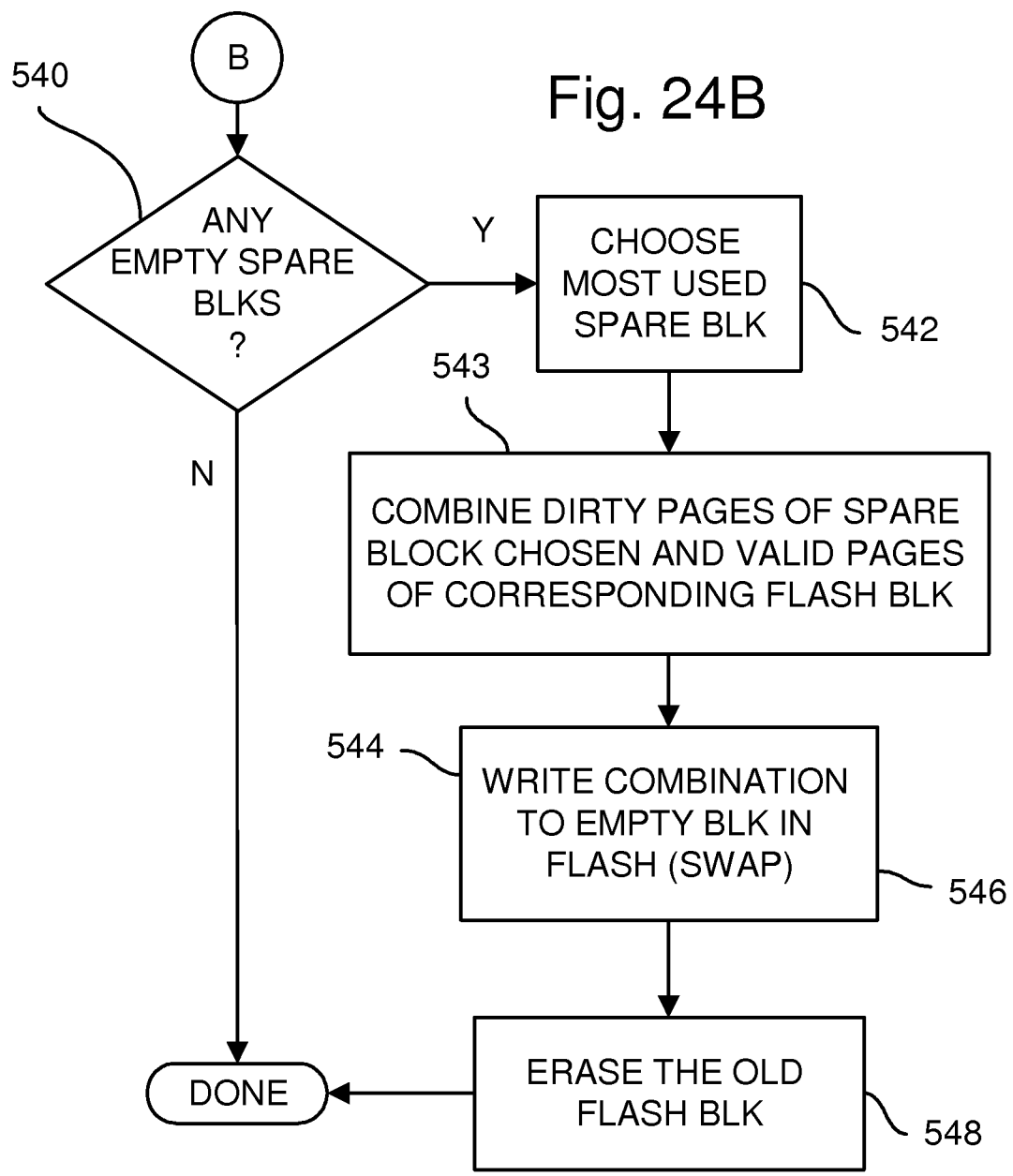

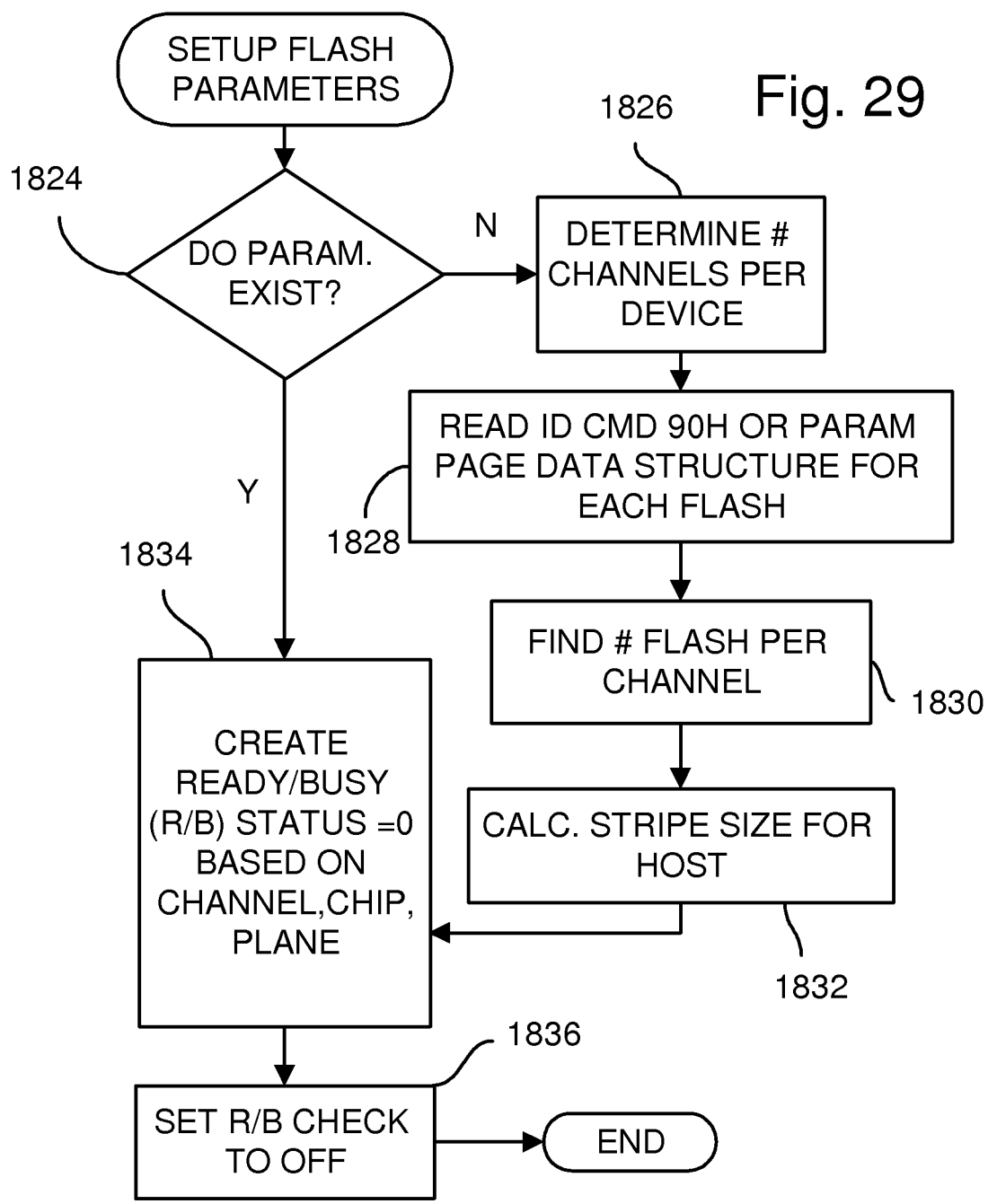

US 9,405,621 B2

GREEN EMMC DEVICE (GED) CONTROLLER WITH DRAM DATA PERSISTENCE, DATA-TYPE SPLITTING, META-PAGE GROUPING, AND DIVERSION OF TEMP FILES FOR ENHANCED FLASH ENDURANCE

RELATED APPLICATION

This application is a Continuation-In-Part (CIP) of the co-pending applications for "Virtual Memory Device (VMD) Application/Driver with Dual-Level Interception for Data-Type Splitting, Meta-Page Grouping, and Diversion of Temp Files to Ramdisks for Enhanced Flash Endurance", U.S. Ser. No. 13/730,797, filed Dec. 28, 2012, and "Green NAND Device (GND) Driver with DRAM Data Persistence For Enhanced Flash Endurance and Performance", U.S. Ser. No. 13/927,435 filed Jun. 26, 2013.

FIELD OF THE INVENTION

This invention relates to Solid-State Drives (SSDs), and more particularly to controllers for increased-endurance and longevity.

BACKGROUND OF THE INVENTION

Hard Disks with rotating magnetic platters are being replaced with more reliable Solid-State Drives (SSDs) using semiconductor flash memory. NAND flash memory, invented by Dr. Fujio Masuoka of Toshiba in 1987, uses electrically-erasable programmable read-only memory (EEPROM) cells that store charge on a floating gate. Cells are typically programmed by an avalanche current, and then erased using quantum-mechanical tunneling through a thin oxide. Unfortunately, some electrons may be trapped in the thin oxide during program or erase. These trapped electrons reduce the charge stored in the cell on subsequent program cycles when a constant programming voltage is applied. The programming voltage may need to be raised to compensate for the trapped electrons.

As the density and size of flash memory has increased, the cell size, cell reliability, and lifetime have all been reduced. The number of program-erase cycles that a flash memory is guaranteed to be able to withstand was around 100,000 cycles, which allowed for a lengthy lifetime under normal read-write conditions. However, smaller flash cells have experienced a disturbingly higher wear. Newer flash memories may be spec'ed at less than 10,000 program-erase cycles for two-level cells and about 600 program-erase cycles for Triple-Level Cells (TLC). If current trends continue, future flash memories may only allow for 300 program-erase cycles. Such a low endurance could severely limit the use of flash memory, severely impacting Solid-State-Disk (SSD) applications.

It is likely that the underlying flash technology will have lower endurance in the future. Flash drives may compensate for the lower wear tolerance of the underlying flash memories by a variety of techniques. For example, a DRAM buffer on the flash drive may act as a write back cache, reducing the number of writes to the underlying flash memories when the host repeatedly writes to the same data location.

Since DRAM is volatile, data is lost when power is removed. Various battery, super-capacitor, and Universal-Power-Supply (UPS) systems may be used to keep the DRAM powered up and to provide power to store the DRAM contents to a non-volatile memory. SSD controllers that can make use of the various backup systems that may be present on any given system are desired.

Higher density flash memory devices have become more sophisticated. Low-level flash controllers and SRAM buffers have been integrated with the flash memory. Low-level management functions may be performed on the same silicon substrate or in the same package as the flash memory. Such low-level management functions may include a flash translation layer to cache data in the SRAM buffer, bad block management, error correction, wear-leveling, spare and swap blocks, and garbage collection.

It is desired to have a higher-level SSD controller that works with these sophisticated lower-level flash devices that integrate a low-level flash controller with flash memory. Such low-level controller/flash devices are known as Embedded Multi-Media Card (eMMC), Integrated Solid-State Drive (iSSD), and Universal Flash Storage (UFS) devices.

An endurance-enhancing controller for a standard Solid-State Drive (SSD) or a Super-Endurance flash drive is desired that uses advanced management techniques to reduce the number of writes to flash, hence reducing program-erase cycles on the underlying flash memory. A controller that uses one or more of several possible power backup systems to backup DRAM contents into flash memory is desired. A SSD controller that controls sophisticated controller/flash devices such as eMMC, UFS, or iSSD flash devices is desirable.

BRIEF DESCRIPTION OF THE DRAWINGS

FIGS. 10A-B show a flow diagram of data sorting and un-grouping for reads through a SEED controller.

FIG. 11 shows a memory map of SEED SSD DRAM.

FIGS. 14A-E show the SEED controller processing a host write command.

FIGS. 16A-B show a grouping process into meta-pages.

FIG. 17 shows encryption and compression processing by the SEED controller.

FIGS. 18A-B show a flash refresh operation processing by the SEED controller.

FIGS. 21A-B show spare and swap operations.

FIGS. 23A-B show bad block/erase count tables and page status tables for flash devices managed by a SEED eMMC endurance controller.

FIGS. 24A-B show spare/swap processing by SEED eMMC endurance controller.

FIG. 29 is a flowchart of setting up flash parameters.

DETAILED DESCRIPTION

The present invention relates to an improvement in high-endurance Solid-State Drives (SSD's). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
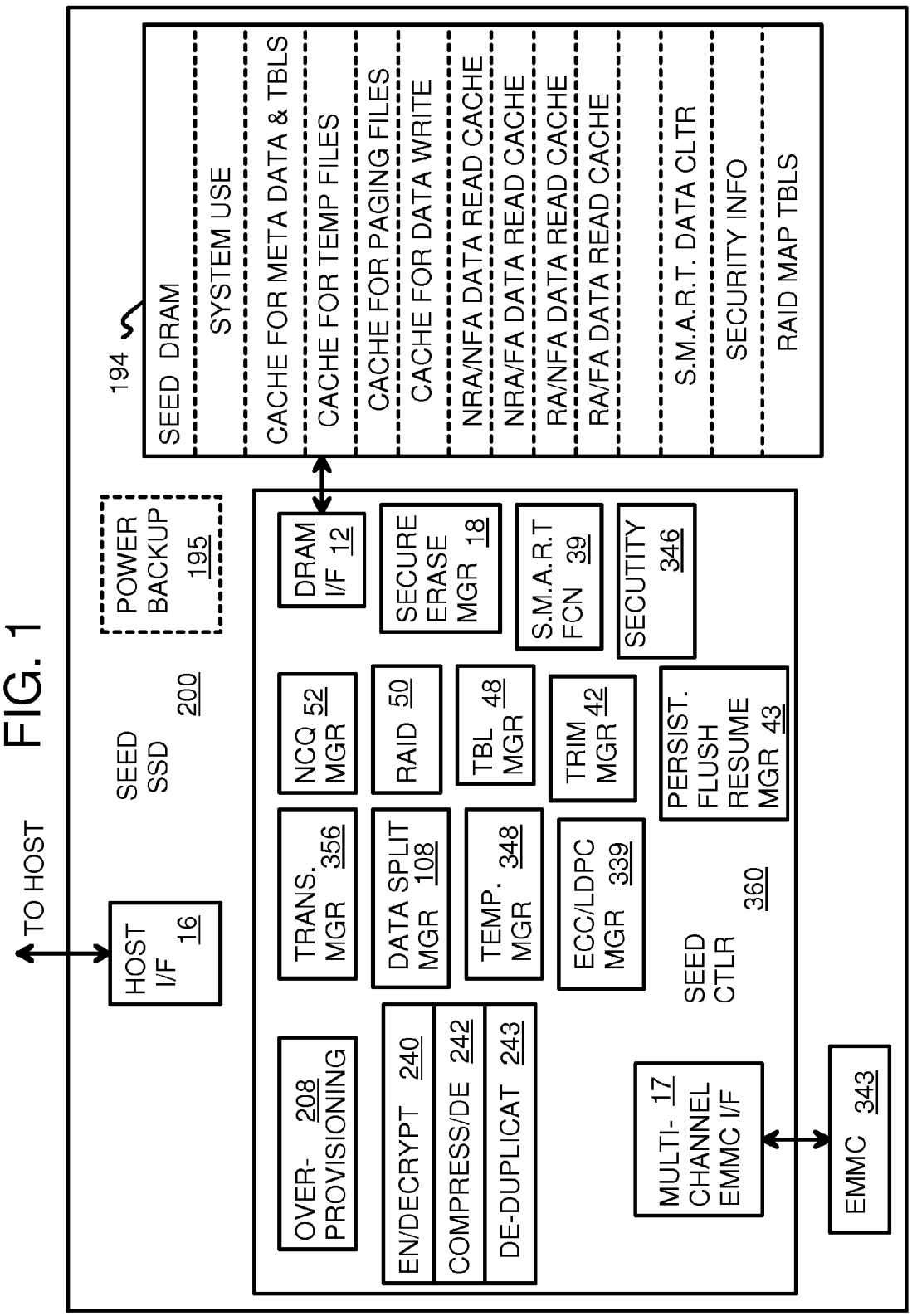
FIG. 1 is a block diagram of a Super Enhanced Endurance Device (SEED) with an endurance controller that stores data in eMMC.

FIG. 1 is a block diagram of a Super Enhanced Endurance Device (SEED) with an endurance controller that stores data in an eMMC or in multiple of eMMCs. In this embodiment, SEED SSD 200 interfaces to one or more embedded Multi-Media Card (eMMC) 343 that contains flash memory.

SEED SSD 200 has host interface 16, which communicates with a host using a bus such as a PCIe, SATA, Universal-Serial-Bus (USB), NVMe, Thunderbolt, eMMC, iSSD, etc. Host data from host interface 16 is sent to endurance controller SEED controller 360.

DRAM interface 12 reads and writes data in SSD DRAM buffer 194. SEED DRAM 340 may store one or more caches, S.M.A.R.T. information, firmware, RAID maps, and other buffers and tables. SSD DRAM buffer 194 may also store security information and other buffers and tables.

Persistent flush/resume manager 43 manages flushed data at power off and resume operations using previously flushed data. Temp manager 348 controls temp data. Security 346 manages security functions. Data may be operated upon by compression/decompression engine 242 and encryption/decryption engine 240. ECC/LDPC manager 339 manages pages of flash that need extra ECC protection, generating ECC for those pages, and managing storage and retrieval of the ECC data when needed. Low-Density Parity Check (LDPC) may be used rather than ECC.

Multi-channel eMMC interface 17 programs data in eMMC 343, which may be organized into several channels. Native Command Queue (NCQ) manager 52 may re-order host commands from the host and manage a queue of host commands received through host interface 16. NCQ manager 52 loads host commands into a command queue where writes are re-ordered and combined to reduce flash writes. RAID controller 50 writes new data across several channels of eMMC 343 and may replicate data to provide redundancy and data recovery.

Table manager 48 tracks the type of data that is stored in each logical block or page so that temp files, paging files, FAT, FDB, and user data files are tracked once identified and categorized by data split manager 108. Alternatively, the host can pass the data type information through vendor commands to SEED SSD 200 so data split manager 108 doesn't duplicate the work done by a virtual flash driver on the host. Alternately, this function can be optionally disabled for certain situations.

TRIM manager 42 processes a TRIM command from the file system or OS on the host. The TRIM command indicates that a sector is no longer needed by the host and can be wiped or erased. TRIM manager 42 will send the TRIM information to eMMC 343. De-Duplication engine 243 finds and deletes duplicate copies of data files to reduce the write load.

S.M.A.R.T. function 39 processes S.M.A.R.T. commands or vendor commands from the host, such as to monitor and control error correction, wear, bad block, and other flash memory management. S.M.A.R.T. function 39 will correct S.M.A.R.T. information from eMMC 343. The host can use S.M.A.R.T. command sets to monitor some important data from the SSD device such as power on time, wear-leveling count, etc. The Host can use this data to diagnose and identify the life expectancy of the SSD. It can also use the information to determine the warranty coverage based on the usage. The host can replace the SSD drive before it experiences a real casualty. When RAID is enabled, the host can use S.M.A.R.T. commands to avoid a more expensive RAID 5 configuration.

Transaction manager 356 ensures that data is completely written or transferred to eMMC 343. Over-provisioning 208 sets aside and manages spare blocks in eMMC 343. Secure erase manager 18 performs a higher-security erase operation such as writing all zeros or all ones to a block to remove data when required.

Power backup 195 optionally provides backup power so that SEED SSD 200 may write data from SSD DRAM buffer 194 to eMMC 343 when power fails.

When a virtual flash driver or similar software or firmware is running on the host, the flash driver may duplicate certain functions that are provided by SEED controller 360. The duplicated functions in SEED controller 360 may be disabled. Duplicated functions may include those performed by data split manager 108, de-duplication engine 243, temp manager 348, compression/decompression engine 242, encryption/decryption engine 240, persistent flush/resume manager 43, and meta-page grouping and ungrouping. Alternately, eMMC 343 can be UFS, iSSD, etc.

Figure 2:
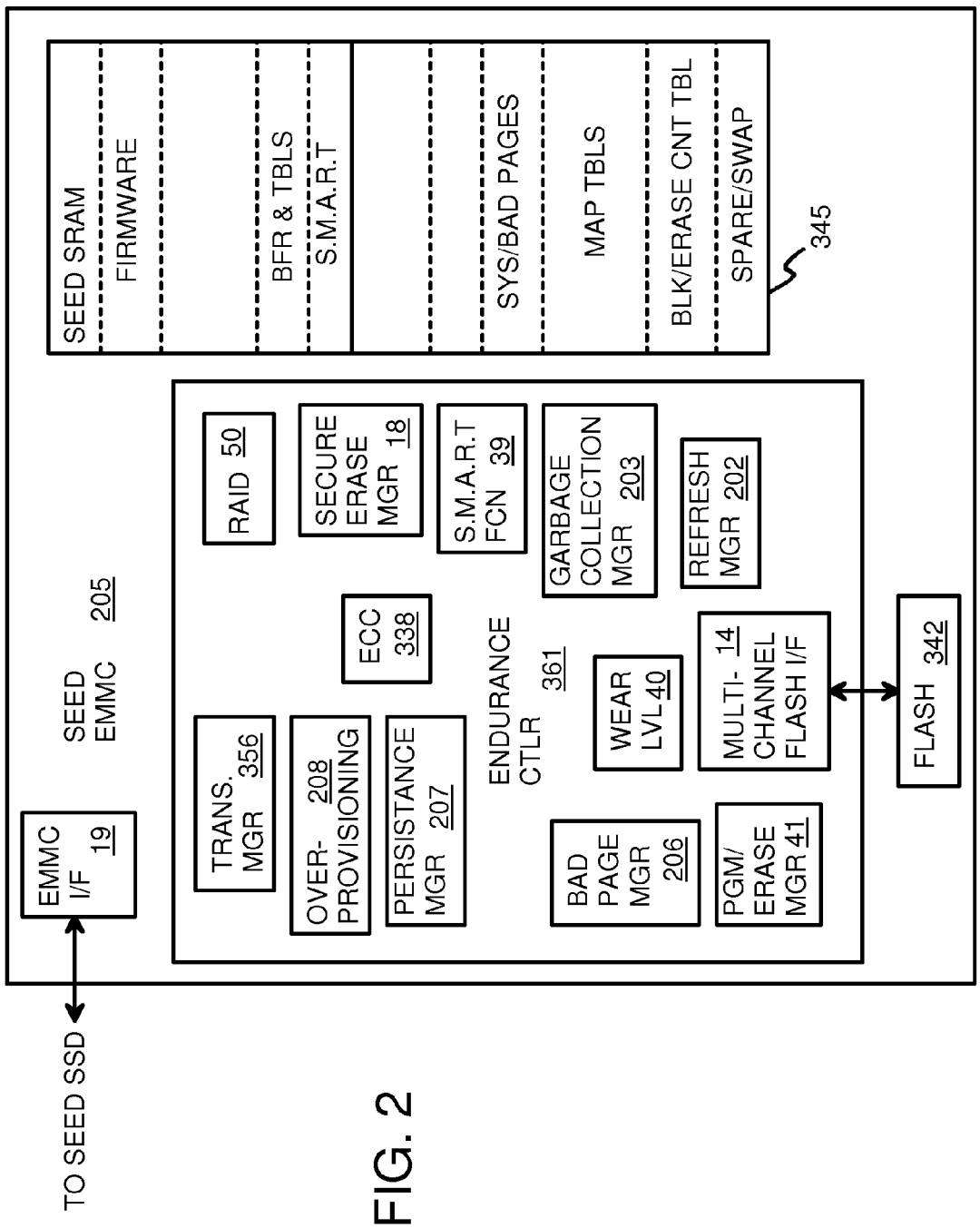
FIG. 2 is a block diagram of a Super Enhanced Endurance Device (SEED) eMMC with an endurance controller.

FIG. 2 is a block diagram of a Super Enhanced Endurance Device (SEED) eMMC with an endurance controller. In this alternative, SEED eMMC 205 interfaces directly to flash memory 342.

The eMMC protocol is used by eMMC host interface 19 to communicate with the host. Host data from eMMC host interface 19 is sent to endurance controller 361. Alternately, SEED SSD 200 (FIG. 1) may be inserted between the host and SEED eMMC 205, so that eMMC host interface 19 interfaces to SEED SSD 200. Then SEED eMMC 205 replaces eMMC 343 in FIG. 1.

SEED SRAM 345 may store S.M.A.R.T. information, firmware, tables for bad page management, mapping tables, erase count tables, spare and swap blocks, and other buffers and tables.

Refresh manager 202 may periodically refresh data in lower-level flash memory 342. Multi-channel flash interface 14 programs data pages and erases blocks in flash memory 342, which may be organized into several channels. ECC manager 338 generates low-level error-correction code (ECC) to attach to write data, and compares stored ECC to re-generated ECC to detect and correct errors on reads. It also manages pages of flash that need extra ECC protection, generating ECC for those pages, and managing storage and retrieval of the ECC data when needed. Bad page manager 206 keeps track of locations of bad pages in flash memory 342. This can extend the lifetime of individual blocks, since only one page may be bad in the block, and other pages may continue to be used. More complex bad-block management may reduce the overall wear of the flash drive.

Wear-leveler 40 may provide two methods for wear leveling. One method is to dynamically choose the lowest wear leveling count block from the available empty blocks to write data to. The other method is based on a wear leveling count threshold. Once this threshold is reached, blocks of flash data are moved from one physical block (with a low wear leveling count) to another empty physical block (with a high wear leveling count) in flash memory 342.

Program/erase manager 41 may slow page writing and block erasing time to help prolong the life of the oxide layer of flash memory cells. The slower page write/block erase time can be applied to TLC Flash to increase the endurance at the expense of decreased retention time.

S.M.A.R.T. function 39 processes S.M.A.R.T. commands or vendor commands from the host, such as to monitor and control error correction, wear, bad block, and other flash memory management. S.M.A.R.T. stands for Self-Monitoring, Analysis and Reporting Technology. The host can use S.M.A.R.T. command sets to monitor some important data from the SSD device such as power on time, wear-leveling count, etc. The Host can use this data to diagnoses and identify the life expectancy of the SSD. It can also use the information to determine the warranty coverage based on the usage. The host can replace the SSD drive before it experiences a real casualty. When RAID is enabled, the host can use S.M.A.R.T. commands to avoid a more expensive RAID 5 configuration.

Transaction manager 356 ensures that data is completely written or transferred to flash memory in flash memory 342. Over-provisioning 208 sets aside and manages spare blocks in flash memory 342. Secure erase manager 18 performs a higher-security erase operation such as writing all zeros or all ones to a block to remove data when required. RAID controller 50 writes new data across several channels of flash memory 342 and may replicate data to provide redundancy and data recovery. Alternately, SEED eMMC 205 can be SEED UFS, SEED iSSD.

Figure 3:
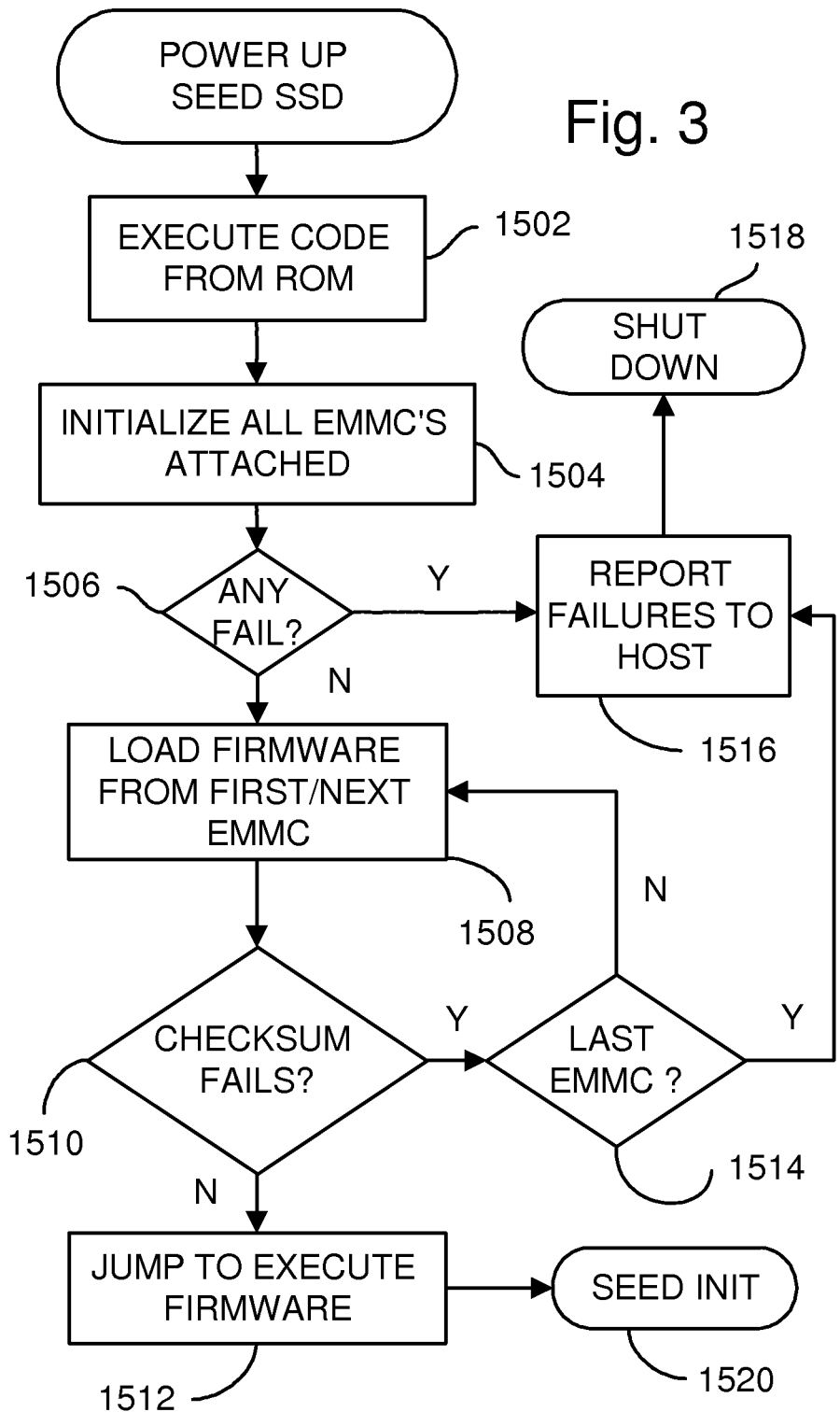
FIG. 3 is a flowchart of a power-up sequence to initialize and run code in downstream eMMC's.

FIG. 3 is a flowchart of a power-up sequence to initialize downstream eMMC's to run code. When SEED SSD 200 (FIG. 1) is powered up, code is executed from a ROM on SEED SSD 200, step 1502. All eMMC 343 that are attached downstream of SEED SSD 200 are initialized, step 1504, such as by sending reset commands to them If any eMMC 343 fail initialization, such as by reporting a failure status back to SEED SSD 200 or by not responding at all, step 1506, the failures are reported to the host, step 1516, and SEED SSD 200 shuts down, step 1518.

When no eMMC failures occur, step 1506, firmware is loaded from one of the eMMC's to a SEED SSD, step 1508. If a checksum calculated from the loaded firmware is different from the checksum written inside the firmware, the eMMC has a failing value, step 1510, the firmware residing in next eMMC can be loaded, if any, step 1514, can be loaded, step 1508. When none of the eMMC's have valid firmware, step 1514, the failures are reported to the host, step 1516, and SEED SSD 200 shuts down, step 1518.

If a checksum calculated from the loaded firmware is the same as the checksum written inside the firmware the eMMC has a passing value, step 1510, the firmware is executed by the SEED SSD, step 1512. SEED SSD 200 can be initialized as shown in FIG. 4, step 1520.

Figure 4:
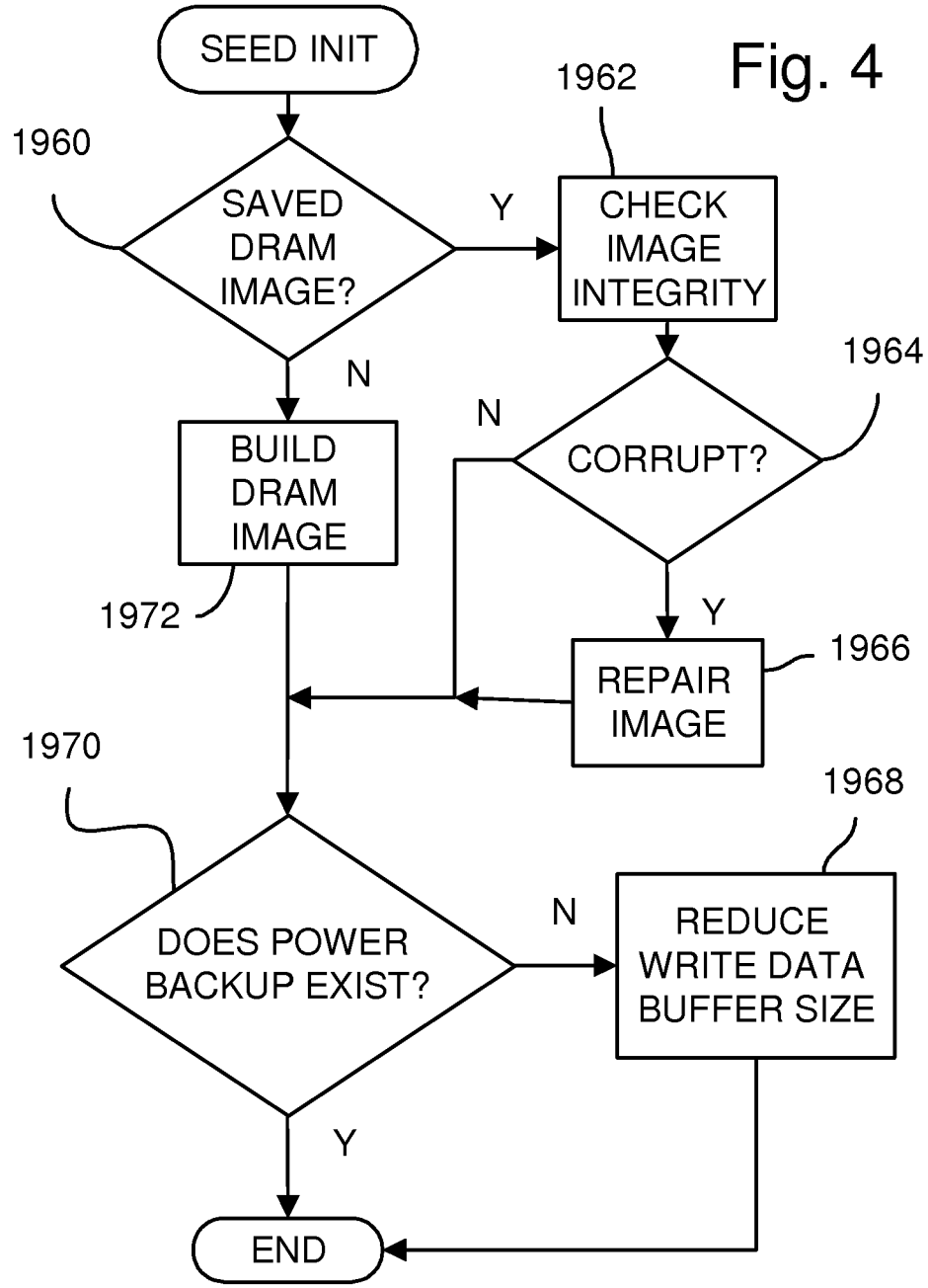
FIG. 4 shows a power-up routine for the SEED SSD.

FIG. 4 shows a power-up routine for the SEED SSD. SEED SSD's firmware is loaded and executed by the routine of FIG. 3. When a previously saved DRAM image is found, step 1960, such as in SSD DRAM buffer 194, the image integrity is checked, step 1962. If the image is corrupt, step 1964, then the image is repaired, step 1966.

Figure 5:
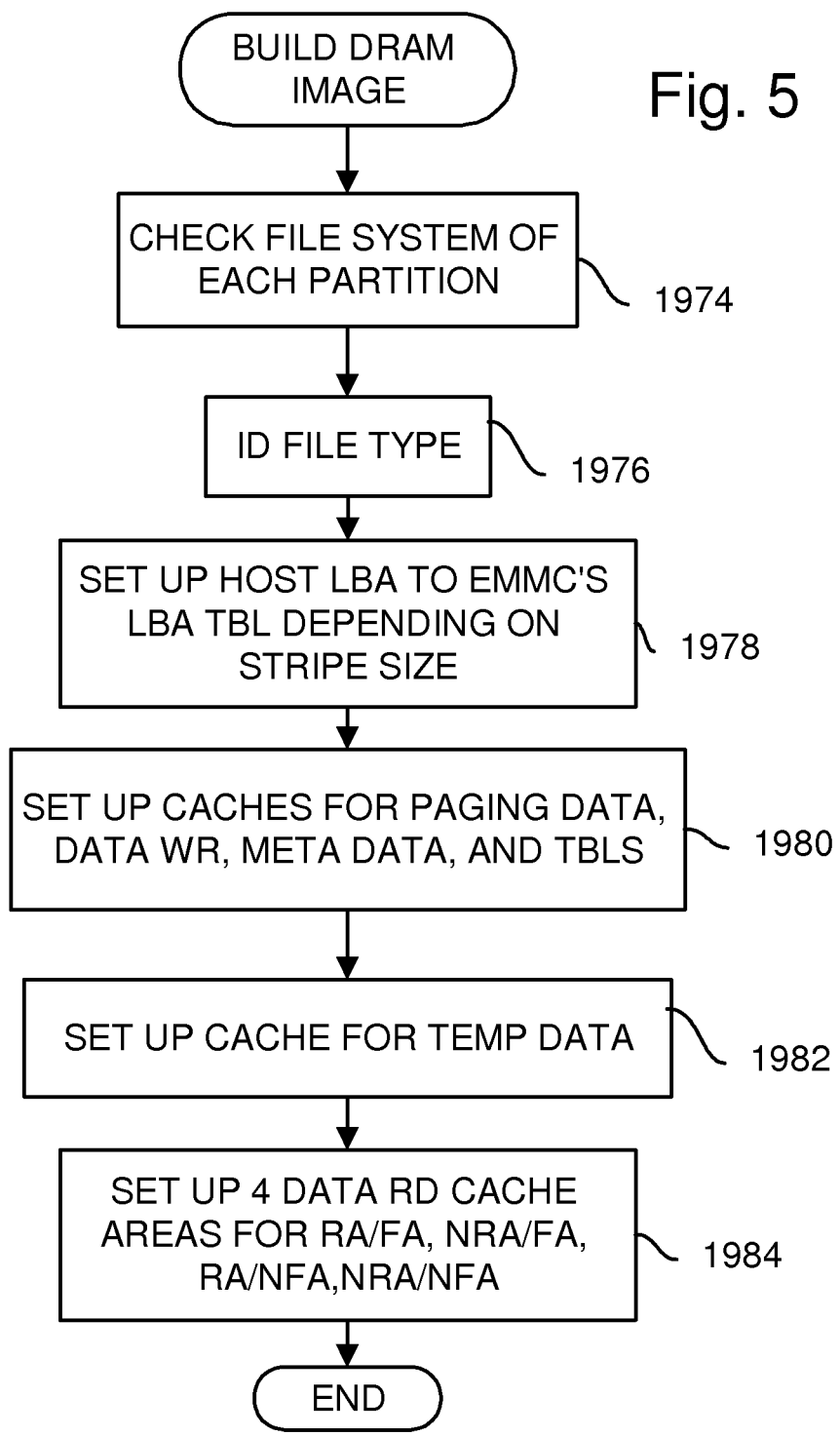
FIG. 5 shows the SEED controller or endurance controller building a DRAM image.

When no DRAM image is found, step 1960, then the DRAM image is constructed using the routine of FIG. 5, step 1972.

When backup power is not available, step 1970, the write data buffer size is reduced, step 1968. The smaller write buffer reduces the amount of data to flush on a power failure.

FIG. 5 shows the SEED controller or endurance controller building a DRAM image. The file system of each partition is checked, step 1974. File types are identified, step 1976. Mapping tables are constructed, step 1978. The mapping tables map host LBA addresses to eMMC LBA addresses as a function of the stripe size and arrangement of the eMMC's. In step 1980, caches are set up in SSD DRAM buffer 194 for paging data, data write, meta data, and other tables. A cache for temp data is also set up, step 1982. The data read caches for Non-Frequently-Accessed (NFA)/Non-Recently-Accessed (NRA), NFA/RA, FA/NRA, and FA/RA are also set up, step 1984.

Figure 6:
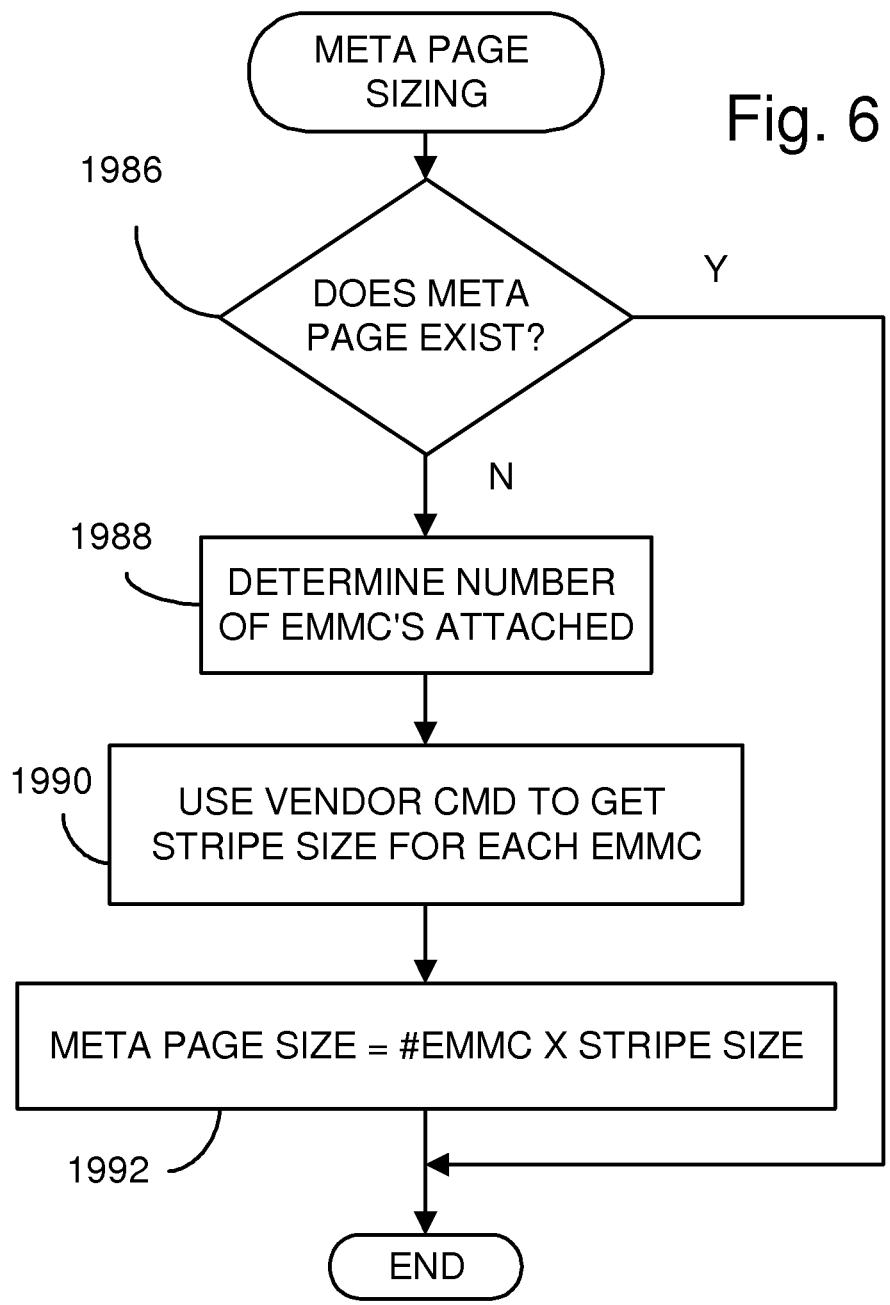
FIG. 6 shows a meta-page sizing routine.

FIG. 6 shows a meta-page sizing routine. This routine may be executed by SEED SSD 200 during initialization, or may be executed in response to a host command. The routine is skipped when meta pages' size already exist, step 1986. Otherwise, the number of attached eMMC 343 is determined, step 1988. Vendor commands are issued to each eMMC 343 to obtain the stripe size of each eMMC, step 1990. The meta page size is then calculated, step 1992. In one embodiment, the meta page size is the number of eMMC multiplied by the stripe size, when the stripe size is the same for all eMMC. In another embodiment, the meta page size is the sum of the stripe sizes for all eMMC, when the stripe size is not the same for all eMMC.

Figure 7:
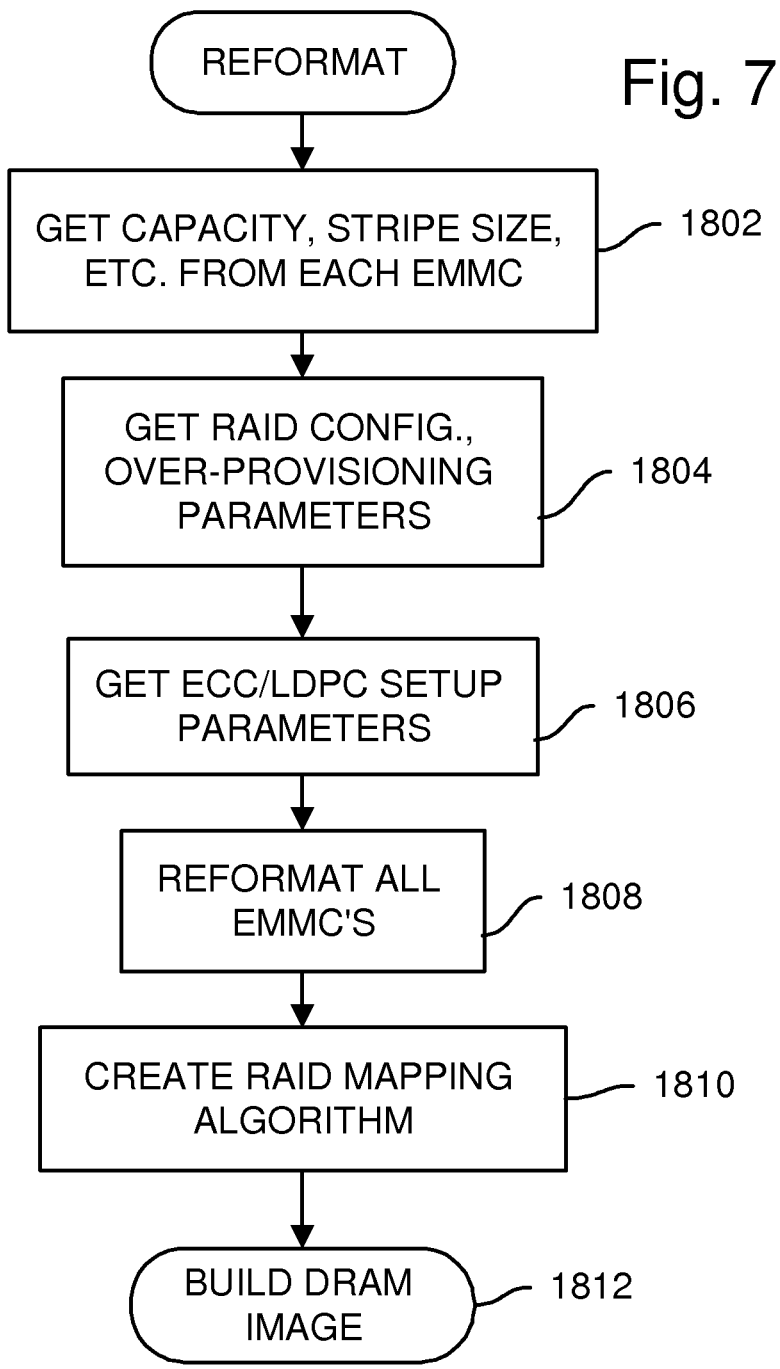
FIG. 7 shows a reformatting routine.

FIG. 7 shows a reformatting routine. When SEED SSD 200 is first used, or when a reformat command is received, SEED SSD 200 gets the capacity, stripe size, and other configuration parameters from each attached eMMC 343, step 1802. RAID and over-provisioning parameters are also obtained, step 1804. ECC or LDPC error correction parameters or configurations are also obtained, step 1806.

All eMMC 343 attached to SEED SSD 200 are issued reformat commands, step 1808. Once reformatting is completed, a RAID mapping plan is generated, step 1810 to implement RAID across the attached eMMC. The DRAM image is built, step 1812, using the routine of FIG. 5.

Figure 8:
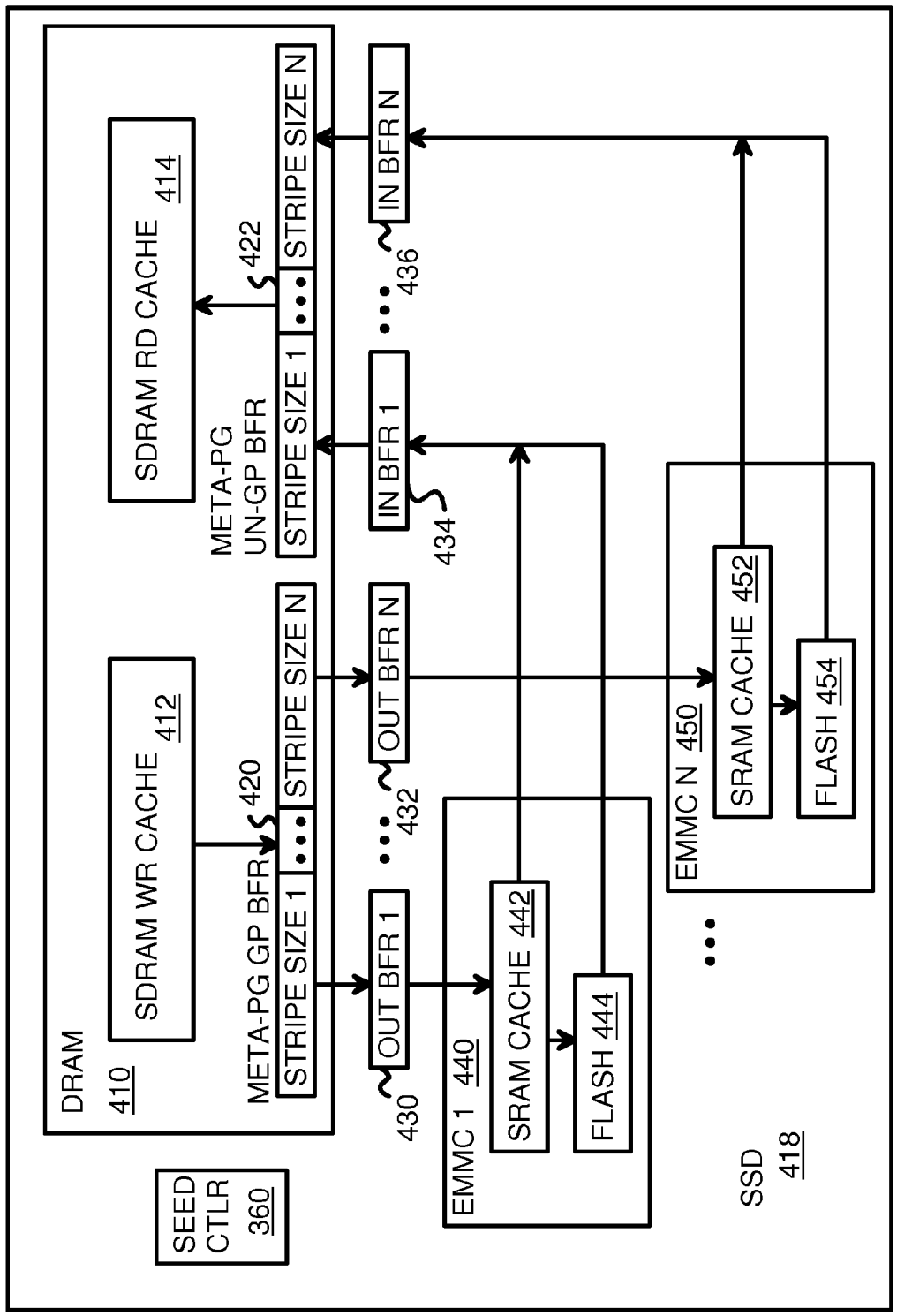
FIG. 8 is a diagram of a SEED SSD with RAID eMMC's.

FIG. 8 is a diagram of a SEED SSD with RAID eMMC's. SSD 418 may be SEED SSD 200 of FIG. 1 when eMMC 343 support RAID and RAID is enabled in SEED controller 360.

DRAM 410, such as SSD DRAM buffer 194, has write cache 412 and read cache 414. Host write date from write cache 412 is loaded into meta-page grouping buffer 420. Once a meta page has been fully loaded and is ready to be written to eMMC 440-450, the first part of data in meta-page grouping buffer 420 are transferred to first output buffer 430 for writing to first eMMC 440. Successive parts of meta-page grouping buffer 420 are moved to other output buffers, for writing to eMMC 2, 3, . . . N–1, (not shown) until the last stripe N of data in meta-page grouping buffer 420 is moved to output buffer 432 for writing to last (Nth) eMMC 450.

The stripe size for each of eMMC 440-450 does not have to be the same. Each eMMC may have a different stripe size. Data is first written into SRAM cache 442 of first eMMC 440, and then written into flash memory 444 as needed.

Data requested by a host read may reside either in flash memory 454 or in SRAM cache 452 of last eMMC 450. The requested data is read from last eMMC 450 into last input buffer 436 and copied into meta-page un-grouping buffer 422. Requested data from other eMMC, such as first eMMC 440 is also read into other input buffers, such as first input buffer 434, and copied and arranged into meta-page un-grouping buffer 422. The requested data may then be copied from meta-page un-grouping buffer 422 into read cache 414. Some of the data transferred may not be directly requested by the host, such as for pre-fetching operations.

Figure 9:
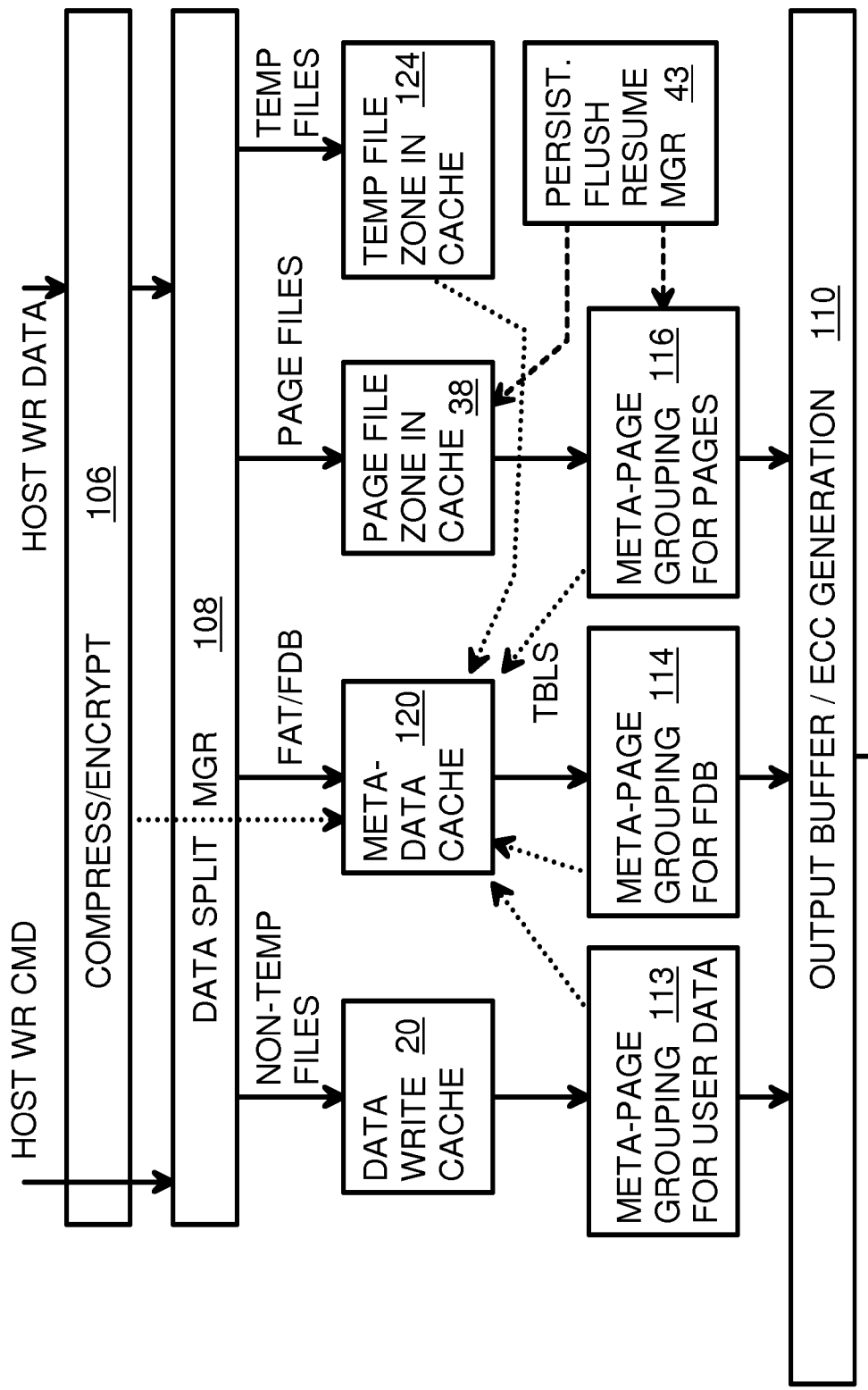
FIG. 9 is a flow diagram showing data splitting and grouping for writes through the SEED SSD.

FIG. 9 is a flow diagram showing data splitting and grouping for writes through the SEED SSD. The host sends a write command to data split manager 108, which also receives host write data after compression or encryption by compression/encryption engine 106 if enabled. A compression table entry for the encrypted or compressed files may be modified in meta-data cache 120.

Data split manager 108 inside SEED controller 360 (FIG. 1). Data split manager 108 sorts the host write data by data type, such as by examining the file extension or by parsing the FAT and FDB. Temp files are stored in Temp file zone 124 in cache, with a table entry being modified in meta-data cache 120. Temp files are not stored to flash and are lost when power turns off and fails. The temp file zone can be optionally overflowed and grouped to SSD. Alternately, this function can be optionally disabled for certain operations such as for a server.

Paging files are stored in paging zone 38 in the cache and are grouped with other pages containing the same paging file data type into meta-pages by paging file grouping process 116. The grouped pages are then sent through output buffer 110 to multiple eMMC's, UFS, ISSD, or other flash devices and may be stored in DRAM in those devices, then in flash memory. ECC code may be generated and attached by output buffer 110. A table entry for the grouped files may be modified in meta-data cache 120.

Meta-data files such as FAT and FDB entries are stored in meta-data cache 120. The FDB may be grouped into meta-pages by FDB meta-page grouping process 114. The grouped pages are then sent through output buffer 110 to multiple eMMC's, UFS, ISSD, or other flash devices and may be stored in DRAM in those devices, then in flash memory. ECC code may be generated and attached by output buffer 110. A table entry for the grouped meta-data files may be modified in meta-data cache 120.

User files are stored in data write cache 20 and are grouped with other pages containing the same user or non-temporary file data type into meta-pages by meta-page user file grouping process 113. The grouped pages are then sent through output buffer 110 to multiple eMMC's, UFS, ISSD, or other flash devices and may be stored in DRAM in those devices, then in flash memory. ECC code may be generated and attached by output buffer 110. A grouping table entry for the grouped files may be modified in meta-data cache 120.

When persistent flush/resume manager 43 detects a power failure, the contents of paging zone 38, meta-data cache 120, and data write cache 20 are flushed. Paging file grouping process 116, FDB meta-page grouping process 114, and meta-page user file grouping process 113 are activated to group the flushed contents before being sent to output buffer 110 and then to multiple eMMC's, UFS, ISSD, or other flash devices for storage in DRAM in those devices, then in flash memory.

If a driver or other software in the host exists and is running, and that driver performs some or all of the functions of FIGS. 8-10B or elsewhere, then duplicate functions in SEED controller 360 may be disabled.

Figure 10B:
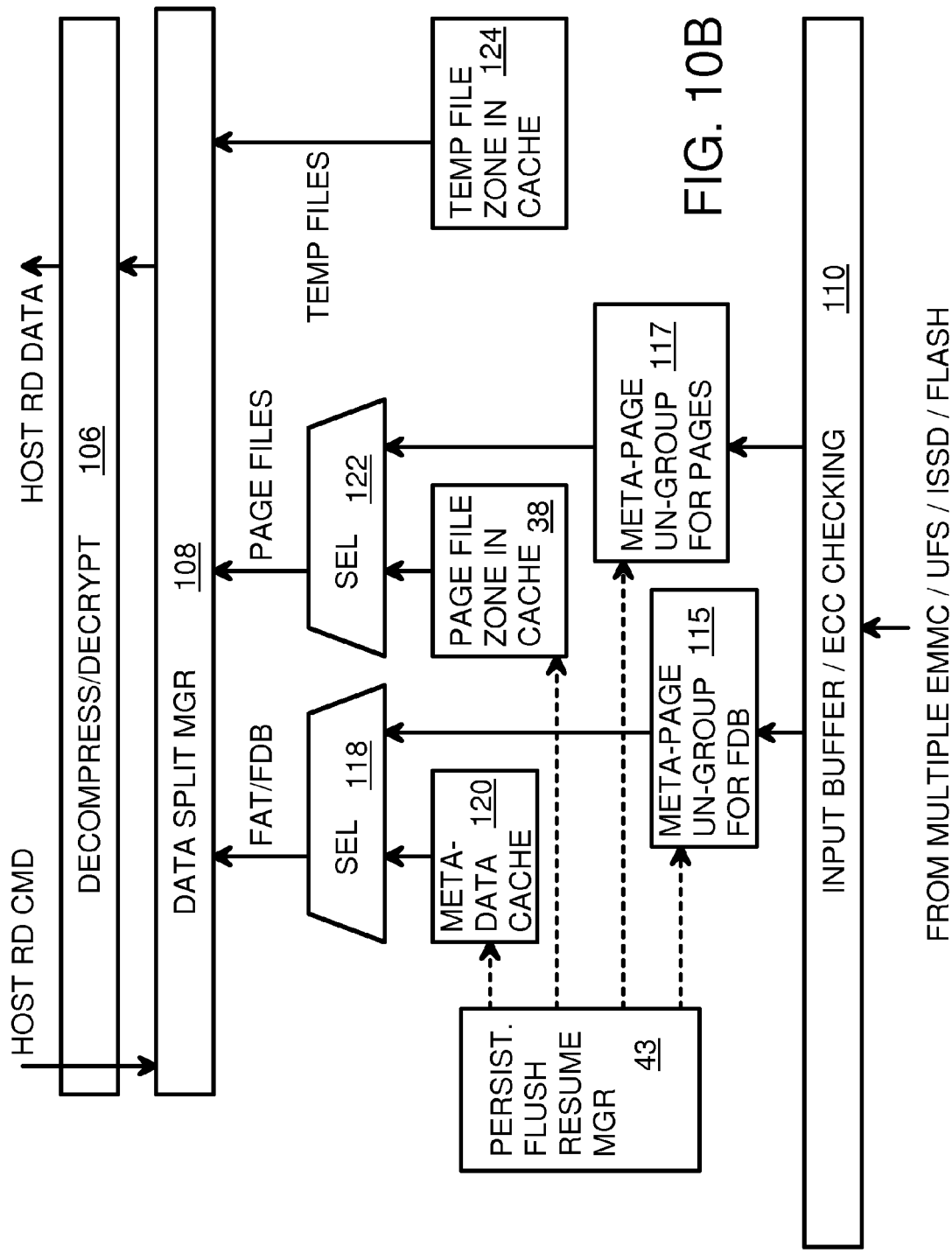

FIGS. 10A-B show a flow diagram of data sorting and un-grouping for reads through SEED controller 360 (FIG. 1). The host sends a read command to data split manager 108, which also delivers host read data after decompression or decryption by compression/encryption engine 106. Data split manager 108 inside SEED controller 360 (FIG. 1) sorts the host write data by data type and activates selector 104 to select the data based on the data type.

In FIG. 10A, the user data may have recently been written and is still available from data write cache 20. The data may be stored in the multiple eMMC's, UFS, ISSD and must first be received by buffer 110, ungrouped by meta-page ungrouping engine 36 and then selected by selector 104. The data from the ungrouped meta-page is stored in one of four read caches. NRA/RA split manager 34 separates data that is recently accessed from Non-Recently-Accessed (NRA) data. NFA/FA split managers 30, 32 separate data that is more frequently accessed from Non-Frequently-Accessed (NFA) data. Selector 104 selects one of four read caches 22, 24, 26, 28 based on whether the data was identified as recently or frequently accessed or not.

In FIG. 10B, temp files are not stored in the multiple eMMC's, UFS, or ISSD and are only read from Temp file zone 124 in cache by data split manager 108 in response to a host read. Paging files are selected by selector 122 from either paging zone 38 in the cache or from the multiple eMMC's, UFS, or ISSD after being ungrouped by paging-files meta-page ungrouping process 117. Meta-data such as FAT and FDB entries are selected by selector 118 from either meta-data cache 120 or from the multiple eMMC's, UFS, or ISSD after reading through output buffer 110 and being ungrouped by FAT/FDB meta-page ungrouping engine 115.

On power restore, persistent flush/resume manager 43 is activated to read the prior flushed contents from the multiple eMMC's, UFS, or ISSD back to paging zone 38, meta-data cache 120, and data write cache 20. Paging file un-grouping process 117, FDB meta-page un-grouping engine 115, and meta-page ungrouping engine 36 are activated to un-group the flushed contents after before received from output buffer 110 from the multiple eMMC's, UFS, ISSD, or other flash devices.

FIG. 11 shows a memory map of SEED SSD DRAM. SSD DRAM buffer 194 contains several caches that may be individually defined. Cache 140 stores meta-data and associated tables, cache 142 stores temp files, cache 144 stores paging files, and data write cache 234 stores non-temp data writes. Data in buffer 280 stores read data. These caches are backed up when power fails. Read caches 290, 291, 292, 293 store FA, NFA, RA, and NRA data and may be discard when power fails.

Grouping buffers 282 store meta-page data and tables for use by the grouping processes, while un-grouping buffers 278 store meta-page data and tables for use by the un-grouping processes. Mapping tables 148 store various mapping tables. Flush/resume manager space 277 stores buffers and tables used by persistent flush/resume manager 43.

S.M.A.R.T. data collector 170 collects and stores status information for lower-level eMMCs that may be read by host software. SEED SSD system use area 284 is reserved for use by SEED controller 360.

Figure 12:
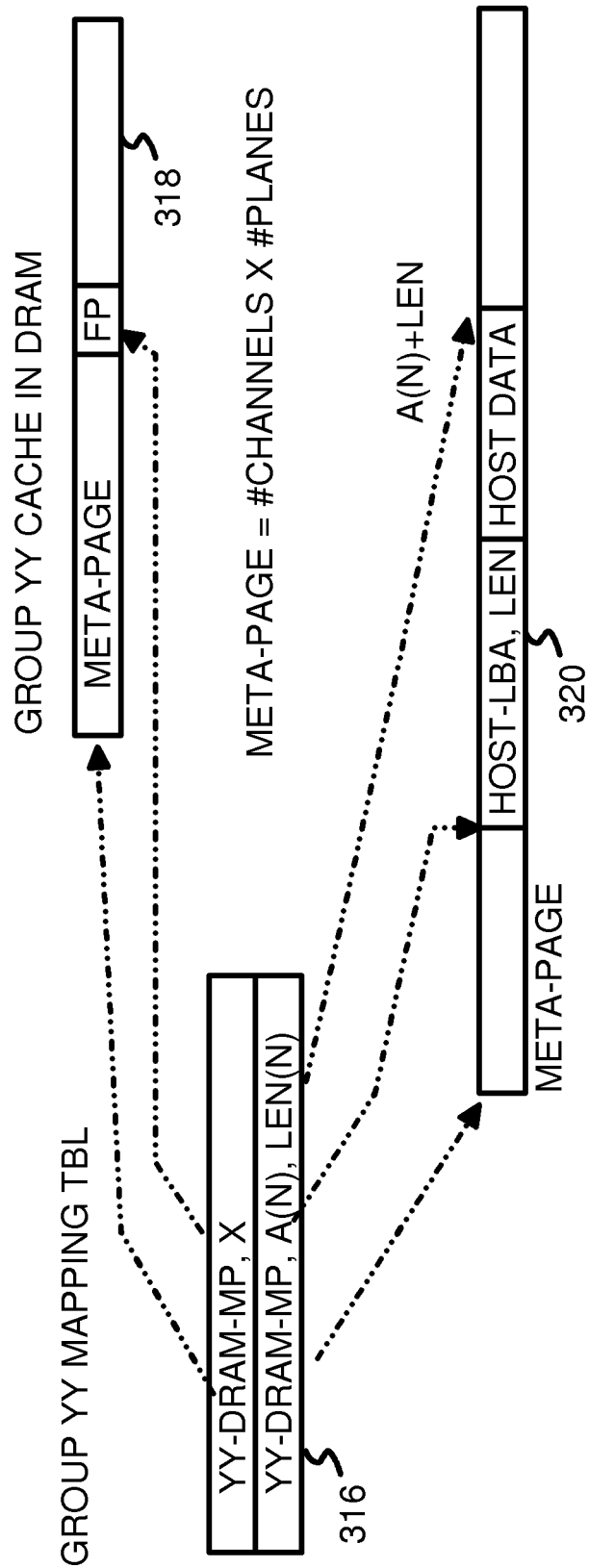
FIG. 12 highlights mapping and grouping of full and partial pages to meta-pages by data type.

FIG. 12 highlights mapping and grouping of full and partial pages to meta-pages by data type. Each data type has its own grouping map table 316, such as for paging files, temp files, meta-data, and normal user data. Only user data is mapped to flash memory in this embodiment, although other embodiments with excess memory may map additional data types to flash.

A meta-page is a larger unit of memory than a flash page. The flash memory may be organized as multiple channels and multiple chips or dies per channel and each die having multiple planes. The meta-page size is the number of channels times the number of planes, times the flash page size. For example, four channels and two planes have a meta-page size of 8 pages.

When a full page (FP) is grouped into FP grouping meta-page 318, the page location X where that page is written to is stored into an entry in grouping map table 316 for that host LBA, along with a pointer to that grouping meta-page 318, YY-DRAM-MP.

When a partial page (PP) is grouped into PP grouping meta-page 320, the starting location A(N) of that partial page, and the length LEN(N) of that partial page is stored into an entry in grouping map table 316 for that host LBA, along with a pointer to that PP grouping meta-page 320, YY-DRAM-MP. The Host LBA and length are attached to the data before stored into PP grouping meta-page 320. YY is encoded as:
YY=00=PF=paging files, don't map to flash,
YY=01=TMP=temp files, don't map to flash,
YY=10=FAT/FDB files, don't map to flash,
YY=11=DT=normal data, OK to map to flash.

Figure 13:
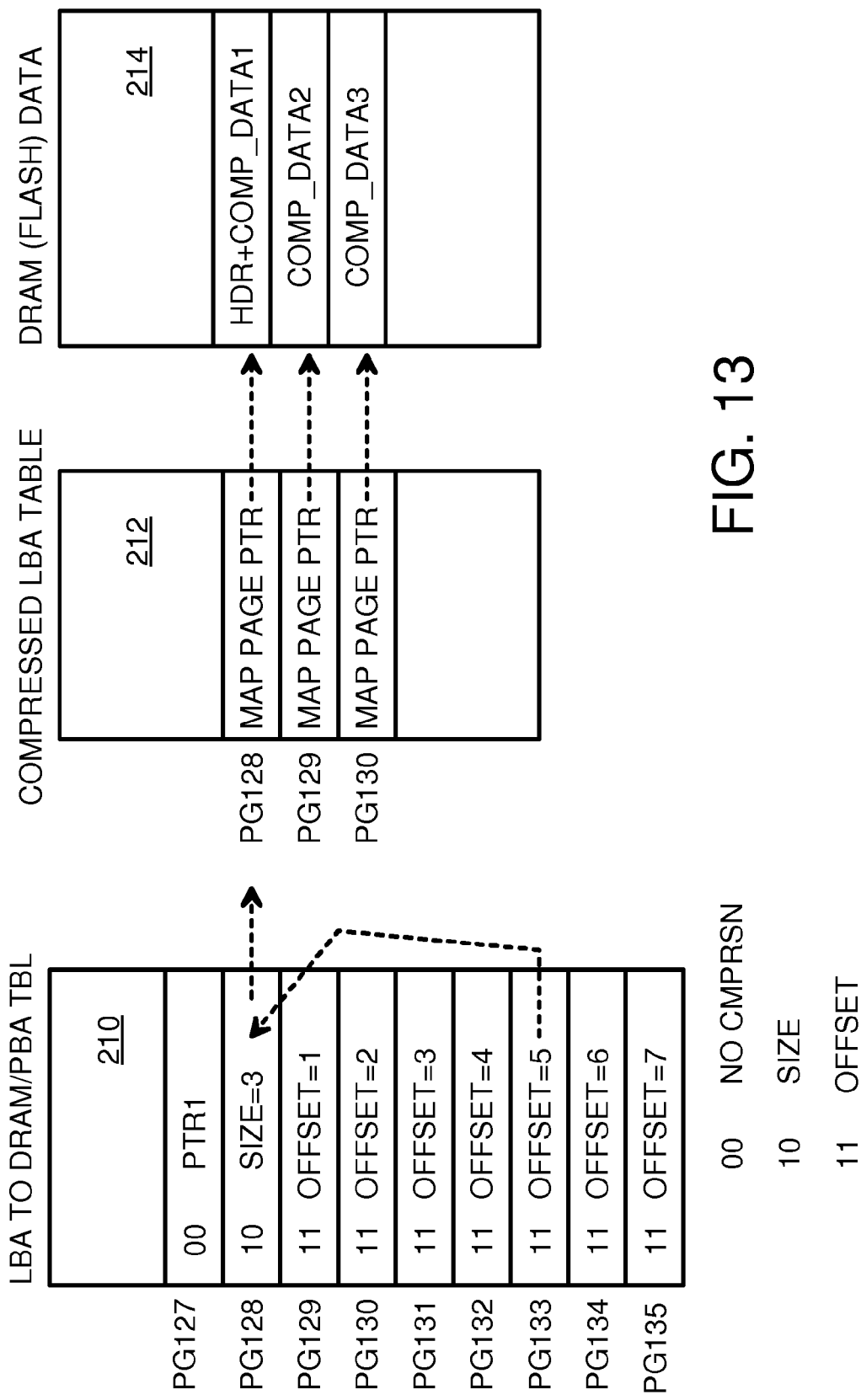
FIG. 13 shows mapping of compressed pages.

FIG. 13 shows mapping of compressed pages. Flash endurance may be increased by storing compressed data in flash pages rather than regular data, since compression reduces the data size and thus the storage requirements in flash. Compressed data may be cached in SSD DRAM buffer 194, and backed up to the multiple eMMC's, UFS, or ISSD when the cache is full.

SEED controller 360 may compress some data before storing it in data write cache 20. The host writes several pages of data in the normal fashion, indicating the logical address (LBA) and page numbers and sector counts that indicate the total data length. For example, the host may write DATA1 to LBA 2048, SC=128, which is 8 pages of 16 sectors per page. A compression engine such as encryption/decryption engine 240 in SEED controller 360 (FIG. 1) compresses the 128 sectors of data to 48 sectors of compressed data. These 48 sectors of compressed data include a header and some compressed data stored in a first compressed page, and two more pages of compressed data, for a total of 3 compressed pages. This is a significant reduction from the uncompressed 8 pages.

SEED controller 360 stores these 3 pages of compressed data in data write cache 20 as compressed data 214 at a page pointed to by pointers MAP_PAGE_PTR that are stored in compressed LBA table 212.

SEED controller 360 also creates entries in LBA table 210, which may be part of a unified mapping table or part of meta-data cache 120. However, the entries in LBA table 210 are specially coded for mapping to compressed data.

The mapping entries in LBA table 210 each include first two bits that are compression status bits. The first compression status bit is a 1 for a compression access, and 0 for regular host accesses of uncompressed data. For example, page 127 maps to uncompressed data using PTR1.

When the first compression status bit is a 1, and the second compression status bit is 0, the entry in LBA table 210 contains the total size (number of pages) of the uncompressed data segment. When the first compression status bit is a 1, and the second compression status bit is 1, then the entry in LBA table 210 contains an offset. The offset is and offset to the first entry for this segment of compressed data, the entry that contains the size of the segment.

In the example of the host writing DATA1 to LBA 2048, SC=128, which is 8 pages, there are 8 page entries in LBA table 210 for this segment of DATA1. The LBA of 2048 selects page 128 in LBA table 210. A total of 8 page entries in LBA table 210 are used. The first entry has the total data size and the following 7 entries contain offsets that point back to the first entry.

When the host reads page 133 (LBA=2128, SC=16), the entry in LBA table 210 for page 133 is read. The offset stored in page 133's entry is 5, which points back to the entry for page 128, which contains the total compressed data size of 3 pages. The entry for page 128 is read from compressed LBA table 212, along with the next two entries of compressed LBA table 212, for a total of 3 page entries, which is the size of the compressed data. Each entry points to a page of compressed data in SSD DRAM buffer 194, or in the multiple eMMC's, UFS, or ISSD. All three compressed pages are read and decompressed to recover the original 8-page block of uncompressed data. Then the data the host is reading is extracted from the uncompressed data. The compression can be in-line with a hardware circuit or a firmware controlled algorithm, or software.

FIGS. 14A-E show the SEED controller processing a host write command. The host request includes a logical address such as a LBA that is used as an index into a unified mapping table, step 1002. A matching entry from the unified mapping table is read, or the FAT and FDB entries are parsed for the file to determine the file extension and data type. The first few bits in the matching entry are data-type bits that indicate what kind of data is stored at this logical address. Different processes are dispatched depending on the data-type bits.

When the data-type bits for the matching entry are 10, step 1004, the data is for FAT or FDB entries. The meta-data write process is called, which is detailed in FIG. 14B.

When the data-type bits are 11, step 1006, the user data file process is called. The user data write process is detailed in FIG. 14C. User data files are user and application data that should first be stored in DRAM and later flushed to flash.

When the data-type bits for the matching entry are 001, step 1008, the data is for paging files for swaps to peripheral storage from main memory that is performed by a memory manager on the host. These files do not need to be stored in flash, reducing wear. The paging data write process is called, which is detailed in FIG. 14D.

When the data-type bits for the matching entry are 01 (none of the prior types), step 1008, the data is for temporary files that do not need to be stored in flash memory. The temp data write process is called, which is detailed in FIG. 14E.

FIG. 14B shows the meta-data write process. The host data is written to the meta-data file zone cache in SSD DRAM buffer 194, (140 in FIG. 11), step 1102. When the cache is full, step 1104, the meta-data in the cache is moved to the meta-data grouping buffer in DRAM, step 1106. A grouping process is performed on the meta-data in the grouping buffer, step 1108, when size criteria are met or after each data is received.

The grouping process groups meta-data into a meta-page. When the meta-page is full, step 1110, then the full meta-page of meta-data is written to the eMMC, UFS, iSSD, or other flash device, step 1112.

Figure 14C:
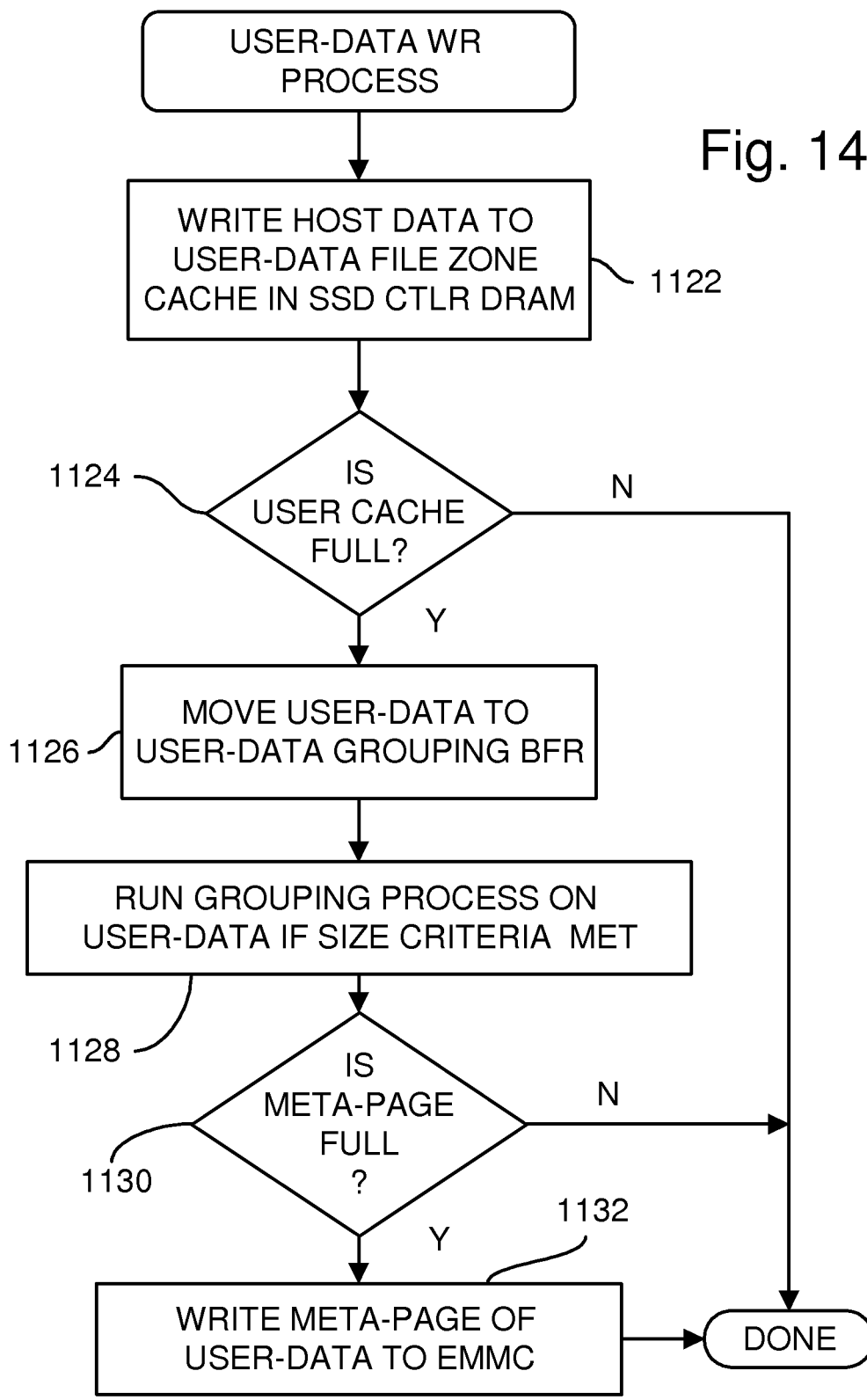

FIG. 14C shows the user-data write process. The host data is written to the user-data file zone cache in SSD DRAM buffer 194, (234 in FIG. 11), step 1122. When the cache is full, step 1124, the user-data in the cache is moved to the user-data grouping buffer in DRAM, step 1126. A grouping process is performed on the user-data in the grouping buffer, step 1128, when size criteria are met.

The grouping process groups user-data into a meta-page. When the meta-page is full, step 1130, then the full meta-page of user-data is written to the eMMC, UFS, iSSD, or other flash device, step 1132.

Figure 14D:
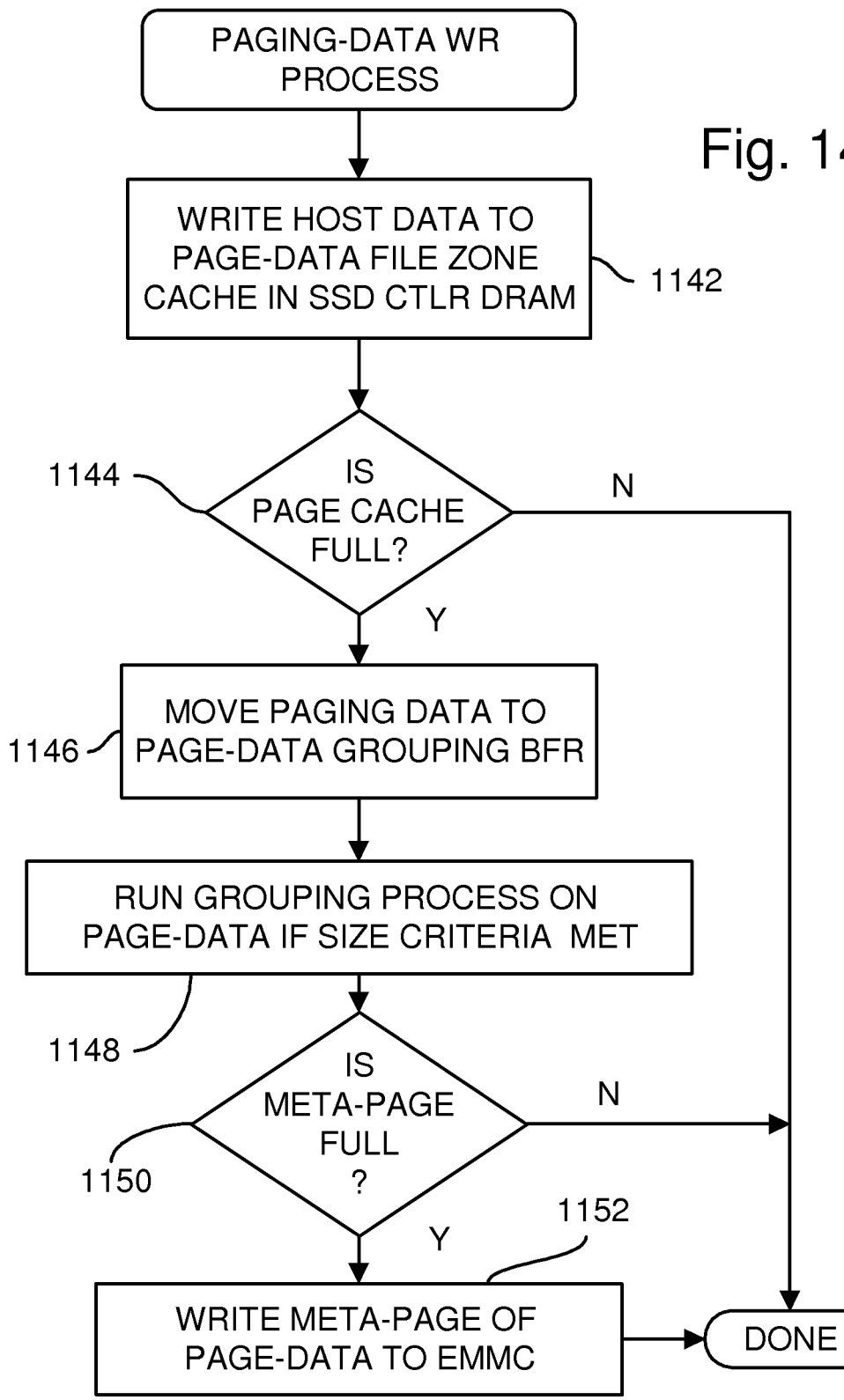

FIG. 14D shows the paging-data write process. The host data is written to the paging-data file zone cache in SSD DRAM buffer 194, (144 in FIG. 11), step 1142. When the cache is full, step 1144, the paging-data in the cache is moved to the paging-data grouping buffer in DRAM, step 1146. A grouping process is performed on the paging-data in the grouping buffer, step 1148, when size criteria are met.

The grouping process groups paging-data into a meta-page. When the meta-page is full, step 1150, then the full meta-page of paging-data is written to the eMMC, UFS, iSSD, or other flash device, step 1152.

Figure 14E:
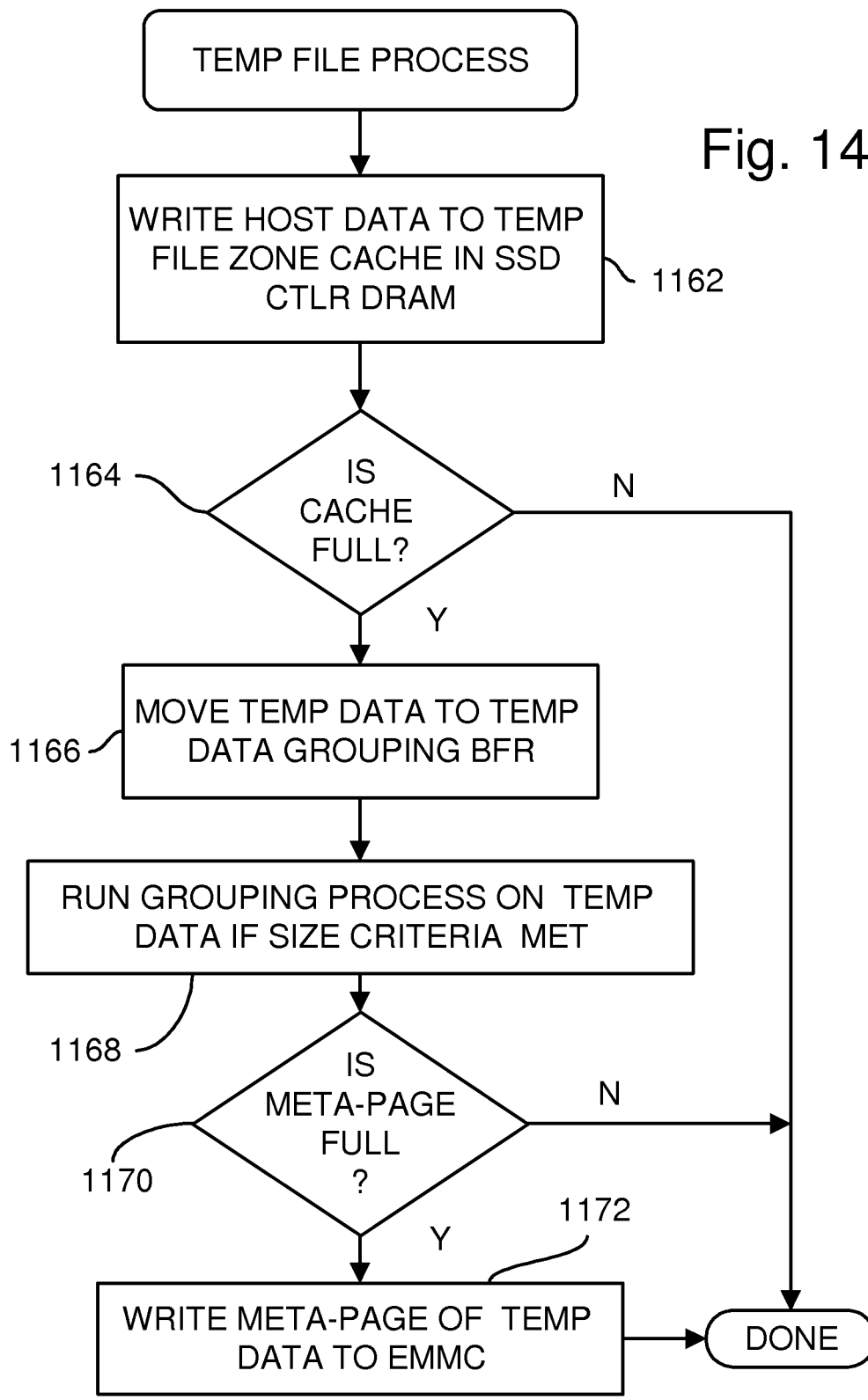

FIG. 14E shows the temp file write process. The host data is written to the temp file zone in SSD DRAM buffer 194, (142 in FIG. 11), step 1162. When the cache is full, step 1164, the temp files in the cache are moved to the temp-data grouping buffer in DRAM, step 1166. A grouping process is performed on the temp-data in the grouping buffer, step 1168, when size criteria are met.

The grouping process groups temp-data into a meta-page. When the meta-page is full, step 1157, then the full meta-page of temp-data is written to the SEED or SSD, but not to flash memory, step 1172.

FIGS. 15A-E show the SEED controller processing a host read command. The host request includes a logical address such as a LBA that is used as an index into a unified mapping table, step 1012. A matching entry from the unified mapping table is read, or the FAT and FDB entries are parsed for the file to determine the file extension and data type. The first few bits in the matching entry are data-type bits that indicate what kind of data is stored at this logical address. Different read processes are dispatched depending on the data-type bits.

When the data-type bits for the matching entry are 10, step 1014, the data is for FAT or FDB entries. The meta-data read process is called, which is detailed in FIG. 15B.

When the data-type bits are 11, step 1016, the user data file read process is called. The user data read process is detailed in FIG. 15C.

When the data-type bits for the matching entry are 001, step 1018, the data is for paging files. These files do not need to be stored in flash, reducing wear. The paging data read process is called, which is detailed in FIG. 15D.

When the data-type bits for the matching entry are 01 (none of the prior types), step 1018, the data is for temporary files that are not stored in flash memory. The temp data read process is called, which is detailed in FIG. 15E.

Figure 15A:
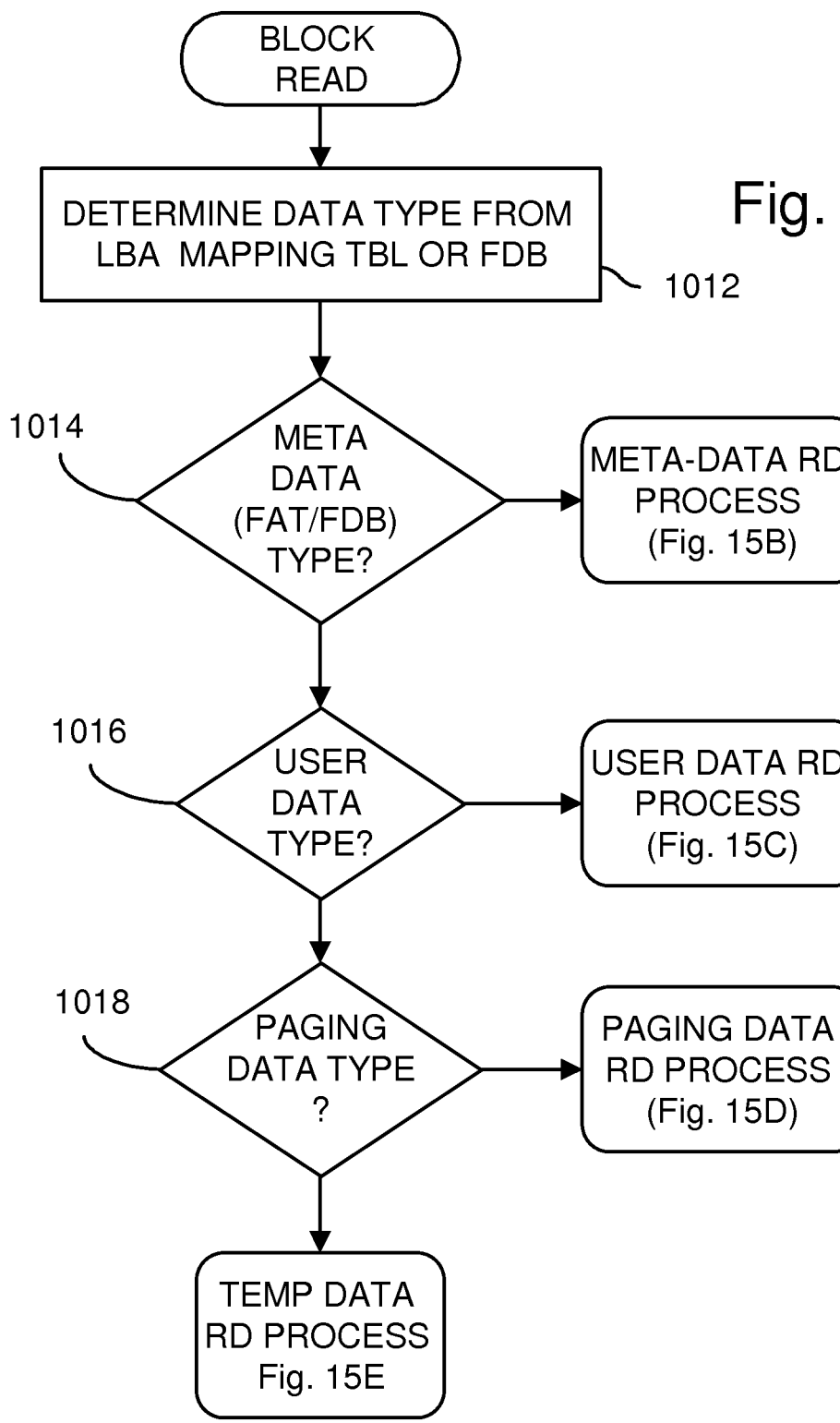
FIGS. 15A-E show the SEED controller processing a host read command.
Figure 15B:
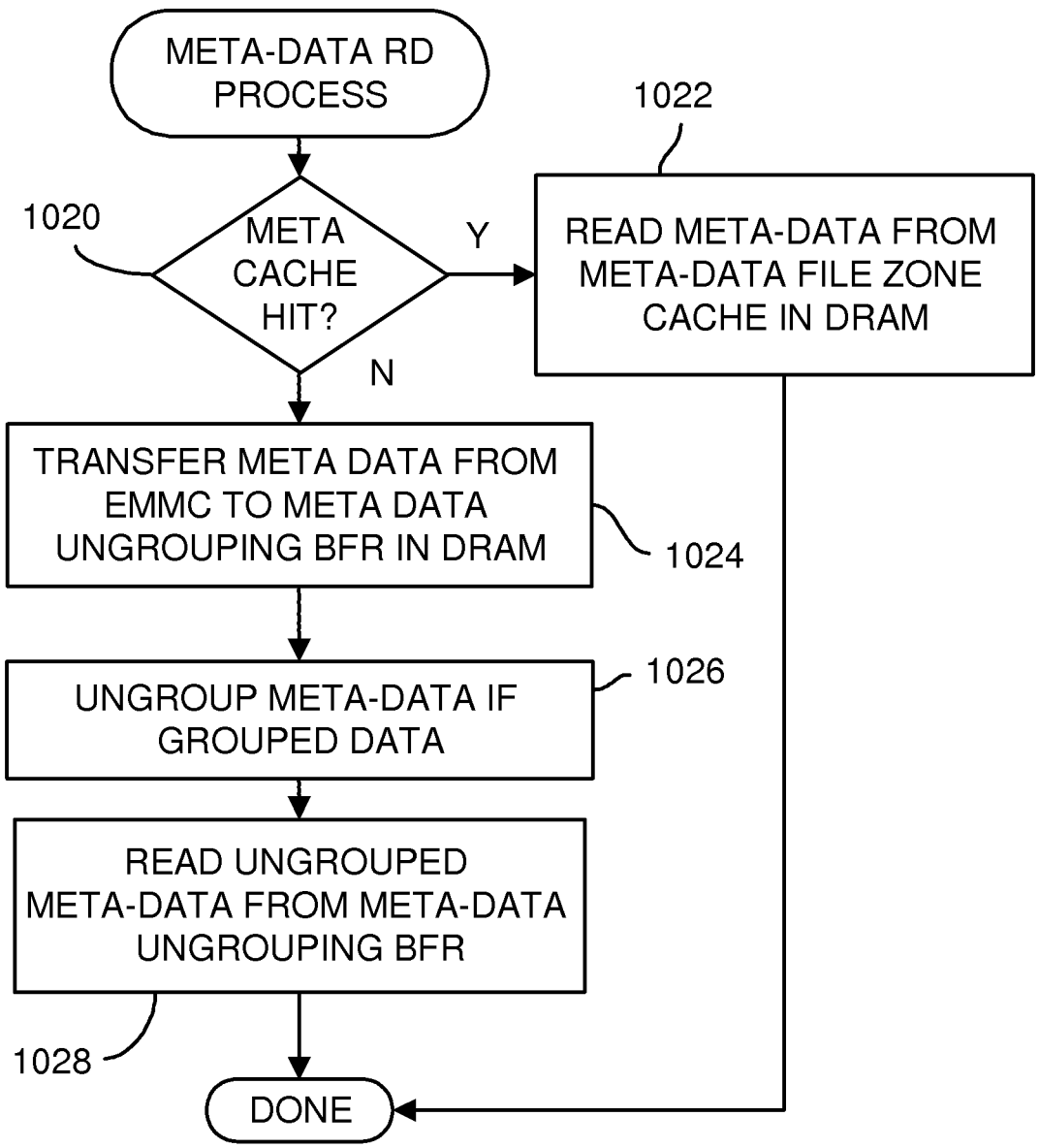

FIG. 15B shows the meta-data read process. When the requested meta-data is found in the meta-data file zone cache in SSD DRAM buffer 194, (140 in FIG. 11), step 1120, then the requested meta-data can be read from this cache and delivered to the host, step 1022.

When the requested meta-data is not in the cache, step 1120, the meta-data is fetched from the SSD and written to the meta-data ungrouping buffer in SSD DRAM buffer 194, step 1024. If the meta-data is grouped, an ungrouping process is executed to ungroup the meta-data, step 1026. The ungrouped meta-data can be read from the meta-data ungrouping buffer and delivered to the host, step 1028.

Figure 15C:
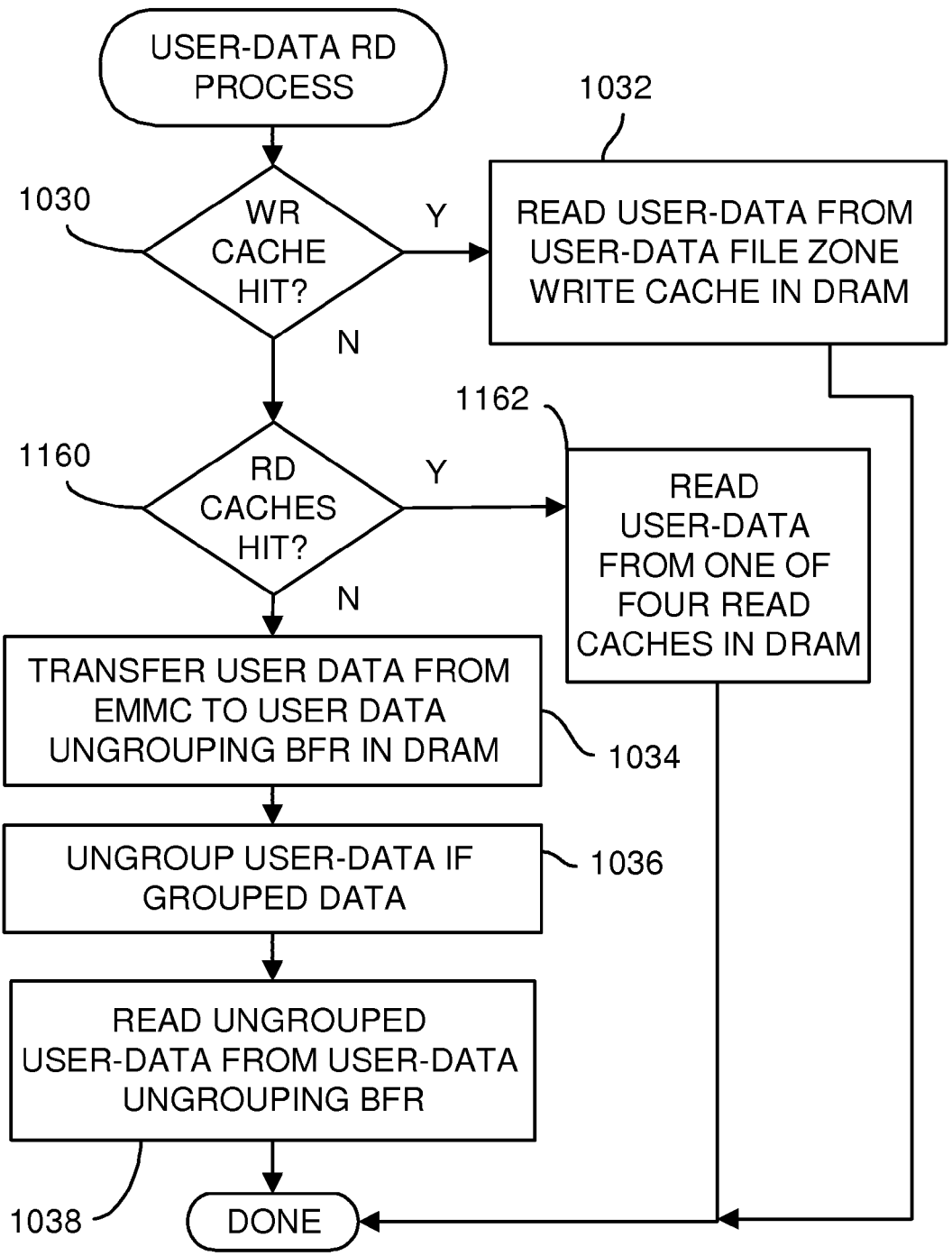

FIG. 15C shows the user-data read process. When the requested user-data is found in the user-data file zone write cache in SSD DRAM buffer 194, (234 in FIG. 11), step 1130, then the requested user-data can be read from this write cache and delivered to the host, step 1032. The write cache holds data that was recently written by the host. The requested user-data could also be in one of the four read caches for the four combinations of data, RA/FA, RA/NFA, NRA/FA, and NRA/NFA. User data is loaded into these caches based on read access, not necessarily when the host wrote the data.

When the requested user-data is found in one of the four read caches in SSD DRAM buffer 194, (290, 291, 292, 293 in FIG. 11), step 1160, then the requested user-data can be read from this read cache with the cache hit and delivered to the host, step 1062.

When the requested user-data is not in any of the five caches, steps 1130, 1160, the user-data is fetched from the SSD and written to the user-data ungrouping buffer in SSD DRAM buffer 194, step 1034. If the user-data is grouped, an ungrouping process is executed to ungroup the user-data, step 1036. The ungrouped user-data can be read from the user-data ungrouping buffer and delivered to the host, step 1038. The ungrouped data is stored to one of the four read caches.

Figure 15D:
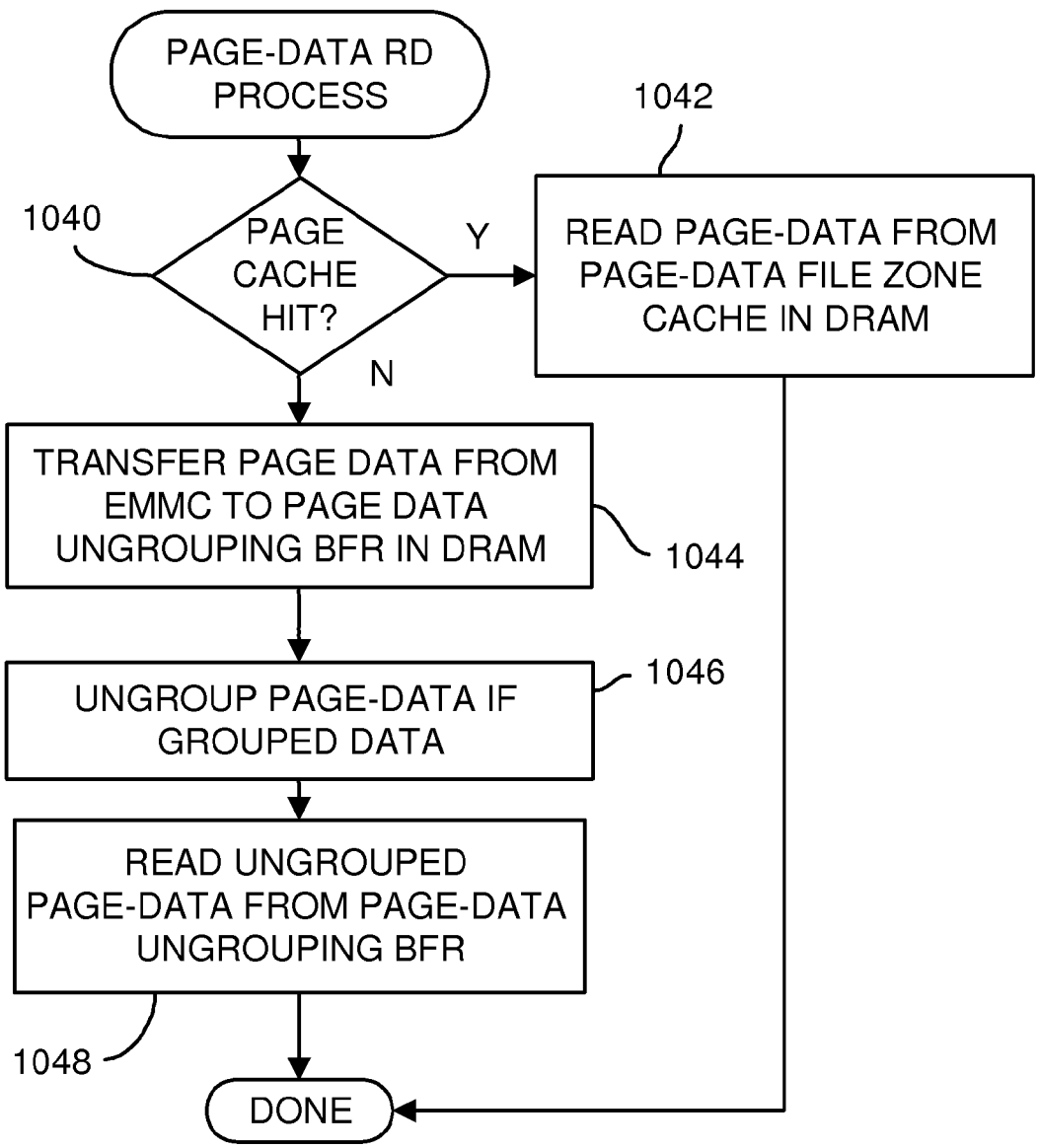

FIG. 15D shows the paging-data read process. When the requested paging-data is found in the paging-data file zone cache in SSD DRAM buffer 194, (144 in FIG. 11), step 1140, then the requested paging-data can be read from this cache and delivered to the host, step 1042.

When the requested paging-data is not in the cache, step 1140, the paging-data is fetched from the SSD and written to the paging-data ungrouping buffer in SSD DRAM buffer 194, step 1044. If the paging-data is grouped, an ungrouping process is executed to ungroup the paging-data, step 1046. The ungrouped paging-data can be read from the paging-data ungrouping buffer and delivered to the host, step 1048.

Figure 15E:
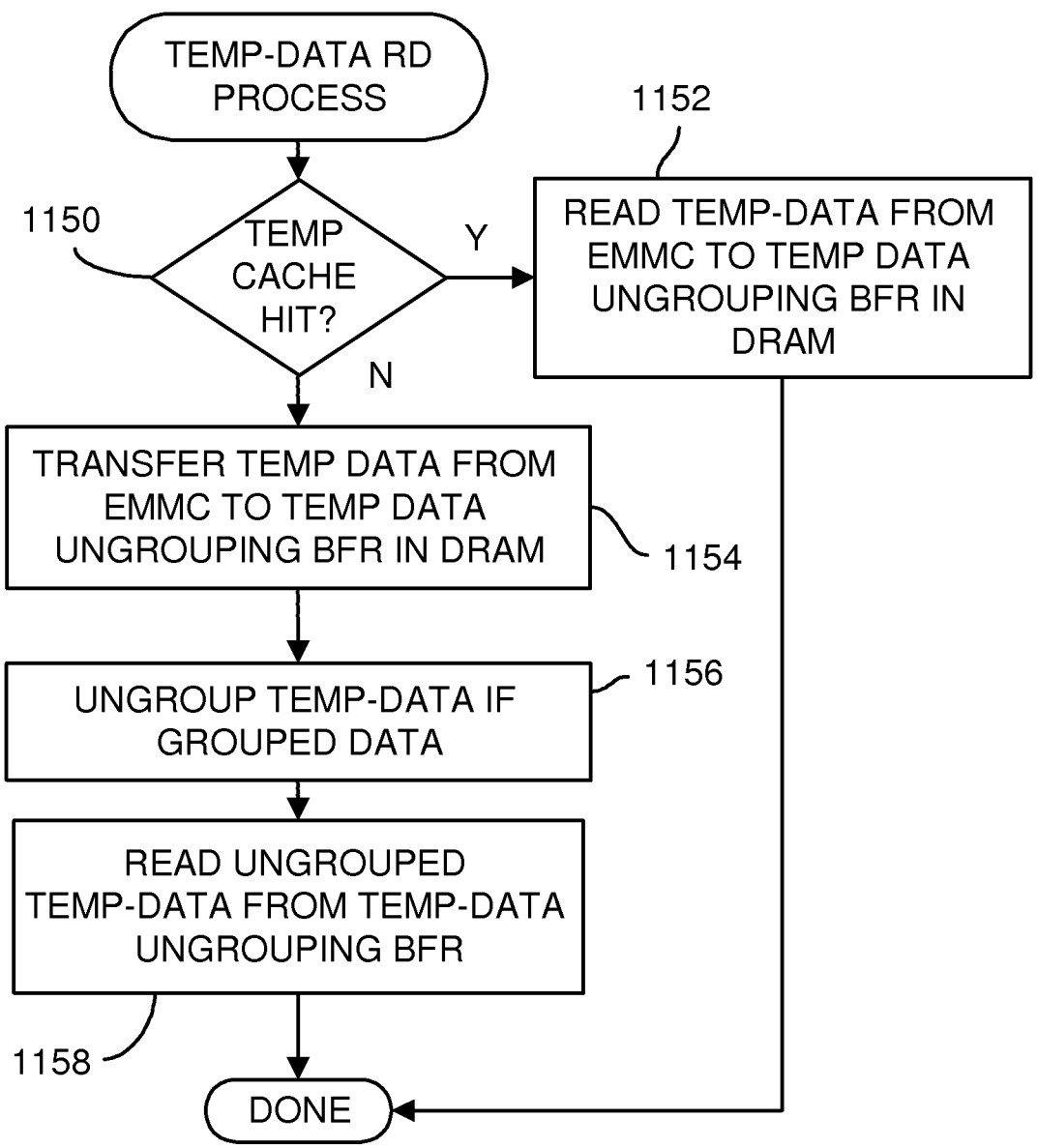

FIG. 15E shows the temp-data read process. When the requested temp-data is found in the temp-data file zone in SSD DRAM buffer 194, (142 in FIG. 11), step 1150, then the requested temp-data can be read from this cache and delivered to the host, step 1152.

When the requested temp-data is not in the cache, step 1150, the temp-data is fetched from the SSD and written to the temp-data ungrouping buffer in SSD DRAM buffer 194, step 1154. If the temp-data is grouped, an ungrouping process is executed to ungroup the temp-data, step 1156. The ungrouped temp-data can be read from the temp-data ungrouping buffer and delivered to the host, step 1158.

Figure 16A:
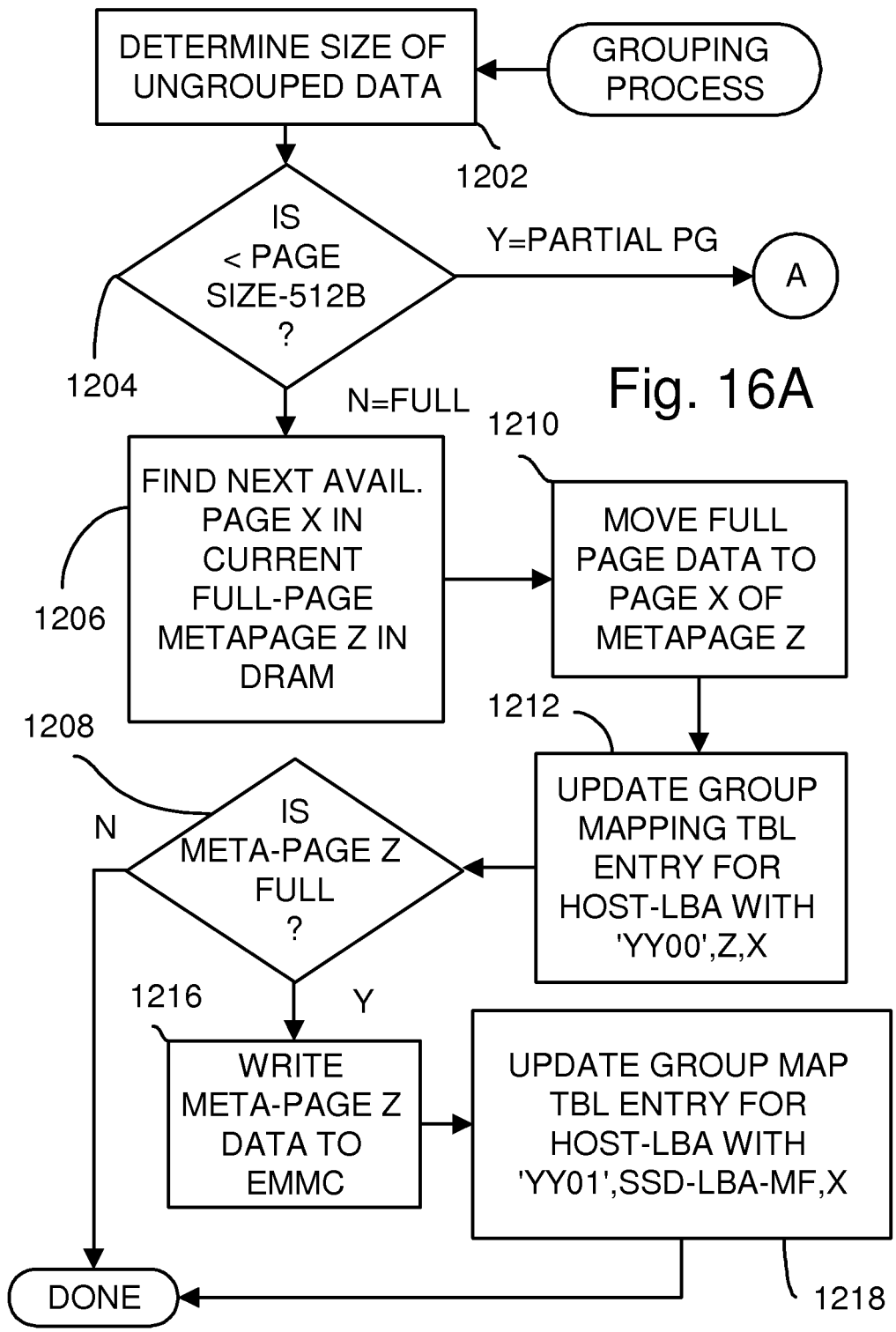

FIGS. 16A-B show a grouping process into meta-pages. A meta-page is a multiple of pages in size. Two separate meta-pages are used for grouping for each data type, one to group full pages and a second to group partial pages.

The total size of the new ungrouped data being added to the grouped data is determined, step 1202. When the size of the new data is within 512 bytes of the full page size, the new data is considered to be a full page, step 1204. If the new data is more than one page in size, each page may be processed separately.

When the new data is a full page, step 1204, the next available page location X in the current meta-page Z that is grouping full pages is found, step 1206. The new full page of data is moved to location X within meta-page Z, step 1210. The corresponding entry in the group mapping table is updated for the newly added data, step 1212. The host's LBA for the data, HOST-LBA, the data type YY00, the meta-page number Z, and the page location X within meta-page Z are recorded in the entry.

When the meta-page Z is full, step 1208, then meta-page Z is written to the SEED or SSD, step 1216. The group mapping table entry for the host LBA is modified to point to the full meta-page (MF) in SSD with the pointer SSD-LBA-MF, step 1218, while still indicating page location X. The last data type bit is changed to one to indicate SSD storage rather than DRAM storage, YY01.

FIG. 16B shows grouping of a new partial page into meta-page M used for grouping partial pages. The next available location A(N) within meta-page M for partial page data is located, step 1226. The new partial page data is moved to meta-page M starting at location A(N), step 1220. Overhead such as a header are also moved with the new data.

The corresponding entry in the group mapping table is updated for the newly added data, step 1222. The host's LBA for the new data, HOST-LBA, the data type YY10, the meta-page number M, and the starting location A(N) within meta-page M, and the length of the data and overhead are recorded in the entry. The third data type bit is set to 1 to indicate a partial page rather than a full page.

When the meta-page M is full, step 1228, then meta-page M is written to the SEED or SSD, step 1236. The group mapping table entry for the host LBA is modified to point to the partial meta-page (MP) in SSD with the pointer SSD-LBA-MP, step 1238, while still indicating starting location A(N), and the length. The last data type bit is changed to one to indicate SSD storage, YY11.

FIG. 17 shows encryption and compression processing by the SEED controller. Compression/decompression engine 242, and encryption/decryption engine 240 in FIGS. 1, 2 may perform these functions. When the host writes data that is intercepted by SEED controller 360, the file extension is checked. Audio, video, graphics, database, and other file extensions may indicate that the data has already been compressed, such as by a user program. Compression is disabled for these file extensions, step 510.

When encryption is enabled, step 512, encryption keys are used to perform encryption on the file, step 514. An encryption flag is set for this file in the file system, step 516. Optionally, temp and paging data types are not encrypted/decrypted.

When compression is enabled, step 518, the file is compressed, step 520. A header is added with an identifier for the compression algorithm used, and the new data size, step 522. A compression flag is set for this file in the file system, step 524. Optionally, temp and paging data types are not compressed or decompressed.

Figure 18B:
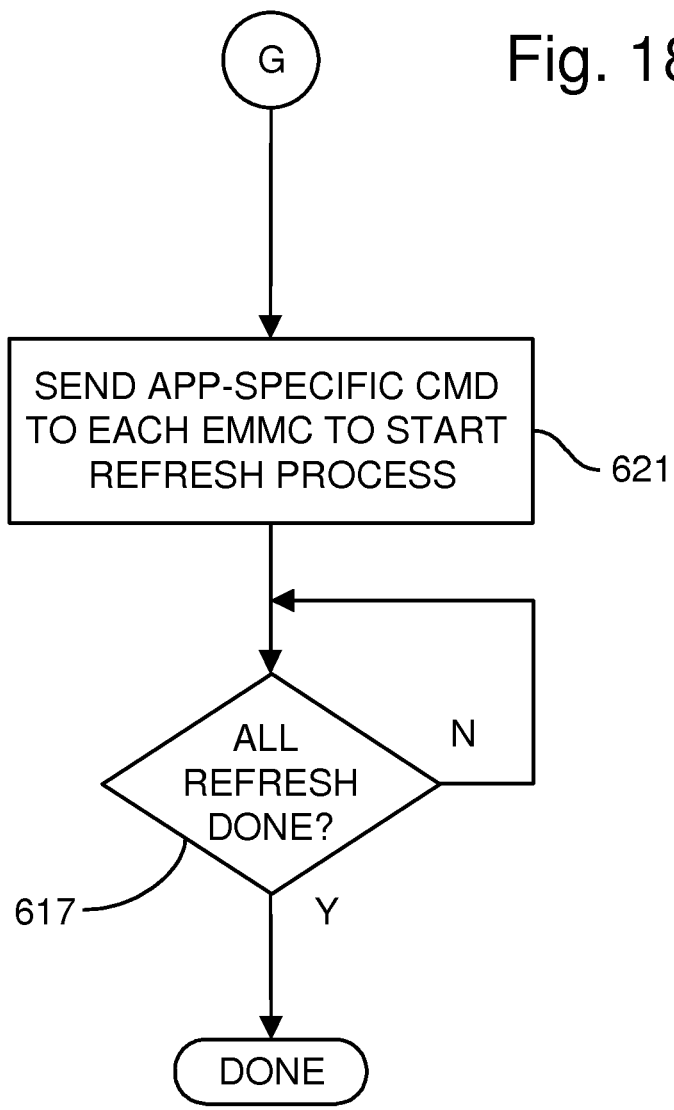

FIGS. 18A-B show a flash refresh operation. When the host is idle, step 603, refresh is initiated. The current date is obtained, and the date of the prior refresh, step 609. The number of days since the last refresh is calculated, such as by subtracting the prior refresh date from the current date, step 613. When the number of days since the last write exceeds the retention time threshold, step 615, then in FIG. 18B, a command is sent to each of the multiple eMMC's, UFS, iSSD's, or other flash devices, step 621. This command instructs the flash device to perform a refresh operation. Once all flash devices have completed refresh, step 617, then the refresh operation is done. Alternately, the refresh process can be once per day or once per week.

Figure 19:
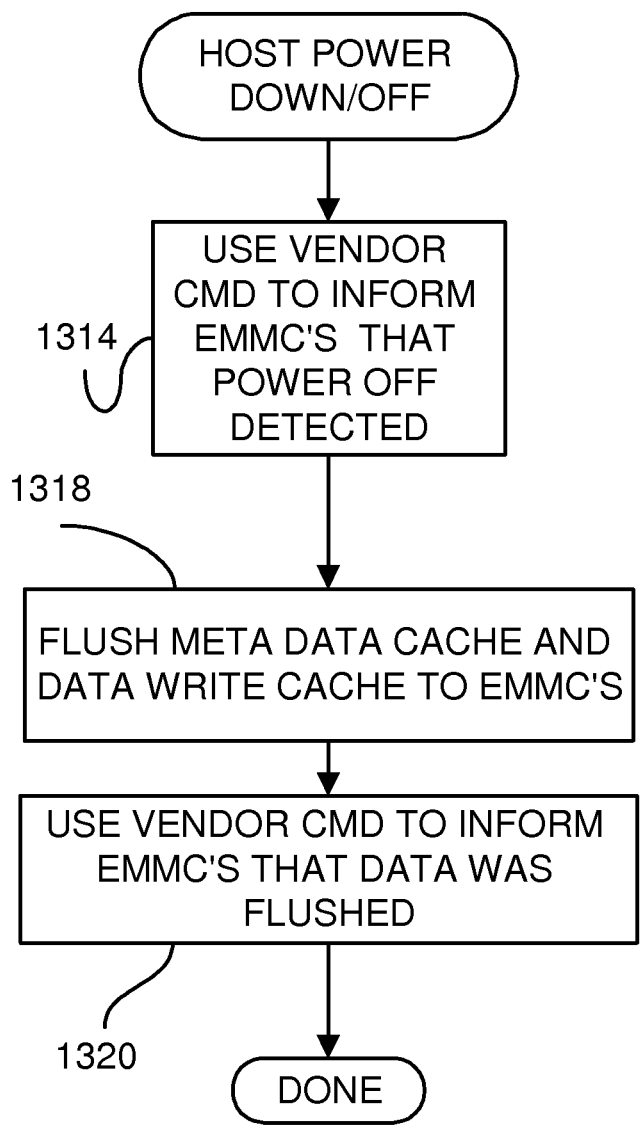
FIG. 19 is a flowchart of a power down sequence of the SEED controller.

FIG. 19 is a flowchart of a power down sequence of the SEED controller. When the host loses power, then SEED controller 360 sends a vendor command to inform the multiple eMMC's, UFS, iSSD's, or other flash devices that a power failure is detected, step 1314. The vendor command is sent to each of the multiple eMMC's, UFS, iSSD's, or other flash devices. SEED controller 360 flushes caches of user data, meta data, paging files, to the multiple eMMC's, UFS, iSSD's, or other flash devices, step 1318. The SSD should provide power to help finish the flush of data to the multiple eMMC's, UFS, iSSD's, or other flash devices. Once SEED controller 360 finishes sending the flushed data, SEED controller 360 sends a vendor command to inform the multiple eMMC's, UFS, iSSD's, or other flash devices that the flush is completed, step 1320.

Figure 20:
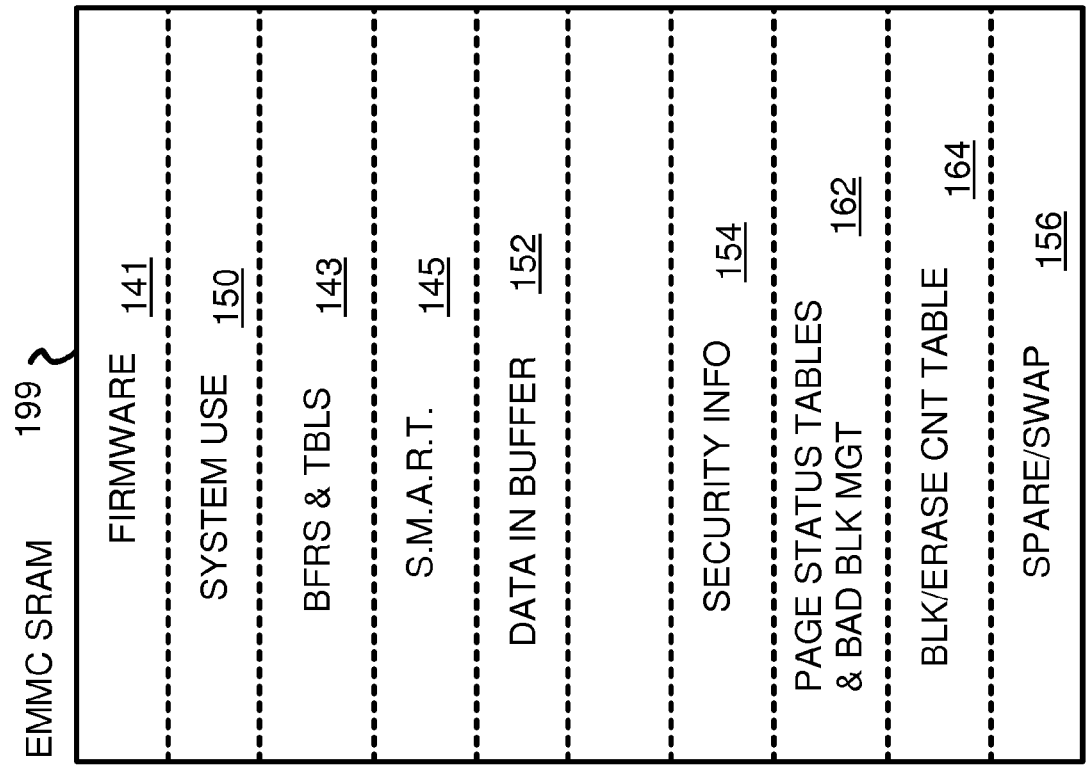
FIG. 20 shows a memory map of the SEED eMMC SRAM.

FIG. 20 shows a memory map of the SEED eMMC SRAM. SEED eMMC SRAM 345 may be a SRAM or a DRAM. Firmware 141 contains firmware code executed by SEED eMMC endurance controller 361 (FIG. 2). System use area 150 is reserved for use by SEED eMMC endurance controller 361. Buffers and tables 143 store various buffers and associated tables that are maintained by SEED eMMC endurance controller 361.

Data in buffer 152 stored buffered data. Security information 154 stored security data used for security functions. Spare and swap blocks 156 provide blocks for spare and swap operations. Page status tables 162 store flash page status and bad block information. Block and erase count table 164 stores erase count and block information on a block basis. S.M.A.R.T. data 145 stores status information for lower-level flash blocks and controllers. S.M.A.R.T. data 145 may be read by higher-level or host software.

FIGS. 21A-B show spare and swap operations. In FIG. 21A, the spare block is in flash, such as in the multiple eMMC's, UFS, iSSD's, or other flash devices. Data has been written to flash block X, occupying portion 322 that includes several whole pages and one partial page. Data is also written to spare flash block Y in portion 324, which is also several whole pages and a partial page. The data in blocks X and Y are to be combined to free spare block Y.

The full pages from portion 322 are written to upper portion 326 of swap block Z. Then the partial pages from blocks X and Y are written to DRAM page buffer 330 and combined, then written to a middle page in swap block Z. Next the full pages from portion 324 are written to lower portion 328 of swap block Z. Finally, both blocks X and Y can be erased.

DRAM page buffer 330 may be spare and swap blocks 156 in SEED eMMC SRAM 345 shown in FIG. 20.

In FIG. 21B, spare block Y is in DRAM. Data has been written to flash block X, occupying portion 322 that includes several whole pages and one partial page. This data is copied to spare block Y in DRAM, occupying upper portion 332. Data is also written to spare flash block Y in lower portion 324, which is also several whole pages and a partial page. The data in blocks X and Y are to be combined to free spare block Y. Since spare block Y is in DRAM, the partial pages from X and Y can be combined directly. The entire spare block Y is then copied to swap block Z, including upper portion 326 and lower portion 328. Finally, only block is erased, since block Y is in DRAM and does not need an erase operation. Depending on the time required for flash erase operations, having spare block Y in DRAM can improve performance as well as reduce the wear on flash blocks.

Figure 22:
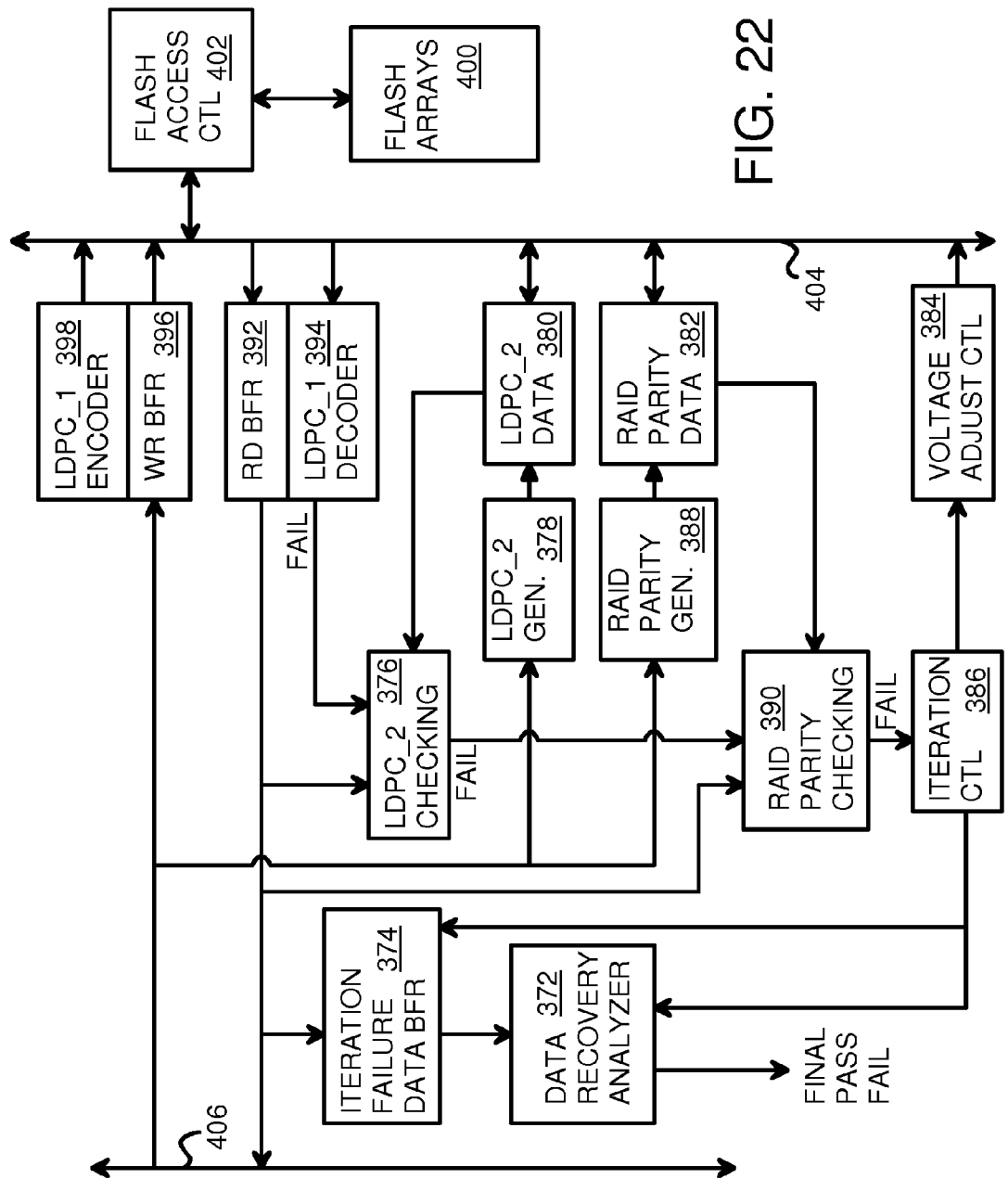
FIG. 22 shows multiple levels of error checking by a SEED eMMC endurance controller.

FIG. 22 shows multiple levels of error checking by SEED eMMC endurance controller 361. Flash arrays 400 in the multiple eMMC's, UFS, iSSD's, or other flash devices may use multi-level cells that are more prone to bit errors when read by flash access controller 402 onto internal bus 404. Low-Density parity Check (LDPC) code may be generated by encoder 398 and appended as spare bytes to data from write buffer 396 before being written to flash arrays 400. When data is read to read buffer 392 from flash arrays 400, parity decoder 394 checks the stored parity against generated parity to detect and correct read errors. When correction is not possible with the LDPC_1 code, a longer, more complex code, LDPC_2 checking 376 is enabled for the page or block of flash data.

The longer parity code LDPC_2 is generated by LDPC_2 generator 378 and buffered to bus 404 by LDPC_2 write buffer 380. It is generated when the flash memory page selected needs more protection due to deterioration of the physical cells in its page. LDPC_2 is generated and appended to future data writes to the enabled page or block of flash arrays 400.

When LDPC_2 code fails to correct a read error, RAID parity checking 390 is enabled. The RAID parity may extend across several physical devices of flash memory arrays. The RAID parity code is generated by RAID parity generator 388 and buffered by RAID buffer 382 before being written with the write data on bus 404. It is generated due to the flash memory page selected needing more protection due to deterioration of the physical cells.

When RAID parity code fails to correct a read error, iteration controller 386 is activated to test voltage adjustments. The read data is stored in iteration failure data buffer 374. Voltage adjust control 384 is controlled by the flash controller that writes a specific value to flash memory in order to adjust reference voltages for data being read from flash arrays 400. Data is read back to test if the new set of reference voltages reduces errors. Another round of LDPC_1/LDPC_2/RAID checking occurs. If reading still fails, the read data is stored in iteration failure data buffer 374 and another voltage is selected and another round of read back testing is performed. When all the voltage iterations are tested and fail, iteration failure data buffer 374 is loaded with the test results, which may be analyzed by data recovery analyzer 372 to determine if the data on internal bus 406 can be used or if a fatal failure occurred. The multiple levels of error correction code and parity checking may improve the lifetime and endurance of flash memory.

FIGS. 23A-B show bad block/erase count tables and page status tables for the multiple eMMC's, UFS, iSSD's, or other flash devices and managed by SEED eMMC endurance controller 361. In FIG. 23A, a write date is stored on a block basis. Bad block/erase count table 471 has entries for blocks of flash memory. Each entry contains a block status field, with 3 bits that indicate if the block is empty (erased), used, a block with some garbage pages, a whole bad block, or a partially bad block with some bad pages and some good pages.

Each block entry also has a 13-bit erase count and a 16-bit write date. The 13-bit erase count starts at 0 when the device is first produced. Every time the block is erased it increments by one. This erase count can be used for wear leveling control and can be analyze by a S.M.A.R.T. controller or process for checking the health condition of the device. The write date is the date that the last write to the block occurred. It is used for the purpose of the refresh function. For TLC devices the retention time may be less than 1 year. The write date may be encoded data (MM-DD-YY), or a number value that refers to the device manufacturing date initialized at manufacture.

Page status table 473 has entries for all pages in a block. Each page has a 3-bit page status field. Since each page entry is only 3 bits long, many page entries may be packed together. The page status indicates an empty, used, or garage page, a bad page, or a page that is protected with a higher level of error correction, such as a longer ECC code than for other pages.

FIG. 23B, a write date is stored on a page basis rather than on a block basis. Bad block/erase count table 471' has entries for blocks of flash memory. Each entry contains a 13-bit erase counter and a block status field, with 3 bits that indicate if the block is empty (erased), used, a block with some garbage pages, a whole bad block, or a partially bad block with some bad pages and some good pages. The block status code is:
000 EMPTY BLK
001 USED BLK
010 BLK WITH GARBAGE
011 WHOLE BLK BAD
100 EMPTY BLK, BAD PAGES
101 USED BLK, BAD PAGES
110 BLK WITH GARBAGE, BAD PAGES
111 FACTORY BAD BLK
and the page status encoding is:
000 EMPTY PAGE
001 EMPTY PAGE+PROTECT
010 USED PAGE
011 USED PAGE+PROTECT
100 GARBAGE PAGE
101 GARBAGE PAGE+PROTECT
11X BAD PAGE The write date is not stored in bad block/erase count table 471'. Instead, the write date is stored in page status table 473'. The write date is the date the page is written for FIG. 23B, but the write date is the date the block is written for FIG. 23A. Storing the write data for pages rather than for blocks requires more table storage since each block has many pages, but endurance may be increased. This refresh is for pages, not for the whole block.

Figure 24A:
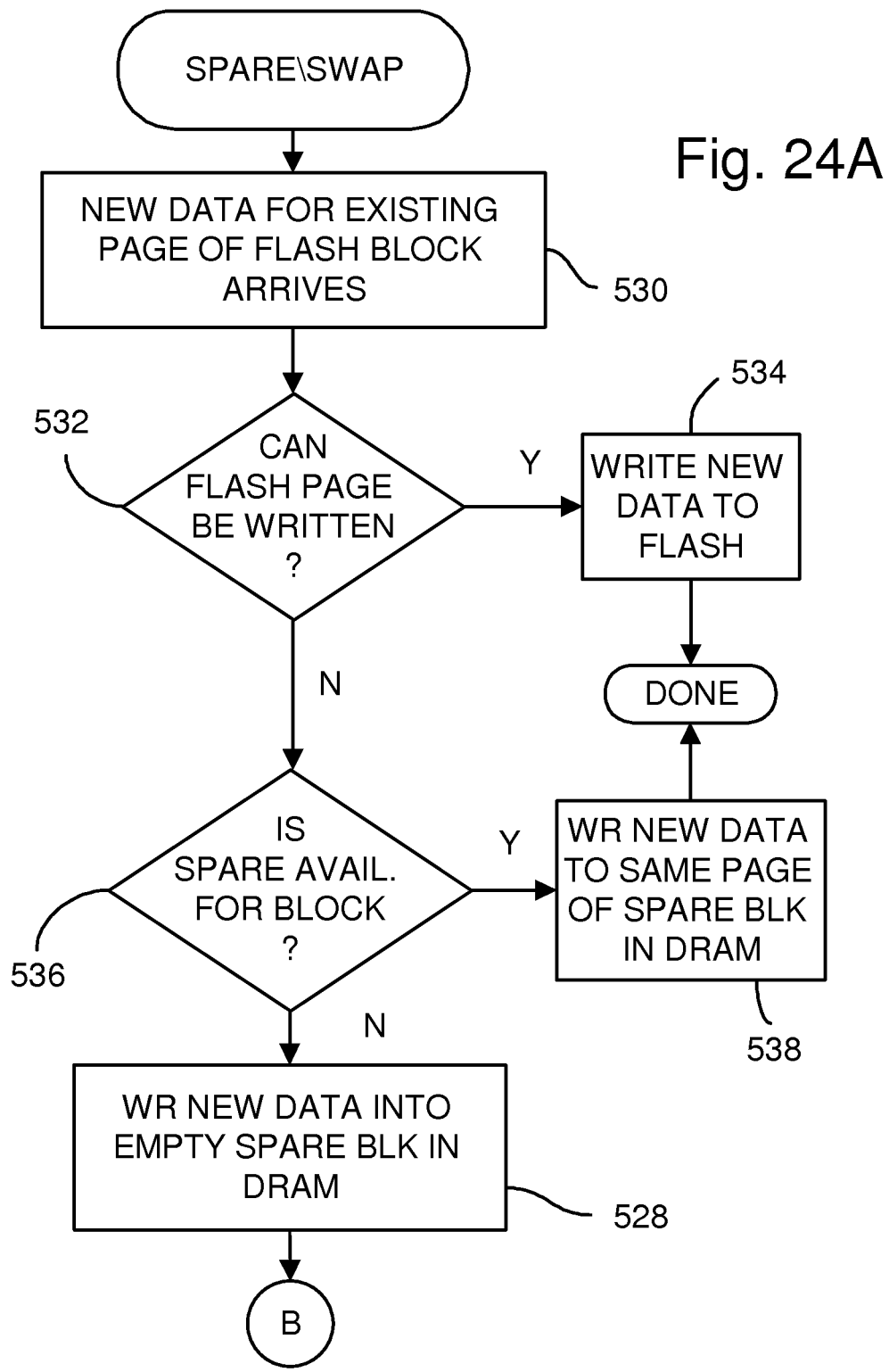

FIGS. 24A-B show spare/swap processing by the lower-level the multiple eMMC's, UFS, iSSD's, or other flash devices. When new data for an existing page of a flash block arrives, step 530, and the flash page can be written, step 532, then the new data is written to the flash page, step 534.

When the flash page cannot be written, such as when the page is before other pages that have already been written in the block, and the flash memory only allows pages to be written in a forward sequence, step 532, but a spare block is available for the block, step 536, then the new data is written to the same page of the spare block in a DRAM buffer, step 538.

When the flash page cannot be written and no spare is available, the new data is written into and empty spare block in the DRAM buffer, step 528. The process continues in FIG. 24B. When other empty spare blocks are available, step 540, then the process ends.

When no more spare blocks are available, step 540, then a spare block with the most pages written, or least frequently accessed, is chosen, step 542. Dirty pages from the chosen spare block are combined with valid pages from the old block that are written into the chosen spare block, step 543. The combined pages in the chosen spare block are written to an empty block in flash, the swap block, step 546. The old chosen block is erased, step 548.

FIGS. 25A-D show a process for detection and handling of bad pages and bad blocks. This process may be performed by the lower-level the multiple eMMC's, UFS, iSSD's, or other flash devices.

Figure 25A:
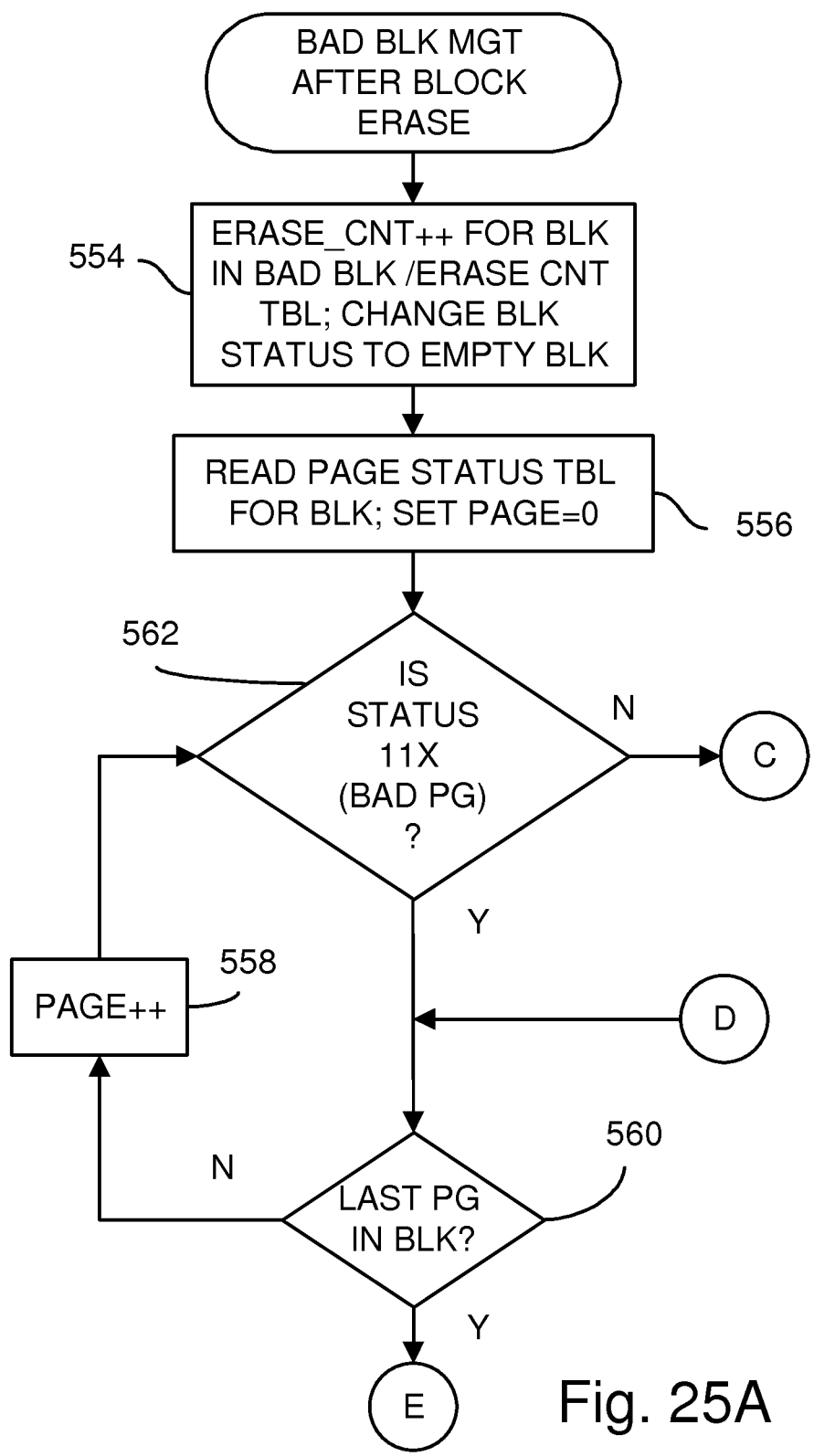
FIGS. 25A-D show a process for detection and handling of bad pages and bad blocks.

In FIG. 25A, once a block in flash memory has been erased, the erase counter for that physical block is incremented and the block status is changed to either empty block (000) or empty block with bad pages (100), depending on the previous block status and current page status, step 554. The bad block erase count table includes an erase counter for each physical block, and a status for that block. The block status can be a three-bit value, with 000 indicating an empty good block, 011 and 111 indicating a bad block, and 100 indicating a partially-bad block that has some bad pages and some good pages.

The bad block erase count table may also include page status tables that track bad pages within a block. A value of 000 for the page status indicates a good page, 001 indicates a protected page that uses a 100-bit second-level ECC rather than a 25-bit first level ECC, 010 indicates the page was used, 110 indicates the page has garbage/trimmed data, and 11X indicates a bad page.

After the block is erased, the status of each page in that block is checked. The page status table for the physical block is read, step 556, and the current page is initialized to page 0. When the status for the current page is 11X, step 562, the current page has already been marked as a bad page. No further processing for this page is needed. When the current page is not beyond the last page in the block, step 560, the current page is incremented to the next page in the block, step 558, and the process repeats for the next current page at step 562.

Figure 25B:
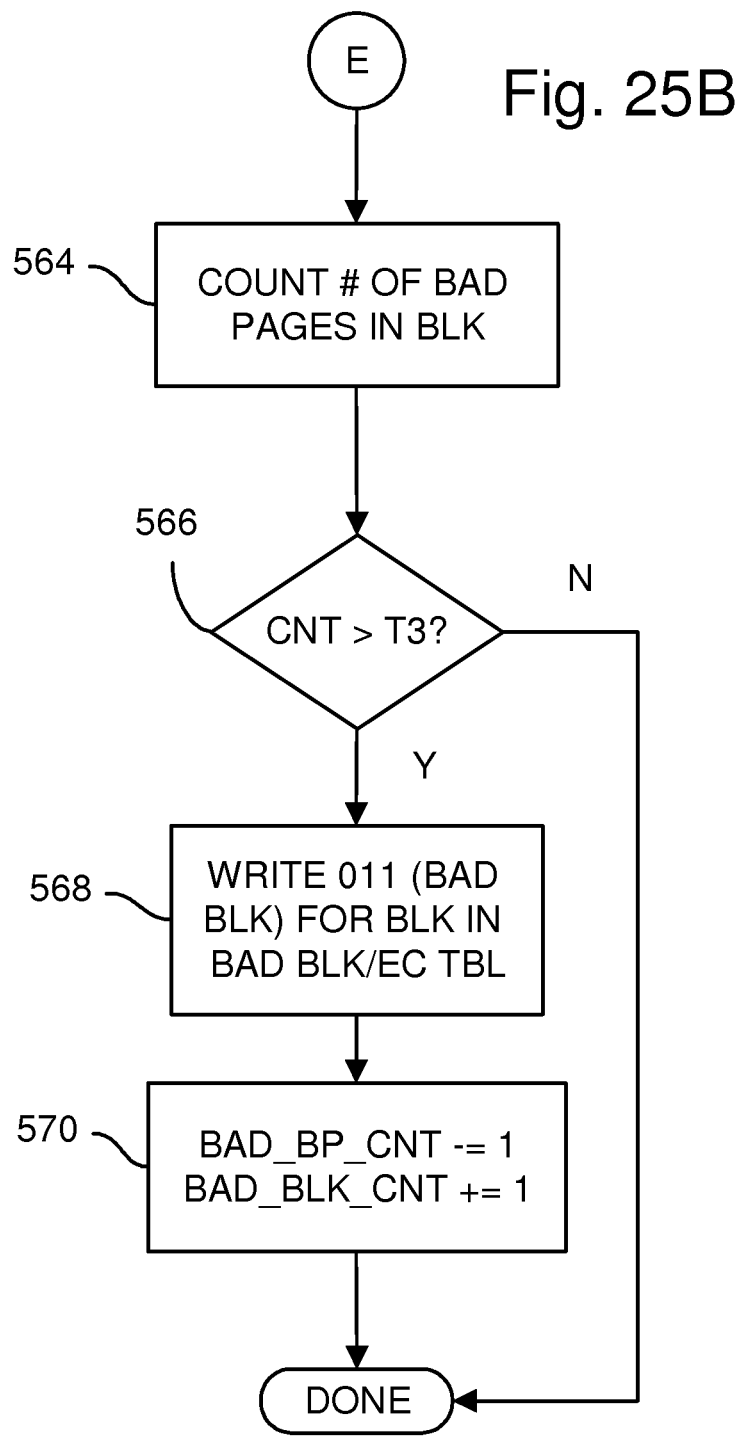

In FIG. 25B, all pages in the physical block have been processed. The number of bad pages in the block is determined, step 564. When the count of bad pages in the block exceeds threshold T3, step 566, the block is declared a bad block. The block status for this physical block is changed to 011 in the bad block erase count table, step 568. The physical block is no longer used. The partially-bad block counter (BAD_BP_CNT) is decremented and the bad block counter is incremented, step 570 for S.M.A.R.T. information.

Figure 25C:
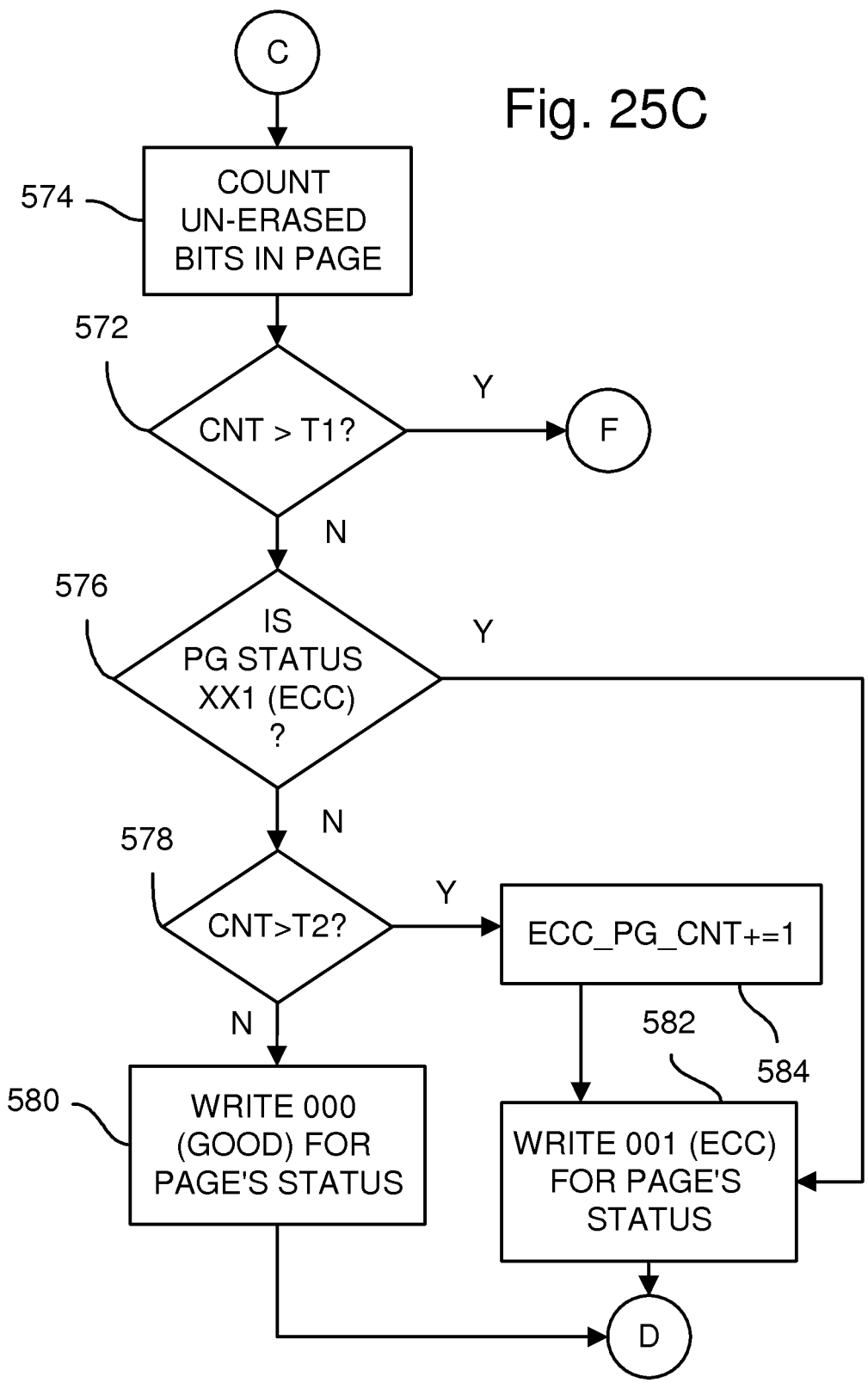

In FIG. 25C, the current page had not previously been marked as a bad page, step 562 (FIG. 25A). The erase operation erases all bits in the page to an erased value, such as 1. The bits in the current page are read to see if all the bits are erased. A count is obtained, step 574, of the number of bits in the page that are in the un-erased state, such as 0 bits. These are faulty bits. However, ECC may be able to correct these errors, so the page may still be usable if the number of bit error is small.

When the un-erased bit count is less than a first threshold T1 (indicating too many error bits, increasing the risk to use this page even with the extra software ECC protection), step 572, and the current page status is page needs protection (XX1), step 576, then the page is already marked as needing protection by second-level ECC. The page status is changed to empty page needing protection (001), step 582. The next current page is processed by returning to FIG. 25A.

When the un-erased bit count is less than the first threshold T1, step 572, and the current page status is not a page needing protection (XX1), step 576, then the page is not yet protected by second-level ECC. When the un-erased bit count is greater than a second threshold T2 (indicating a level of error bits that may result in future fatal errors and needing extra software ECC help to correct the errors), step 578, the second-level ECC page counter is incremented, step 584 and the page status is changed to 001, step 582, and the second-level ECC will be used in the future when host data is stored in this physical page. The next current page is processed by returning to FIG. 25A.

When the page is not yet protected by second-level ECC, step 576, and the un-erased bit count is not greater than the second threshold T2, step 578, the page status is good. The first-level ECC is sufficient to correct the expected errors in this current page. The page's status is changed to 000, step 580, if it is not already marked as a good page. The next current page is processed by returning to FIG. 25A.

Figure 25D:
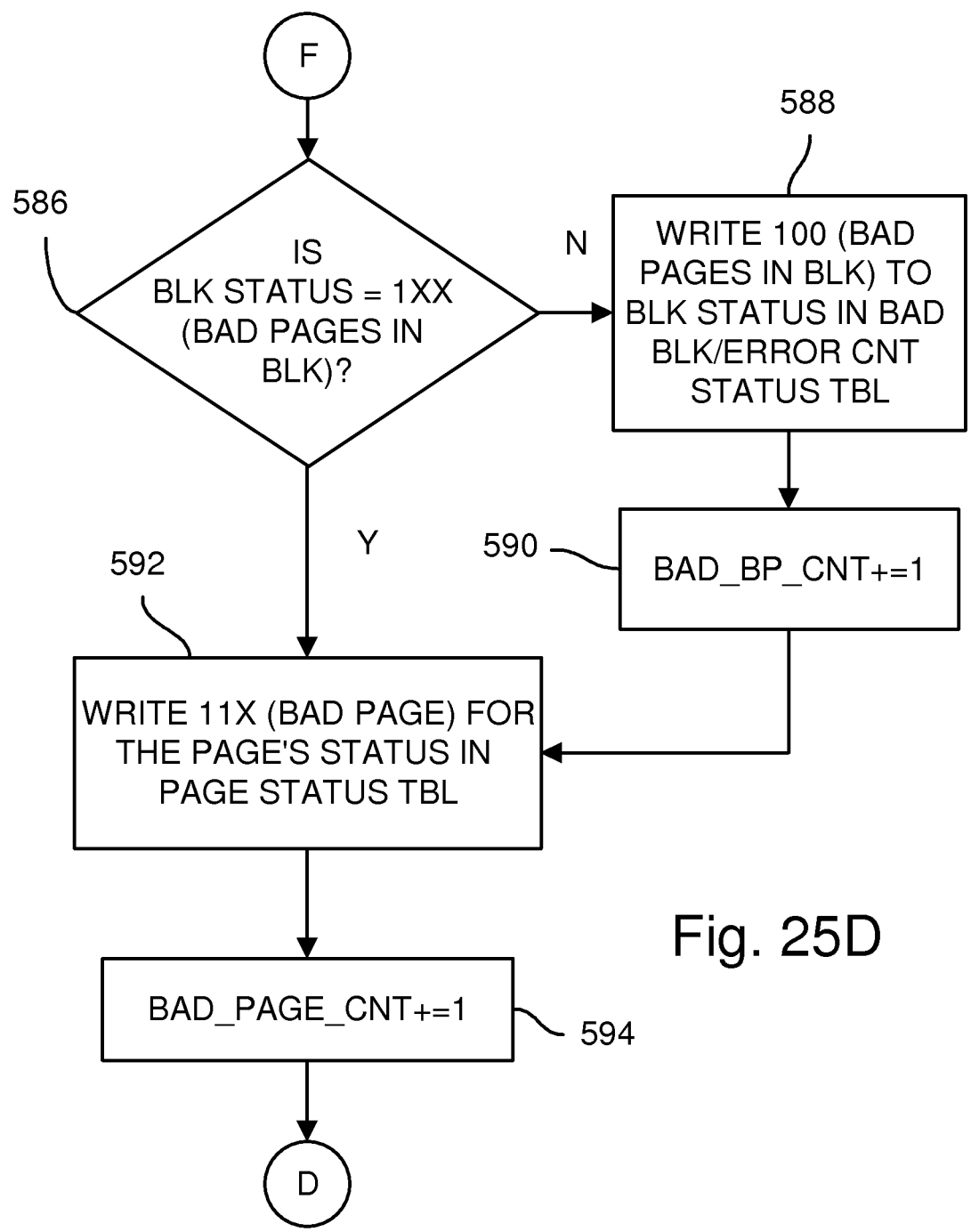

In FIG. 25D, the current page has more than the first threshold T1 of un-erased bits, step 572 (FIG. 25C). Exceeding the T1 threshold indicates that the page has more un-erased bits than can be corrected by the second-level of ECC. The page is bad and cannot be safely used.

When the status for the physical block is bad pages in block (1xx), step 586, the block has already been marked as a bad-page block in the bad block erase count table. There were other bad pages in this block, and no block status change is needed. However, the current page is marked as a bad page by changing the page status to 11X in the page status table, step 592. The bad page counter is incremented, step 594, before the next current page is processed by returning to FIG. 25A.

When the status for the physical block is not 1XX, step 586, the block has not yet been marked as a partially-bad block in the bad block erase count table. There have been no other bad pages in this block. The block's status is changed to empty block with bad pages (100) in block erase count table 164, step 588. The partially-bad block counter (BAD_BP_CNT) is incremented, step 590. Also, the current page is marked as a bad page by changing the page status to 11X in the page status table, step 592. The bad page counter is incremented, step 594, before the next current page is processed by returning to FIG. 25A.

The SSD may contain many flash memory chips (such as 16 flash memory chips), or each the multiple eMMC's, UFS, iSSD's, or other flash devices may contain multiple flash chips. Some special situations may be encountered, such as when one plane of the flash chip is bad or the whole chip is bad. If over provisioned, the flash capacity of the SSD can absorb the loss of capacity of one full plane or the whole flash memory chip. Special algorithms of the device controller can be used to bypass the losses, such as to recover the data and then adjust the meta-page unit size of the flash devices to avoid the faulty plane or chip. Over-provisioning also can be done by using idle chips for the replacement of the failed chip.

Figure 26A:
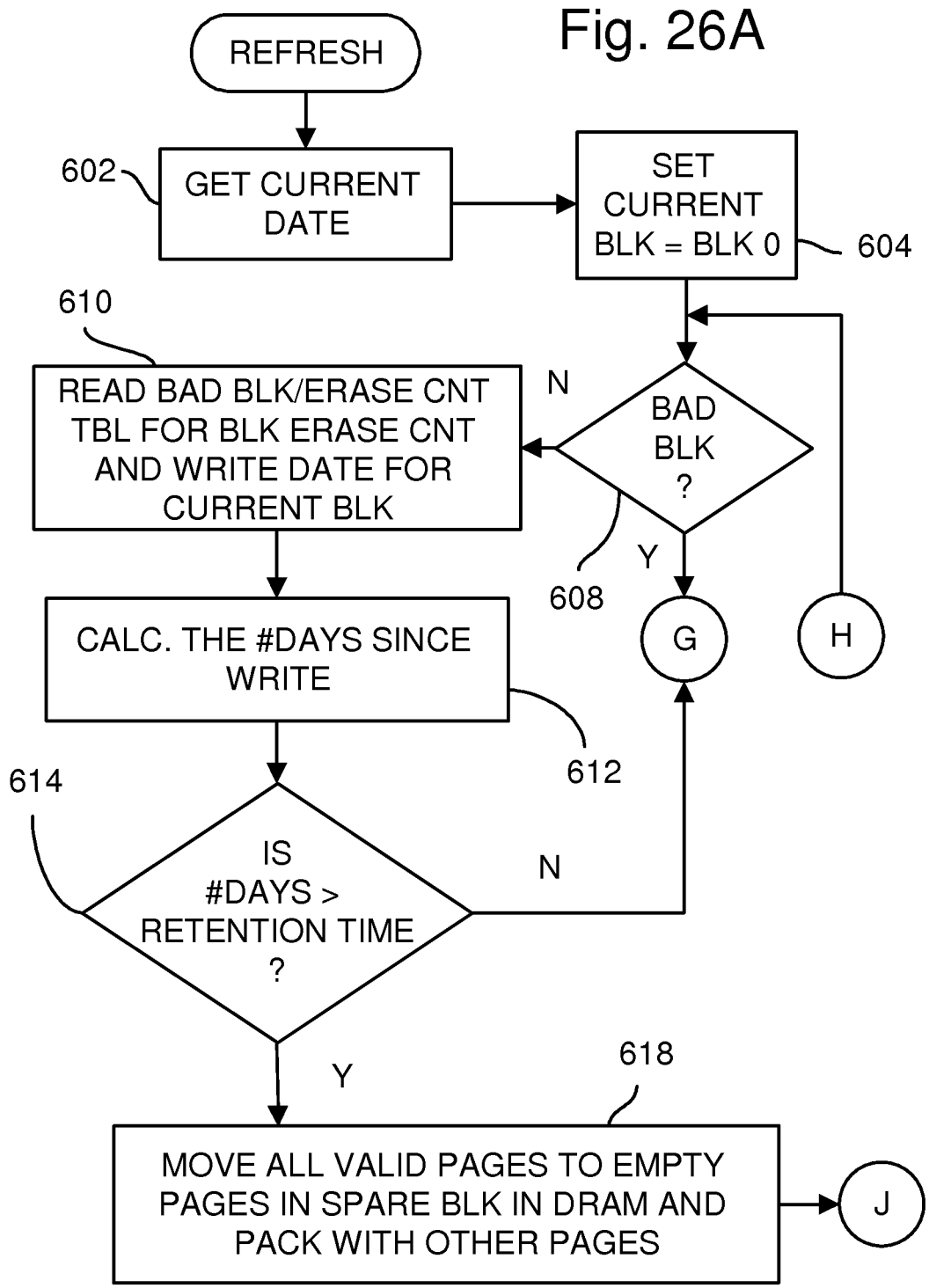
FIGS. 26A-B show a flash block refresh operation using the tables in FIG. 23.
Figure 26B:
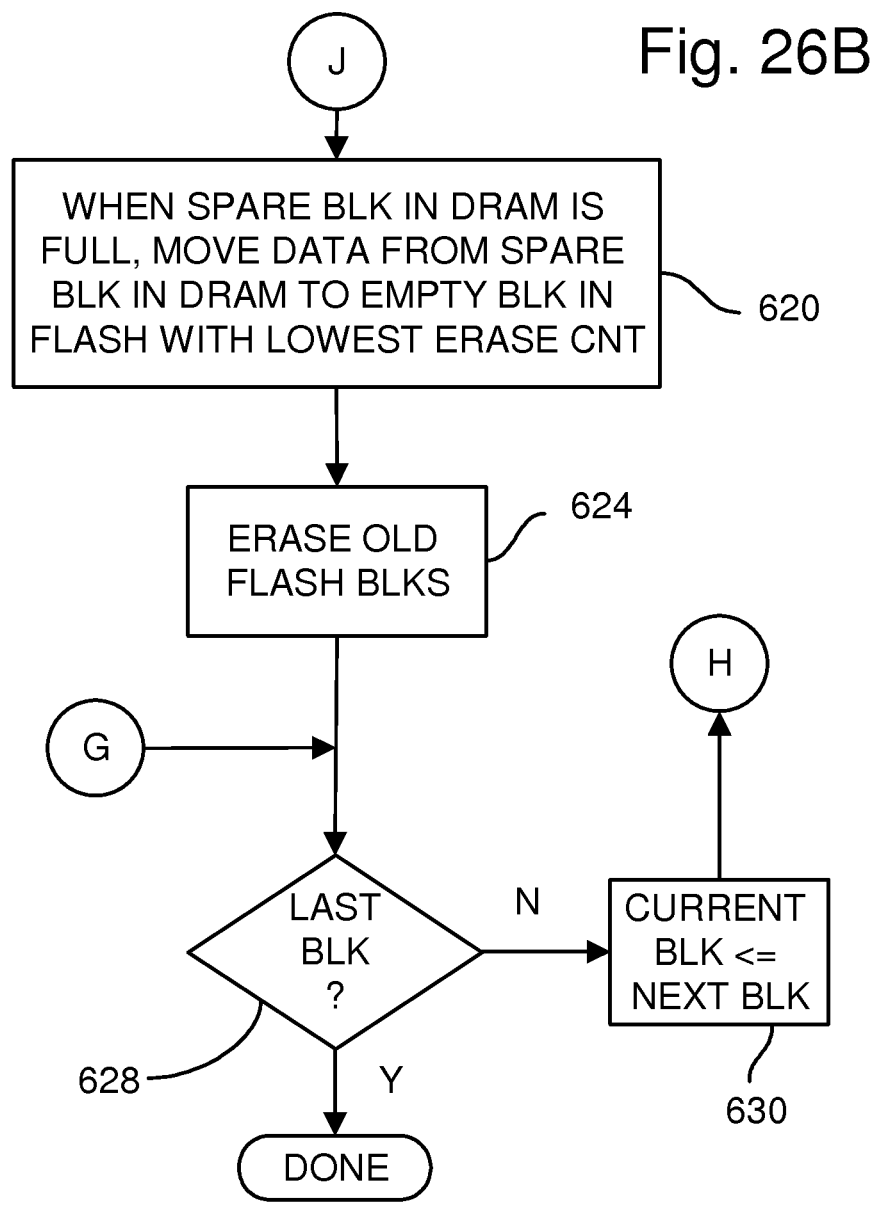

FIGS. 26A-B show a flash block refresh operation using the tables in FIG. 23A. This process may be performed by the lower-level the multiple eMMC's, UFS, iSSD's, or other flash devices.

When refresh is initiated, such as periodically (once per week, etc.) or by the host through vendor commands, the current date is obtained, step 602. The current block is set to the first block, step 604, and if the block is not a bad block, step 608, then the block erase count and the block write date are read from the bad block erase count table, step 610. The number of days since the last write is calculated, such as by subtracting the write date from the current date, step 612. When the number of days since the last write exceeds the retention time, step 614, then all valid pages in the block are moved to empty pages in a spare block, and packed with other pages from previously refreshed blocks at step 618.

In FIG. 26B, when the spare block in the DRAM is full, data from the spare block in DRAM is moved to a spare block in flash with the lowest erase count, step 620. Then the old flash blocks are erased, step 624. When there are more blocks to process, step 628, the current block is advanced to the next block, step 630.

Figure 27A:
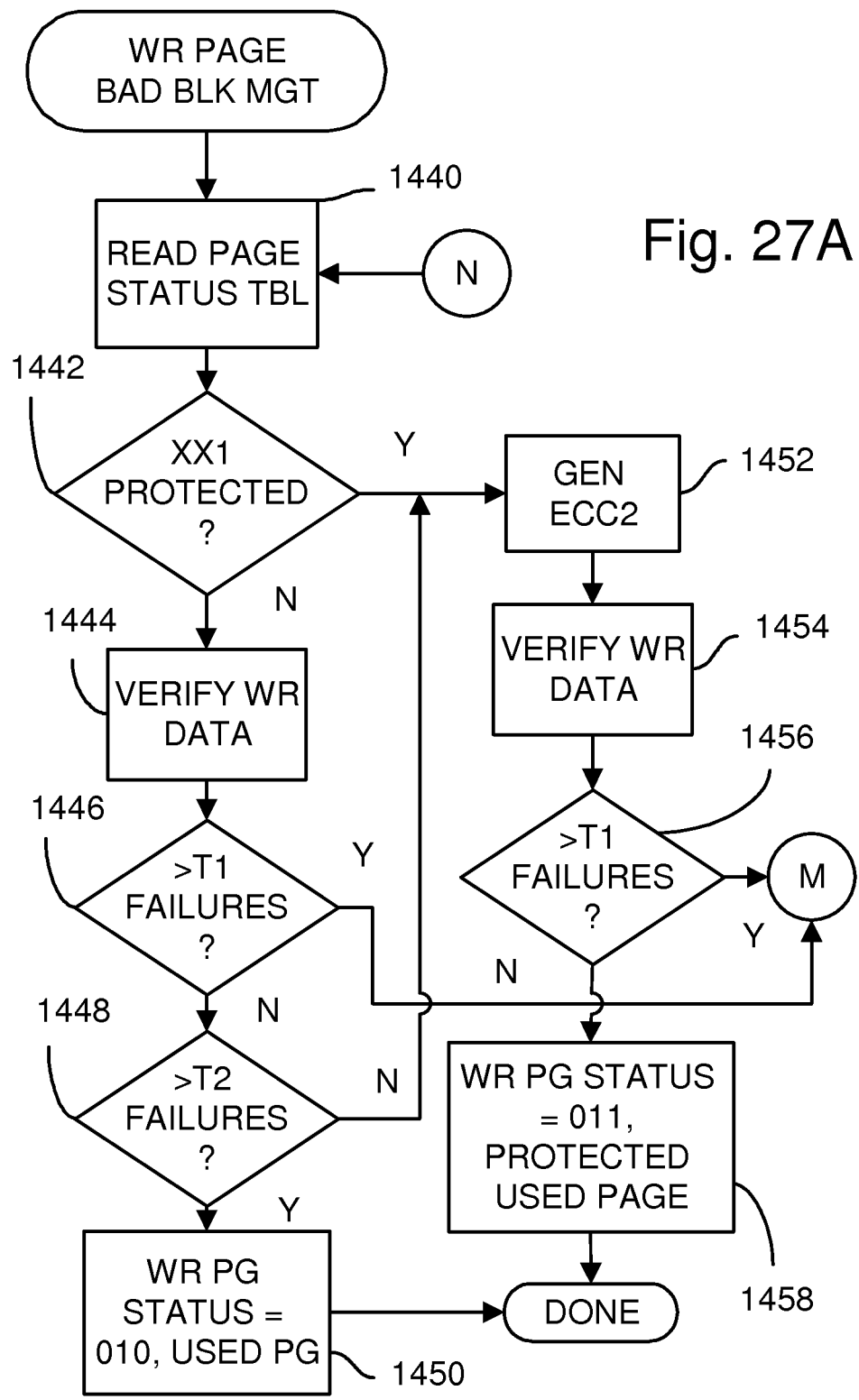
FIG. 27A-B show a process for bad page management during a page write.
Figure 27B:
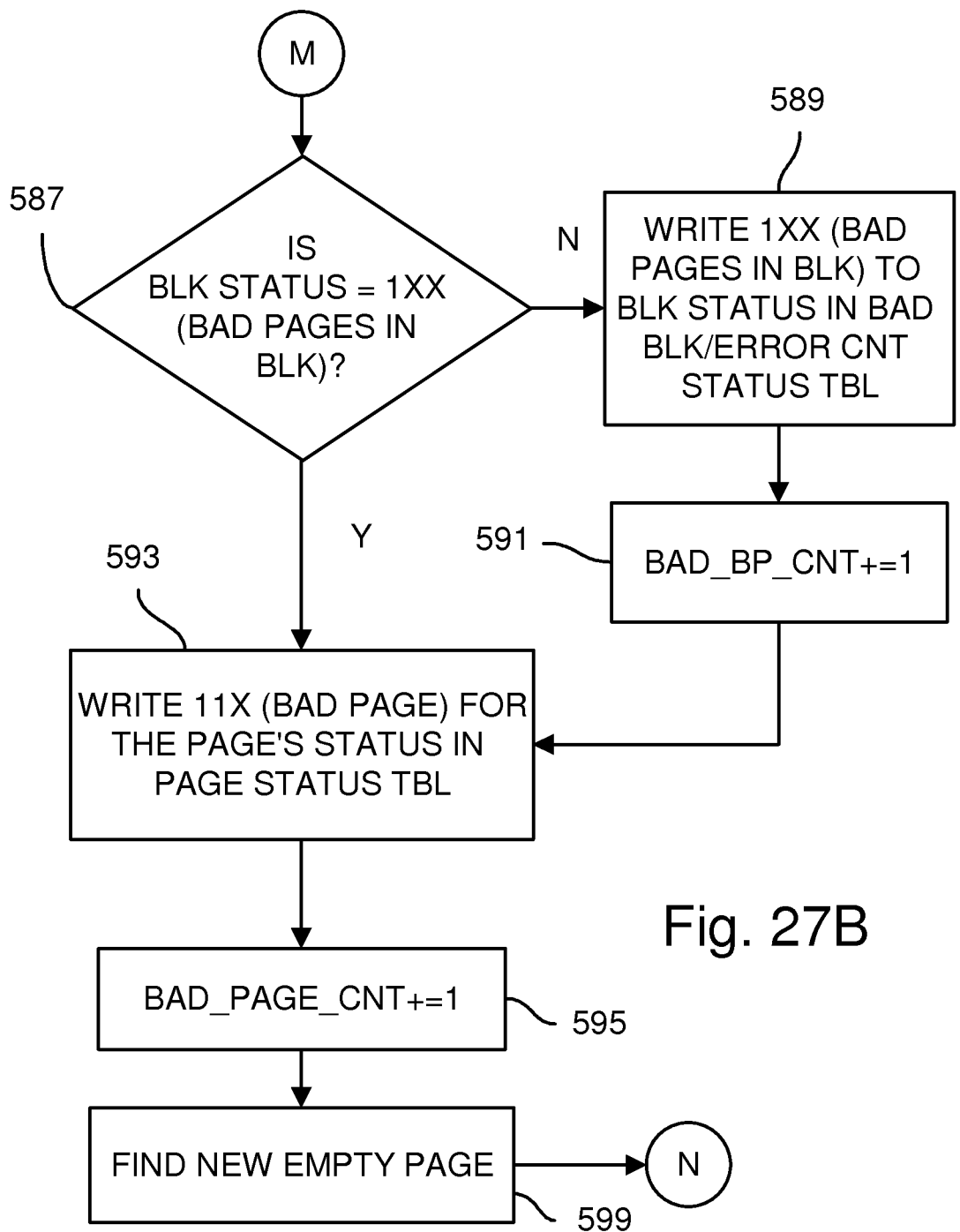

FIGS. 27A-B show a process for bad page management during a page write. The tables of FIG. 23B are used. In FIG. 27A, when a page is to be written to flash memory, the page status table is read, and the page is not a bad page and is an empty page, step 1440. When the page status is protected, XX1, step 1442, then the second level of error code, ECC2, is generated for the page, step 1452. The write data is verified, step 1454, and when less than the T1 threshold of errors occur, step 1456, then the page status is written as 011, a used protected page, step 1458, to the page status table.

When the page status is not protected, XX1, step 1442, then write data is verified, step 1444, and when less than the T1 threshold of errors occur, step 1446, and less than the second threshold T2, step 1448, then the page status is written as 010, a used page, step 1450, to the page status table. In step 1448, when more than T2 errors are detected, the second-level ECC2 is generated, step 1452, and the page becomes a protected page.

When more than T1 errors occur in steps 1446 or 1456, the process continues in FIG. 27B. When the block status read is 1XX, a block with bad pages in the block, step 587, then the page status is written as 11X, bad page, in the page table, step 593. The bad page count is incremented, step 595, and a new empty page is located for receiving the host write data, step 599.

When the block status read is not yet 1XX, step 587, then the block status is changed to 1XX in the bad block erase count table, step 589. The block with bad pages (BP) counter is incremented, step 591, and the page status changed to 11X, step 593.

Figure 28:
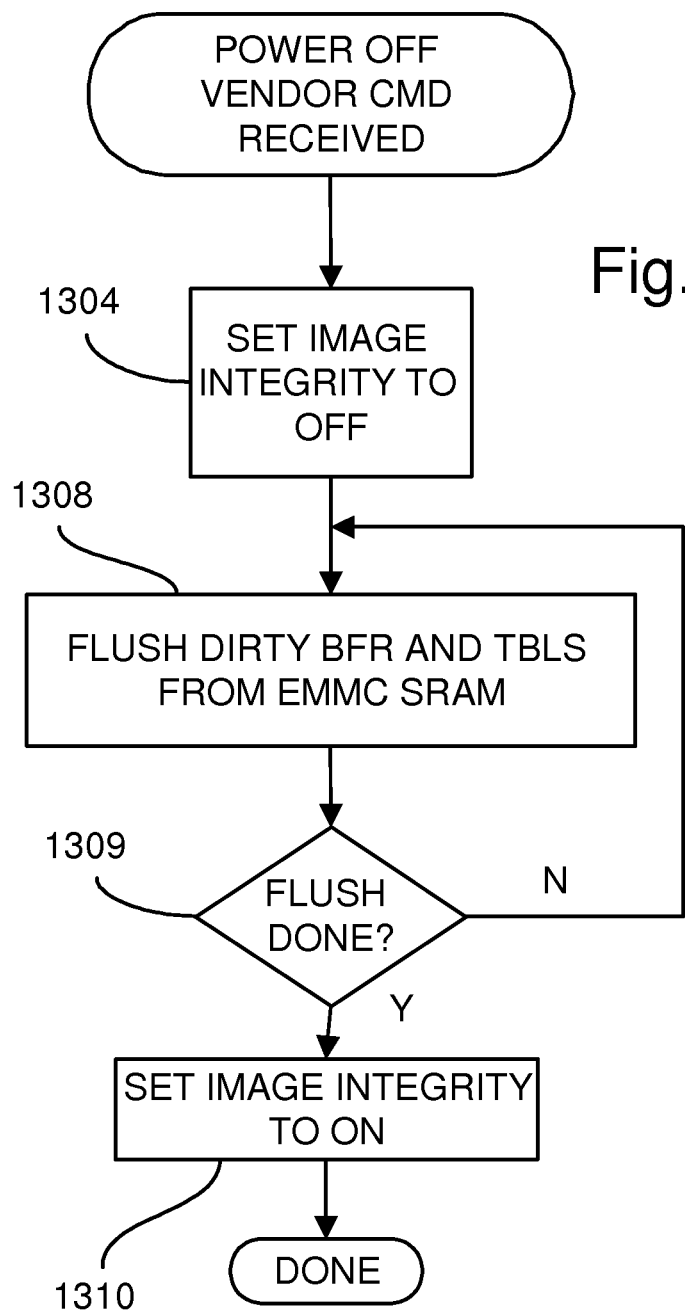
FIG. 28 is a flowchart of a power down sequence on each of the multiple eMMC's, UFS, iSSD's, or other flash devices.

FIG. 28 is a flowchart of a power down sequence on each of the multiple eMMC's, UFS, iSSD's, or other flash devices. When the higher-level SEED SSD loses power, and no backup power is available, then a vendor command is issued to inform the eMMC that a power failure is detected. An image integrity flag is set to off, step 1304.

SEED eMMC endurance controller 361 flushes dirty tables, buffers, and caches from SEED eMMC SRAM 345 to the eMMC, step 1308. Once completed, step 1309, the image integrity flag is set to on, step 1310. Each eMMC can check the integrity flag to insure the integrity of the data from last power off. It can be a status to the SEED eMMC endurance controller for the image rebuild.

FIG. 29 is a flowchart of setting up flash ready/busy parameters. A flash's read, write or erase needs time to finish and their response times may vary. During the access time, the flash cannot be accessed except for the status read command. Depending on the vendor and flash device, various ready/busy bits and other information can be read thru the status read command. A ready/busy signal pin from each die is provided for the flash controller to access. Due to having multiple channels or multi die stacks, the flash controller doesn't have enough I/O pins to take care of all the individual ready/busy signals. Generally, they are tied together as one pin and only one active ready/busy signal will make the pin active. For different read, write, erase operations, it is difficult to determine which flash is available for further action. The routine of FIG. 29 may execute on eMMC. When flash parameters have not yet been created, step 1824, the structure and arrangement of the flash devices are determined. The number of channels per device is determined, step 1826. Each downstream flash device is queried by sending it an ID command 90h or by reading a parameter page data structure, step 1828. A number of parameters specific to that flash device are obtained, such as its size and organization into planes, the number of bits per cell for multi-level logic cells, page size, block size, redundant area size, and access times. The number of flash chips per channel is obtained, step 1830, allowing the strip size to be calculated, step 1832. The stripe size may depend on the number of channels, the number of flash chips per channel, and the number of planes per flash chip. The total number of planes is the number of channels multiplied by the number of flash chips per channel, multiplied by the number of planes per flash chip. Each plane may be read or written independently or in parallel with other planes.

Each plane is assigned one bit in the SRAM buffer to indicate its status as ready (0) or busy (1) with a program, read, or write operation. A data structure of these ready/busy bits is created in the SRAM buffer, step 1834. At initialization, all the ready/busy bits are cleared to zero due to no activity on all flashes. At initialization, the R/B check flag for the system is cleared, step 1836.

Figure 30A:
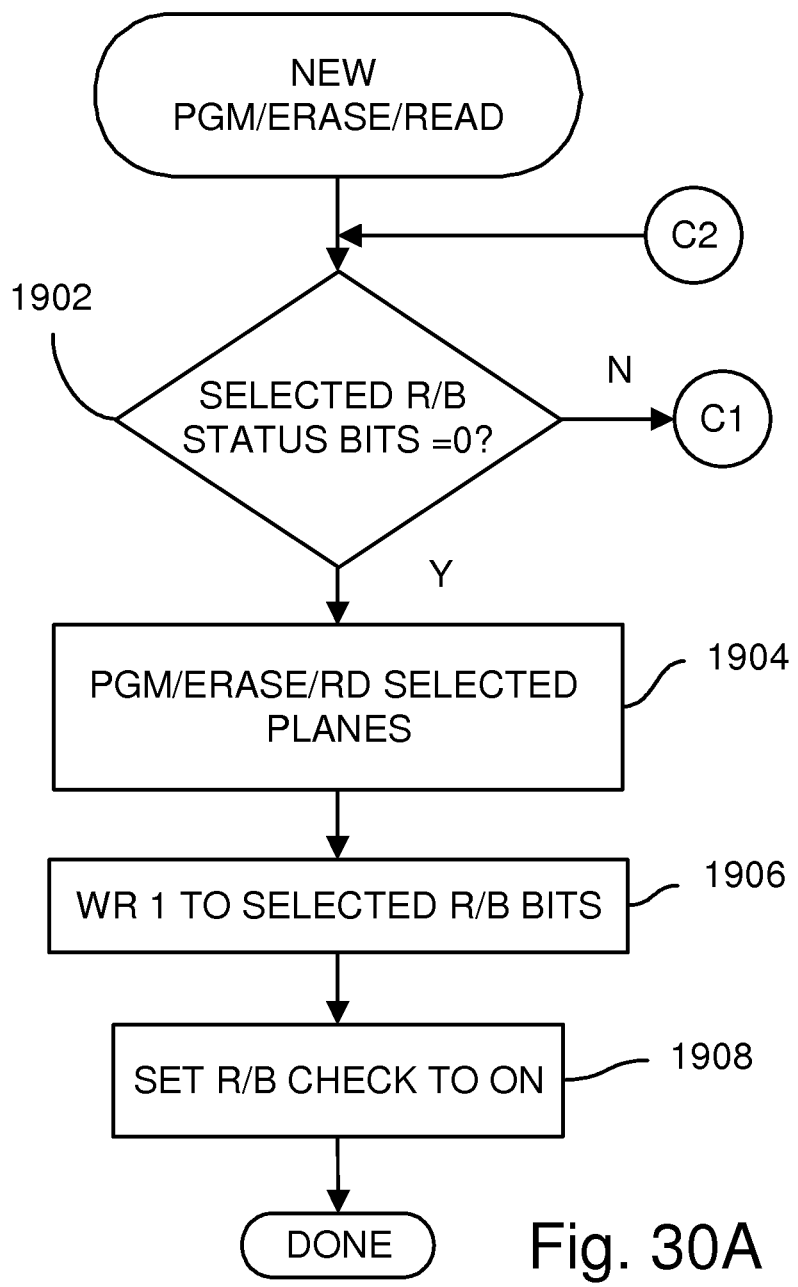
FIGS. 30A-B show ready/busy status management of each flash when a new program, erase, or write command is issued.
Figure 30B:
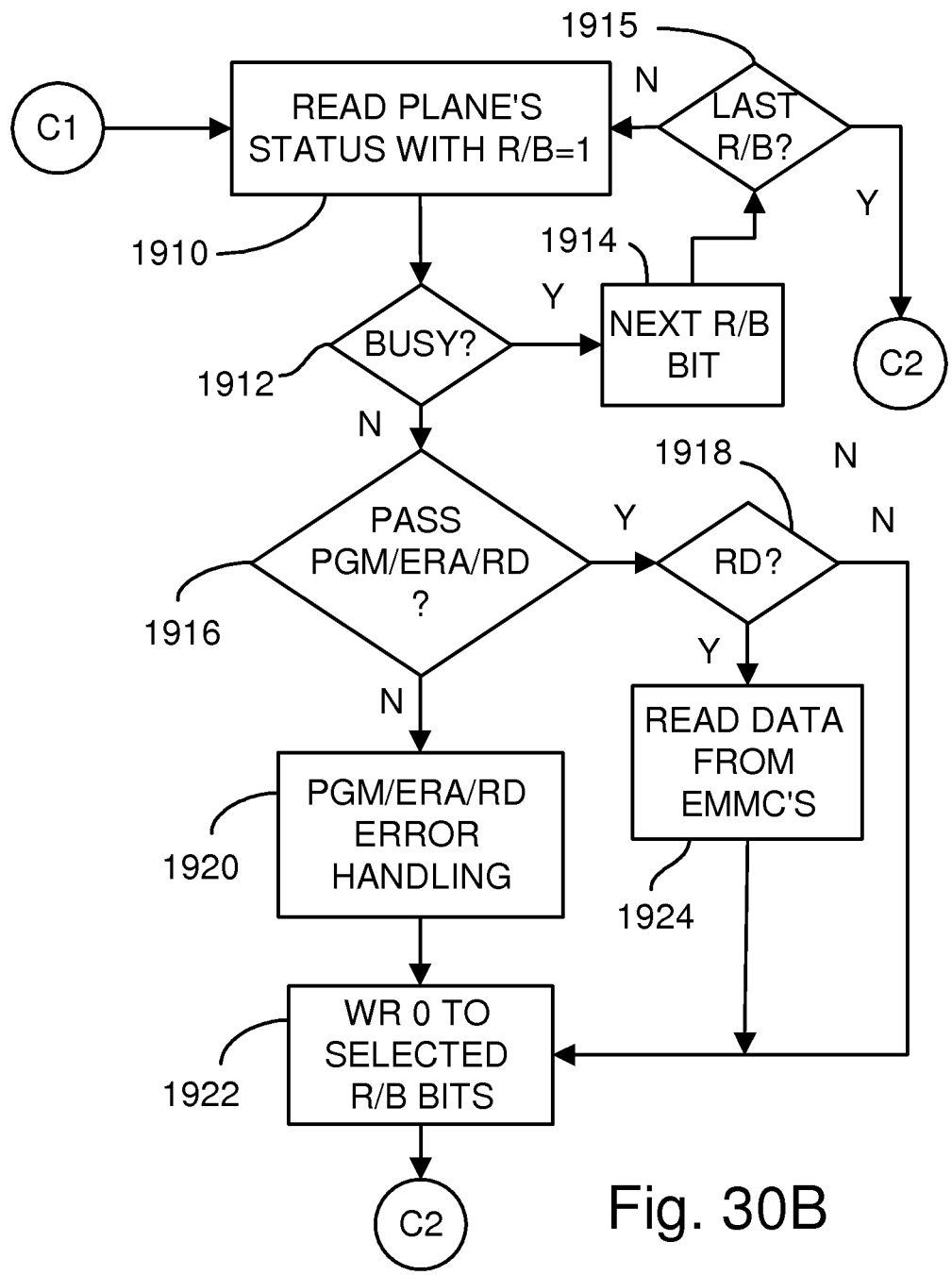

FIGS. 30A-B show ready/busy status management when a new program, erase, or read command is issued. The LBA from the host is mapped to a physical address that identifies one or more planes in the flash. The ready/busy bit selected for that plane is read from the SRAM buffer. When the selected ready/busy bit is 0, step 1902, the selected plane is not busy, so the program, erase, or read of the selected plane may be initiated, step 1904. A one is written to the selected ready/busy bit for that plane, step 1906, to indicate that a program, erase, or read operation is now in progress. The ready/busy check flag is set to on, step 1908.

When the selected ready/busy bit is 1, step 1902, the selected plane is busy. In FIG. 30B, there may be multiple planes being accessed, each with its own ready/busy bit. The ready/busy status bit for one of the busy planes is read, step 1910, and if the bit indicates that the plane is still busy, step 1912, then the next ready/busy bit for a next busy plane is selected, step 1914. When there are no more R/B bits for this plane, step 1915, the process loops back to step 1902 to process ready/busy bits for other planes.

When the ready/busy bit has changed back to 0, the plane has finished its operation, step 1912. The controller may read a success bit for the plane to determine if the program, erase, or read operation was a success, step 1916. When the operation was a success, step 1916, and the operation was a read, step 1918, then the data is read from the eMMC's, step 1924, and 0 is written to the selected ready/busy bits, step 1922. The process loops back to step 1902 to process other ready/busy bits. When the operation was not a read, step 1918, then 0 is written to the selected ready/busy bits, step 1922. The process loops back to step 1902 to process other ready/busy bits.

When the operation was a failure, step 1916, then error handling is activated, step 1920, and 0 is written to the selected ready/busy bits, step 1922. The process loops back to step 1902 to process other ready/busy bits.

Figure 31A:
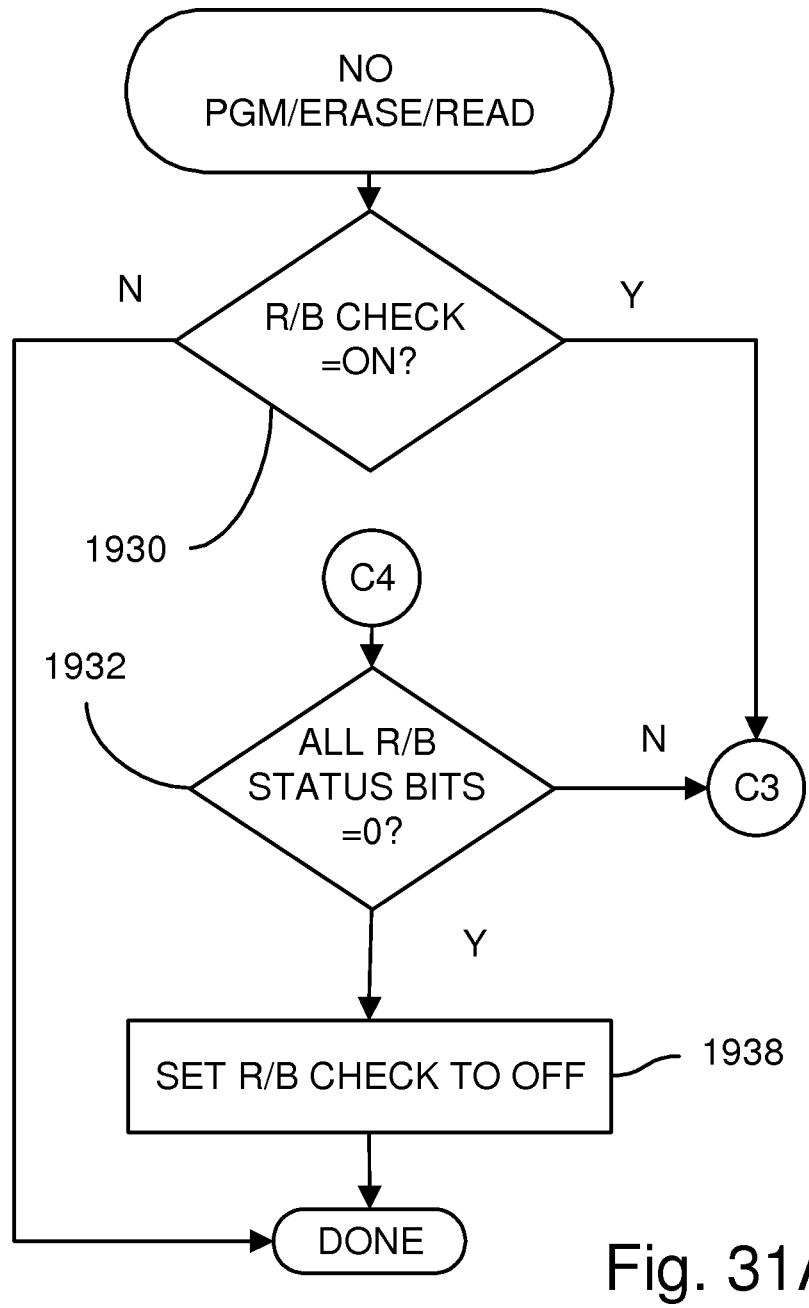
FIGS. 31A-B show ready/busy status management of each flash when no program, erase, or write commands are issued.
Figure 31B:
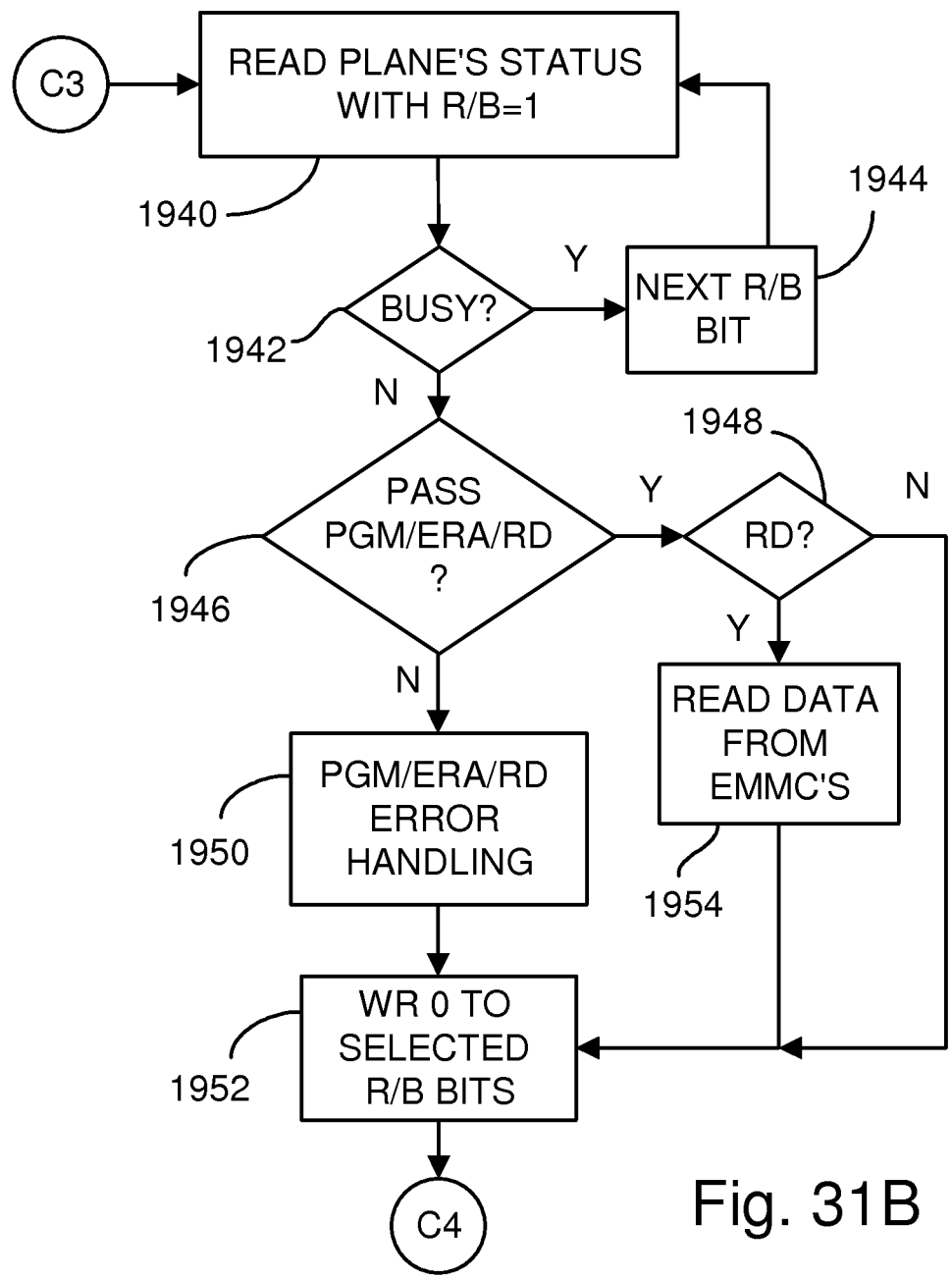

FIGS. 31A-B show ready/busy status management when no program, erase, or write commands are issued. When the system ready/busy status flag is off, step 1930, the process ends. All planes are available. Otherwise, in FIG. 31B, the LBA from the host is mapped to a physical address that identifies one or more planes in the flash. The ready/busy bits selected for those planes are read from the SRAM buffer.

When one of the selected ready/busy bits is 1, the selected plane is busy. The ready/busy status bit for one of the busy planes is read, step 1940, and if the bit indicates that the plane is still busy, step 1942, then the next ready/busy bit for a next busy plane is selected, step 1944.

When the ready/busy bit has changed back to 0, the plane has finished its operation, step 1942. The controller may read a success bit for the plane to determine if the program, erase, or read operation was a success, step 1946. When the operation was a success, step 1946, and the operation was a read, step 1948, then the data is read from the eMMC's, step 1954, and 0 is written to the selected ready/busy bits, step 1952. The process loops back to step 1932

When the operation was a failure, step 1946, then error handling is activated, step 1950, and 0 is written to the selected ready/busy bits, step 1952. The process loops back to step 1932 to check that all planes' R/B status bits are '0'. If all planes' R/B status bits are not '0', the process loops to step 1940 to check the remaining ready/busy bits with '1'. When no more ready/busy bits are set, step 1932, the system ready/busy status flag is cleared to off, step 1938.

Figure 32:
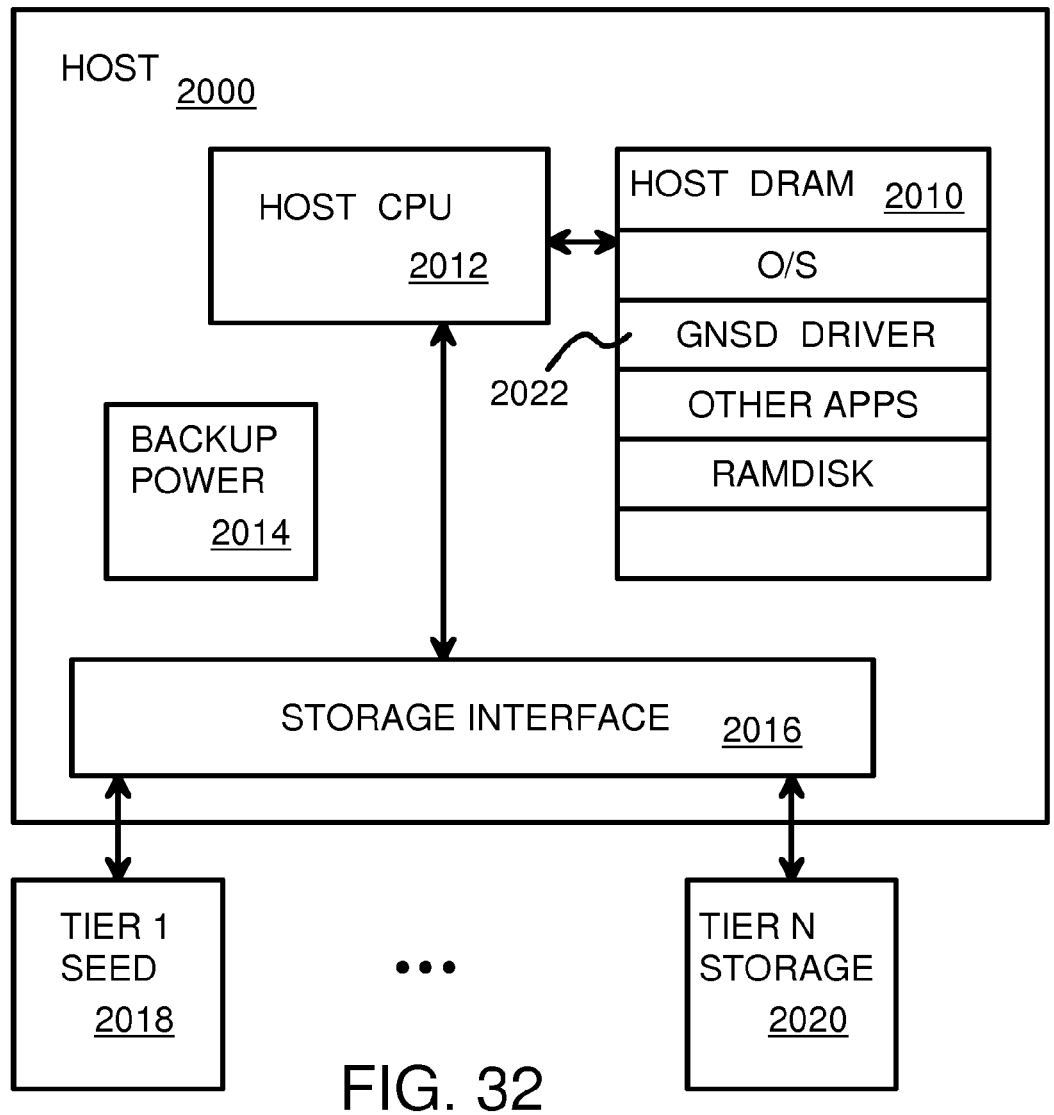
FIG. 32 shows multi-tier storage drives controlled by a GNSD driver in a host.

FIG. 32 shows multi-tier storage drives controlled by a GNSD driver in a host. Green NAND Storage Device (GNSD) 2022 is stored in host DRAM 2010 in host 2000 and is executed by host CPU 2012. GNSD driver 2022 activates storage interface 2016 to access memory devices in tier 1 storage 2018, ... and tier N storage 2020. Host DRAM 2010 may store other information, such as an OS image or kernel, one or more ramdisks, and other user apps.

Tier 1 storage 2018 may be a faster memory such as a DRAM with a backup power source, while lower-tier storage such as tier N storage 2020 may be non-volatile flash memory. Backup power 2014 allows GNSD driver 2022 in host 2000 to continue operating for a period of time after power fails. Tier 1 storage 2018 also may be a SSD, a DRAM SSD, a SEED device with a downstream eMMC device or downstream NAND flash memory. Tier N storage 2020 also may be a SSD, a high-speed HDD, or a low-speed HDD.

Figure 33:
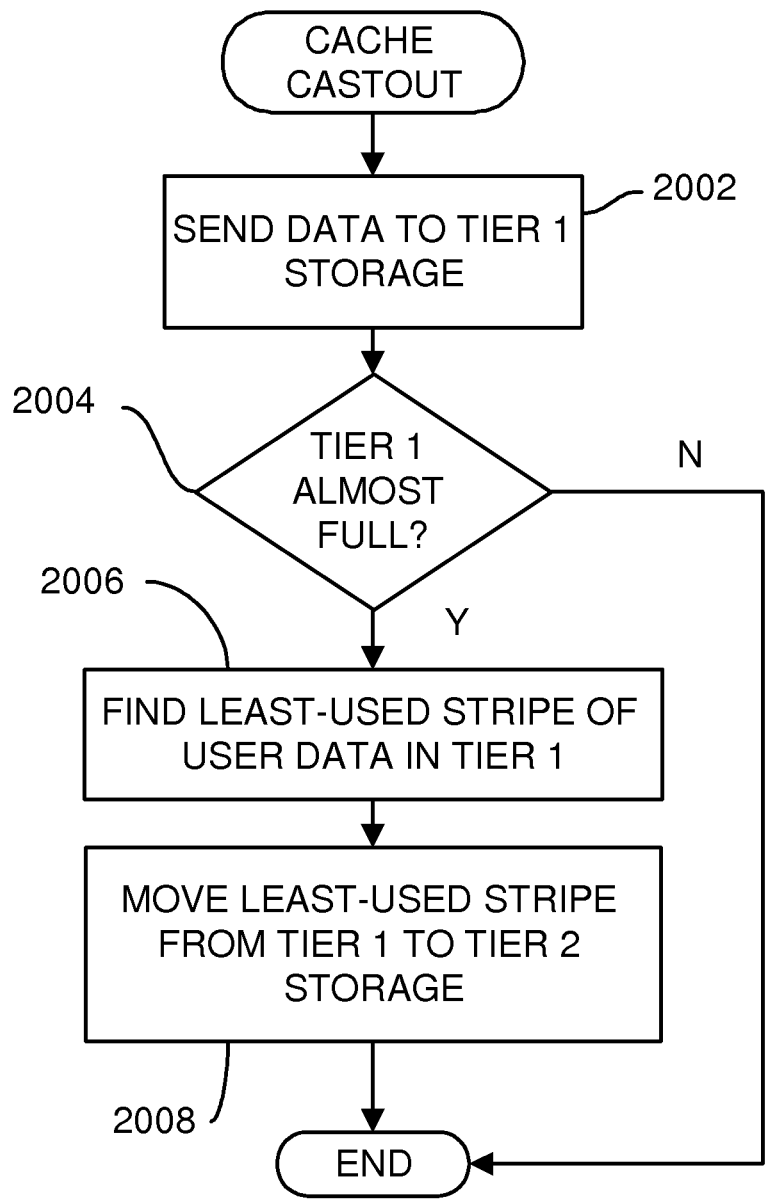
FIG. 33 is a flowchart highlighting use of the multi-tier storage of FIG. 32.

FIG. 33 is a flowchart highlighting use of the multi-tier storage of FIG. 32. Temporary, paging, and meta data may be kept in tier 1 storage while user data is backed up to tier 2 storage when tier 1 storage is full. When a castout occurs from host memory, the castout data is sent to tier 1 storage, step 2002. When tier 1 storage is almost full, step 2004, the least-used stripe of data in tier 1 is located, step 2006, and data in this stripe is moved from tier 1 to tier 2 storage, step 2008. When tier 1 storage is not almost full, step 2004, then the data is stored in tier 1 without accessing tier 2 storage. When tier 2 is a flash memory and tier 1 is a DRAM with some backup power, most accesses may remain in DRAM and not reduce the life of the flash memory.

Figure 34:
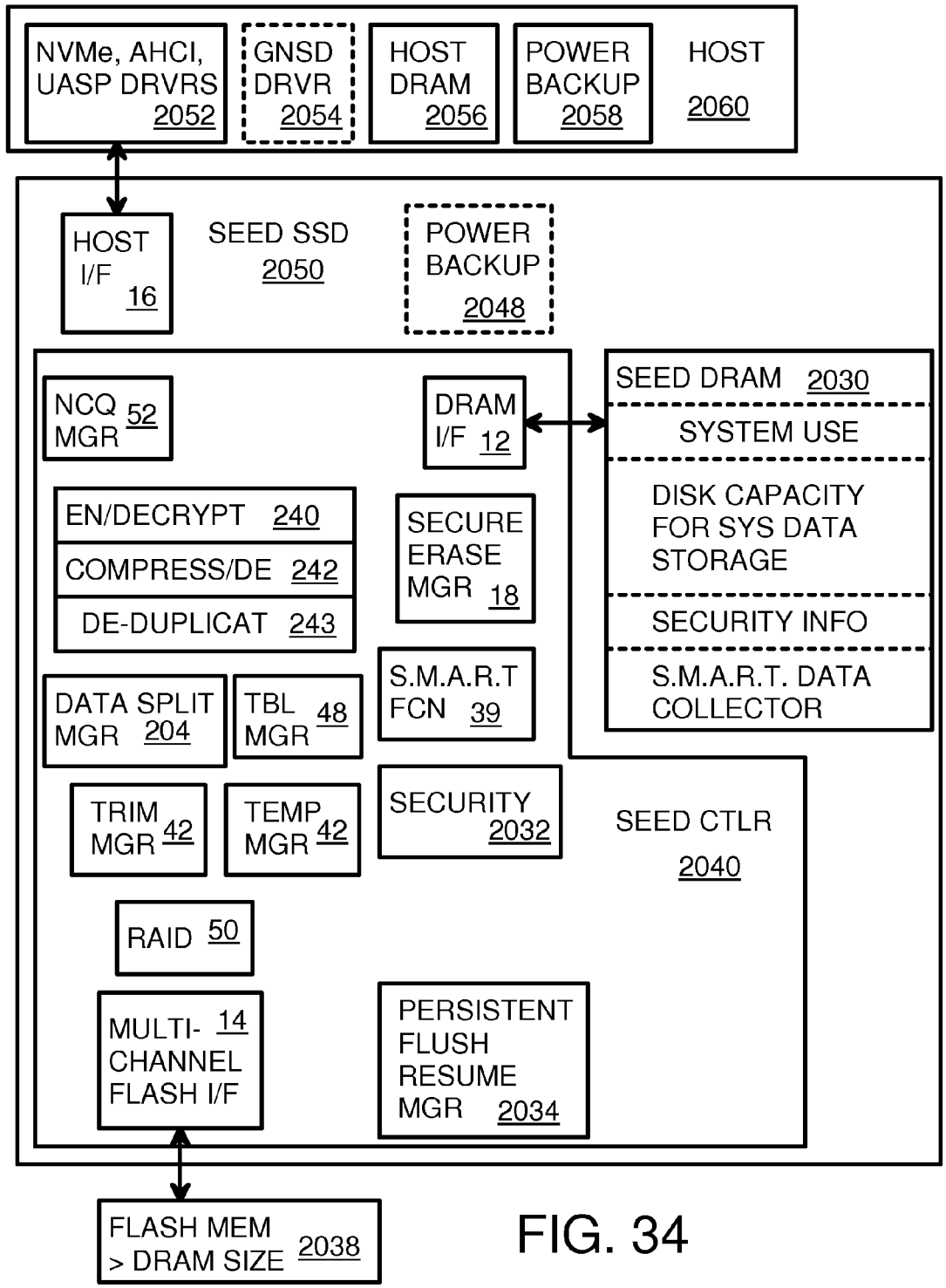
FIG. 34 is a block diagram of a Super Enhanced Endurance Device (SEED) with a large sized DRAM as storage, which can be backed up to the eMMC on power off with an optional GNSD driver in the host.

FIG. 34 is a block diagram of a Super Enhanced Endurance Device (SEED) with an endurance controller and an optional GNSD driver in the host. In this alternative, SEED SSD 2050 interfaces directly to flash memory 2038. SEED SSD 2050 may work alone or with host GND driver 2054 in host 2060. Host 2060 also contains power backup 2038, host DRAM 2056, and interface drivers 2052 which may include drivers for NVMe, ACHI, UASP, or other interface standards.

SEED SSD 2050 has host interface 16, which communicates with host 2060 using a bus such as a PCIe, SATA, or Universal-Serial-Bus (USB), NVMe, Thunderbolt, eMMC, iSSD, etc. Host data from host interface 16 is sent to SEED controller 2040.

DRAM interface 12 reads and writes data in SEED DRAM 2030, which may store system data, security information, S.M.A.R.T. data collector information, firmware, and other buffers. The capacity of flash memory 2038 is larger than the capacity of SEED DRAM 2030 so that persistent flush resume manager 2034 may copy the entire contents of SEED DRAM 2030 to flash memory 2038 when power fails. At power up, the persistent flush resume manager 2034 may copy the previously copied contents from flash memory 2038 to SEED DRAM 2030.

Temp manager 42 controls temp data. Security 2032 manages security functions. Multi-channel flash interface 14 programs data pages and erases blocks in flash memory 2038, which may be organized into several channels.

Native Command Queue (NCQ) manager 52 may re-order host commands from host 2060 and manage a queue of host commands received through host interface 16.

RAID controller 50 writes new data across several channels of flash memory 2038 and may replicate data to provide redundancy and data recovery.

Updates are made to the logical-to-physical mapping in mapping tables that are managed by table manager 48. Table manager 48 also tracks the type of data that is stored in each logical block or page so that temp files, paging files, FAT, FDB, and user data files are tracked once identified and categorized by data split manager 204. Alternatively, host 2060 can pass the data type information through vendor commands to SEED SSD 2050 so data split manager 204 doesn't duplicate the work done by GNSD driver 2054. Alternately, this function can be optionally disabled for certain situations.

TRIM manager 42 processes a TRIM command from the file system or OS on host 2060. The TRIM command indicates that a sector is no longer needed by the host and can be wiped or erased. When using DRAM as storage, TRIM manager 42 can change the DRAM contents to all 1's which erases the states of flash cells. At power off/fail, a reduced write time for the DRAM contents to Flash memory 2038 occurs due to empty pages or blocks. De-Duplication engine 243 finds and deletes duplicate copies of data files to reduce the write load. Data may be operated upon by compression/decompression engine 242 and encryption/decryption engine 240.

S.M.A.R.T. function 39 processes S.M.A.R.T. commands or vendor commands from host 2060, such as to monitor and control error correction, wear, bad block, and other flash memory management. S.M.A.R.T. stands for Self-Monitoring, Analysis and Reporting Technology. The host can use the S.M.A.R.T. command sets to monitor some important data from the SSD device such as power on time, wear-leveling count, etc. The Host can use this data to diagnoses and identify the life expectancy of the SSD. It can also use the information to determine the warranty coverage based on the usage. The host can replace the SSD drive before it experiences a real casualty. In RAID, the host can use S.M.A.R.T. commands to avoid a more expensive RAID 5 configuration.

Secure erase manager 18 performs a higher-security erase operation such as writing all zeros or all ones to a block to remove data from flashes and DRAM when required.

Power backup 2048 provides backup power so that SEED SSD 2050 may write data from SEED DRAM 2030 to flash memory 2038 when power fails. Flash memory 2038 may receive writes only when power fails and the contents of SEED DRAM 2030 are flushed. Alternately SEED DRAM 2038 may be the first tier storage and flash memory 2038 be the second tier storage of FIG. 32 when flash memory 2038 has a large enough capacity. Thus most of the time flash memory is not used.

Alternate Embodiments

Several other embodiments are contemplated by the inventors. For example, while eMMC devices have been described, other flash devices with low-level controllers such as UFS or iSSD, etc., may be substituted. Other flash controller standards may be developed in the future that may also be substitutes.

While moving a full meta-page to the SEED, SSD, or to flash has been described, a nearly full meta-page could also be moved before being completely full. Thus full may refer to being within some threshold of full, such as the meta-page size minus 512 bytes.

Many encodings of the data-type bits and other status fields, pointers, etc. are possible. The data-type status bits do not need to be the first bits in an entry. Entries could be linked to entries in other tables, such as having a separate table for tags or valid bits. Temporary files could have a variety of extensions, and new extensions could be added to the list to search for. Temporary files created by well-known programs such as word processors and internet browsers have well-known files extensions, but additional extensions may be added at any time. These additional file extensions could be added through firmware updates to the control firmware for SEED and SSD controllers.

The size of DRAM buffer used by different software or translation layers may be fixed by the firmware of the SSD controller. Each part may also be dynamically adjusted by the controller firmware automatically or manually based on the usage or preference of the user. Due to the limited size of DRAM buffers, not all functions may be accommodated in the DRAM buffer at the same time. The various functions may be adaptive to the real working environment. The controller may adjust the size used by each function to optimize the DRAM buffer. The adaptive adjustment can be done periodically based on the usage patterns of the device.

For a TLC flash device, the DRAM buffer can be substituted with other memory technologies, such as NVRAM, phase-change memory (PCM), ferroelectric random-access memory (FRAM), Magnetoresistive RAM (MRAM), Memristor, PRAM, Resistive RAM (RRAM), Racetrack memory, nano RAM (NRAM), etc. The advantage of NVRAM is that all the supported tables, etc. may remain in NVRAM since there is no need to put the data in the flash memory. Other flash memory destined data, such as the data write cache, is retained in NVRAM even with power off, so a backup power circuit is no longer needed even when power is suddenly turned off. Temp caches, mapping tables, and read caches may be discarded at power down or at the next power up initialization.

The DRAM buffer may be substituted with combinations such as DRAM+SRAM, DRAM+MLC, DRAM+PCRAM, or DRAM+MRAM. When combinations of DRAM buffering is used such as DRAM+MLC, the supported functions are managed in DRAM but some of them are stored in MLC flash. Some of the data in the DRAM buffer can be discarded eventually such as temp. data and mapping tables, and read cache and mapping tables, that are not moved to MLC when power is off. Tables and data that need to be kept when power is off, such as the block erase count table, the page status table, S.M.A.R.T. data collector, etc. need to be stored to MLC flash when power is turned off suddenly. Copying to 2-level MLC is faster compared to 3-level TLC flash memory. When server applications, temp. data and mapping tables, and read cache and mapping tables cannot be discarded; those areas may be stored to MLC using a power backup when power is turned off suddenly. Another way is to insure the data of interest in the DRAM is copied to the MLC. In case of a power off, a valid copy of data can be kept in MLC. At power up, the data can be loaded back to DRAM from MLC. The copying method can be modified by recording the minor differences, which will reduce the amount of copying data and therefore reduce the writes to MLC.

DRAM and MLC or DRAM and SLC do not necessary use different types of flash such as SLC, MLC, TLC, QLC, PLC, 3D NAND etc. Instead, the MLC can be derived from the TLC by allocating a part of the TLC that only has strong pages programmed. The SLC can be derived from MLC, TLC, QLC, PLC, etc. by allocating part of the MLC, TLC, QLC, PLC, etc. that only has strong pages programmed. For example, an Enhanced TLC Flash can be realized by a portion of TLC configured as SLC (with strong pages) using such as one quarter of the TLC used as SLC (strong page) and the reminder of the TLC as TLC (weak page). Or a portion of TLC configured as MLC (strong page) and the reminder of TLC as TLC (weak page). Additionally, a program/erase manager may slow down page writing and block erasing time to help prolong the life of the oxide layer of cells of the flash. The slower page write/block erase time can be applied to the Enhanced TLC Flash to increase the endurance at the expense of decreased retention time. By using a refresh manager, the retention time can be increased. The refresh manager can track the usage of blocks as SLC (strong page) or TLC (weak page) and then adjust the refresh time accordingly. Alternatively, an enhanced TLC Flash can have a portion of TLC configured as SLC (strong page), such as one quarter of TLC used as SLC (strong page). Similarly, MLC can have a combination of SLC (strong page)/MLC (weak page) and QLC can be used as combinations such as SLC (strong page)/QLC (weak page), MLC (strong page)/QLC (strong page), TLC (strong page)/QLC (strong page), or any combination of SLC/MLC/TLC/QLC.

The super-endurance flash drive can be combined with a Hard Disk Drive (HDD), with a super-endurance flash drive as the cache and the HDD as storage. The super-endurance flash drive is of high endurance and is a better fit for use as a cache. The overall performance may improve for this hybrid device. In case of power off, a valid copy of data can be kept in HDD. At power up, those data can be loaded back to DRAM from the HDD. The copying method can be modified by recording minor differences, which will reduce the amount of data copied and therefore reduces writes to HDD.

The boot image of the OS can be preloaded to the DRAM buffer to speed the host boot up. Once the boot up process ends, the DRAM buffer is released for other use during later normal operation.

A dirty DRAM buffer may need to be written to flash memory when the host is in sleep or stand-by mode. The dirty DRAM buffer can be written to flash memory when the user of the host is logged out.

The grouping of write data is not limited to a page as a unit. Grouping data can be in a larger units such as multiple-pages (meta-pages) and whole blocks, etc.

While categorization of the data-type of a host access has been described as comparing the logical address from the host to one or more address ranges, only a portion of the logical address may be compared to ranges that represent the address ranges. Data types could also be identified by parsing the host write data for certain formats, such as a FAT format or a FDB format. Earlier host writes in a sequence could also be checked for their data formats.

The FAT file system has been used as an example. FDB/FAT are the meta data of the FAT file system. Other file systems such as LINUX, Apple OS, and Android etc., have their own meta data with different names, but are equivalents.

Each block may be divided into multi-page zones. For example, a block may have 16 pages and 4 zones, with 4 pages per zone. Some of the mapping may be for zones rather than for individual pages or blocks in this alternative embodiment. Alternatively, in a special case, there can be one page per zone. Fewer mapping entries are needed with zone-mode than for page-mode, since each zone is multiple pages.

The upper bits of the logical-sector address (LSA) from the host may select a cluster or district. All of the entries in a mapping table may be for the same district. When the district number from the LSA matches the district number of all the entries in the mapping table, the LBA from the LSA selects an entry in the mapping table. Hybrid or multi-level mapping tables may also be used. Since the LBA ranges for the FAT1/2 are known, the table contents data type bits "100" can be omitted. The Mapping table can have a granularity of block or page.

Copying of blocks for relocation is less frequent with page mapping since the sequential-writing rules of the non-SLC flash are violated less often in page mode than in block mode. This increases the endurance of the flash system and increases performance.

The mapping tables may be located in an extended address space, and may use virtual addresses or illegal addresses that are greater than the largest address in a user address space. Pages may remain in the host's page order or may be remapped to any page location. In another embodiment such as for data center applications, the paging and temporary files can be treated as normal user data to simplify the controller operation but with the expense of flash endurance. The endurance spare/swap area can provide extended over-provisioning by using a DRAM buffer as endurance spare/swap buffer instead of using flash memory. The compression function can be optionally turned off in situations when the host is already providing a compression function. In other embodiments, the controller can treat the paging file as user data file to simplify the controller function.

Many variations of the block diagrams are possible. A ROM such as an EEPROM could be connected to or part of a controller and be dedicated to storing firmware for a virtual storage processor. This firmware could also be stored in the main flash memory.

The Host interface bus can be a Serial AT-Attachment (SATA) bus, a Peripheral Components Interconnect Express (PCIe) bus, a compact flash (CF) bus, or a Universal-Serial-Bus (USB), NVMe, a Firewire 1394 bus, a Fibre Channel (FC) bus, Thunderbolt, etc. Internal buses may use standards such as for a Serial AT-Attachment (SATA) bus, an integrated device electronics (IDE) bus, a Peripheral Components Interconnect Express (PCIe) bus, a compact flash (CF) bus, a Universal-Serial-Bus (USB), a Secure Digital (SD) bus, a Multi-Media Card (MMC) bus, a Firewire 1394 bus, a Fibre Channel (FC) bus, various Ethernet buses, etc. UFS, eMMC, or iSSD flash devices may include TLC, SLC, or MLC flash only or can be combined SLC/MLC flash or other combinations.

The flash memory, controllers, and other components may be embedded on a motherboard or SSD board or could be on separate modules. Capacitors, buffers, resistors, and other components may be added. The controller and other components may be integrated on the motherboard or on a separate board or module. Flash memory can be integrated with the controller or with raw-NAND flash memory chips as a single-chip device or a plug-in module or board.

Using multiple levels of controllers, such as in a president-governor arrangement of controllers, the controllers in the SEED may be less complex than would be required for a single level of control for wear-leveling, bad-block management, re-mapping, caching, power management, etc. Less expensive hardware may be used in the controller, such as using an 8051 processor for a controller or a virtual storage processor or a transaction manager, rather than a more powerful processor core such as a an Advanced RISC Machine ARM-9 CPU core. For a certain applications, a more powerful processor is considered.

Different numbers and arrangements of flash storage blocks can connect to the SEED. Rather than use a LBA storage bus interface or differential serial packet buses, other serial buses such as synchronous Double-Data-Rate (DDR), ONFI, Toggle NAND, a differential serial packet data bus, a legacy flash interface, etc.

Mode logic could sense the state of a pin only at power-on rather than sense the state of a dedicated pin. A certain combination or sequence of states of pins could be used to initiate a mode change, or an internal register such as a configuration register could set the mode. A multi-bus-protocol chip could have an additional personality pin to select which serial-bus interface to use, or could have programmable registers that set the mode to hub or switch mode.

The transaction manager, controllers, processes, and functions can be implemented in a variety of ways. Functions and processes can be programmed and executed by a CPU or other processor, or can be implemented in dedicated hardware, firmware, or in some combination. Many partitionings of the functions can be substituted. The SEED controller may be hardware, or may include firmware or software or combinations thereof.

Overall system reliability is greatly improved by employing Parity/ECC with multiple flash channels, and stripping data segments into a plurality of NVM blocks. If one flash block or flash module is damaged, data may be recoverable, or the SEED can initiate a "Fault Recovery" or "Auto-Rebuild" process to insert a new flash module, and to recover or to rebuild the "Lost" or "Damaged" data. The overall system fault tolerance is significantly improved.

Wider or narrower data buses and flash-memory chips could be substituted, such as with 16 or 32-bit data channels. Alternate bus architectures with nested or segmented buses could be used internal or external to the SEED. Two or more internal buses can be used in the SEED to increase throughput. More complex switch fabrics can be substituted for the internal or external bus.

Data striping can be done in a variety of ways, as can parity and error-correction code (ECC). Packet re-ordering can be adjusted depending on the data arrangement used to prevent re-ordering for overlapping memory locations.

Additional pipeline or temporary buffers and FIFO's could be added. Separate page buffers could be provided in each channel. A clock source could be added.

A single package, a single chip, or a multi-chip package may contain one or more of the plurality of channels of flash memory and/or the SEED or SSD. The invention is not limited to the usage of eMMC. eMMC, UFS, or iSSD devices can be replaced with any kind of nonvolatile device with nonvolatile flash memory and a controller.

A MLC-based flash device may have four MLC flash chips with two parallel data channels, but different combinations may be used to form other flash modules, for example, four, eight or more data channels, or eight, sixteen or more MLC chips. The flash devices and channels may be in chains, branches, or arrays. For example, a branch of 4 flash devices could connect as a chain to the SEED. Other size aggregation or partition schemes may be used for different access of the memory.

The host can be a desktop PC motherboard or other PC platform such as a server, a Notebook, a Netbook, a tablet, a smart phone, a mobile communication device, a personal digital assistant (PDA), a digital camera, a production tool or tester, a combination device, or other device. The host bus or host-device interface can be SATA, PCIE, Thunderbolt, SD, USB, NVMe, eMMC, iSSD, or other host bus, while an internal bus to a flash module can be PATA, multi-channel SSD using multiple SD/MMC, compact flash (CF), USB, or other interfaces in parallel. A flash module could be a standard PCB or may be a multi-chip modules packaged in a TSOP, BGA, LGA, COB, PIP, SIP, CSP, POP, or Multi-Chip-Package (MCP) packages and may include raw-NAND flash memory chips or raw-NAND flash memory chips may be in separate flash chips, or other kinds of NVM flash memory such as toggle, ONFI, eMMC, iSSD, UFS, 3D NAND. SEED SSD may use eMMC with a RAID and eMMC may use a SEED structure. The internal bus may be fully or partially shared or may be separate buses. The SSD system may use a circuit board with other components such as LED indicators, capacitors, resistors, etc. Power management may be added at one or more levels. The SEED SSD can work with or without a VMD driver on the host. A PCIe RAID DRAM cache card may incorporate a VMD driver and multiple SEED structured SSD's.

Directional terms such as upper, lower, up, down, top, bottom, etc. are relative and changeable as the system or data is rotated, flipped over, etc. These terms are useful for describing the device but are not intended to be absolutes.

Rather than use a controller only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The size of data such as sectors, pages, and blocks may vary. A sector may have 512 bytes, a page may have 16 sectors, and a block may have 128 pages as one of many examples.

Various table and data formats may be used. The write data can be packed and logged one-by-one to the data write cache as a page unit by the flash controller. The packed data size from the host can be either a large size such as more than a meta-page unit or a small size such as less than a sector. A header is added the show the relation of the data to the LBA from host. A separate packed table maps the LBA from the host to the offset location of the data and header in the meta-page unit of the data write cache. The data write cache can have a capacity of more than two meta-page units in size. When the data write cache is full or an elapsed time is reached, a selected meta-page unit will be moved to the flash memory from the data write cache. The packed table maps the LBA from the host to the offset location of the data and header in the meta-page unit of the flash memory. In the case of overwriting old data from host, if the packed data is still in the data write cache, the old data can be discarded by moving the packed data up and appending the new updated data into the data write cache and updating the packed table. Otherwise, if the packed data is in the flash memory, the new and old data will be compared and a delta data will be generated to show the difference. The delta data and its header will be appended to the data write cache. The new header will also include the previous old data location. The packed table will map the LBA to the delta data position.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An enhanced-endurance Solid-State Drive (SSD) controller comprising:
    a host interface for receiving host reads and host writes from a host;
    a data write cache for storing host write data;
    a data read cache for storing data for reading by the host;
    a grouping engine for grouping data stored in the data write cache into meta-pages;
    an un-grouping engine for un-grouping data in stored in meta-pages into ungrouped data for storage in the data read cache;
    wherein meta-pages are sent from the grouping engine to a flash memory device, and meta-pages stored in the flash memory device are received by the un-grouping engine;
    a multi-channel flash interface for transferring data from the grouping engine in a plurality of stripes for writing to a plurality of flash memory devices, and for reading a plurality of stripes from the plurality of flash memory devices for transfer to the un-grouping engine;
    a dynamic-random-access memory (DRAM) buffer interface for interfacing to a DRAM buffer for storing the data write cache, the data read cache, and buffers for the grouping engine and for the un-grouping engine;

a flush manager for flushing data stored in the DRAM buffer to the plurality of flash memory devices when power is lost;
a resume manager for fetching flushed data from the plurality of flash memory devices and fore writing to the DRAM buffer when power is restored;
a file type identifier for generating a data type for a host write received by the host interface from the host;
a data split manager for sorting host write data based on the data type generated by the file type identifier;
wherein the data write cache stores host write data having a user data type;
a meta-data cache, in the DRAM buffer, for storing host write data having a meta-data data type;
a paging cache, in the DRAM buffer, for storing host write data having a paging file data type; and
a temp cache, in the DRAM buffer, for storing host write data having a temp data type;
wherein the temp cache is not flushed to the plurality of flash memory devices by the flush manager;
wherein the meta-data cache is flushed to the plurality of flash memory devices by the flush manager.

2. The enhanced-endurance Solid-State Drive (SSD) controller of claim 1 further comprising:
a Redundant Array of Individual Disks (RAID) manager for arranging data from the grouping engine into the plurality of stripes for writing to the plurality of flash memory devices, and for redundantly storing data across the plurality of flash memory devices wherein data is recoverable from remaining flash memory devices when a flash memory device in the plurality of flash memory devices fails.

3. The enhanced-endurance Solid-State Drive (SSD) controller of claim 1 further comprising:
a first split manager for splitting data received from the plurality of flash memory devices into recently-accessed and non-recently-accessed data;
a second split manager for splitting data received from the plurality of flash memory devices into frequently-accessed and non-frequently-accessed data;
wherein the data read cache further comprises:
a first data read cache for storing frequently-accessed, recently-accessed data for reading by the host;
a second data read cache for storing frequently-accessed, non-recently-accessed data for reading by the host;
a third data read cache for storing non-frequently-accessed, recently-accessed data for reading by the host; and
a fourth data read cache for storing non-frequently-accessed, non-recently-accessed data for reading by the host.

4. The enhanced-endurance Solid-State Drive (SSD) controller of claim 1 further comprising:
an encryption engine, coupled to receive host writes, for generating encrypted data; and
a compression engine, coupled to receive host writes, for generating compressed data.

5. The enhanced-endurance Solid-State Drive (SSD) controller of claim 1 wherein the plurality of flash memory devices each comprise:
a volatile memory buffer for storing grouped meta-pages received from the multi-channel flash interface;
a flash memory for storing grouped meta-pages from the volatile memory buffer;
a flash interface for erasing blocks and writing pages in the flash memory, wherein a block is a multiple of pages in size; and
an error-correction code (ECC) manager for generating ECC code to append to the grouped meta-pages written to the flash memory.

6. The enhanced-endurance Solid-State Drive (SSD) controller of claim 5 wherein the plurality of flash memory devices each further comprise:
a bad page manager for tracking bad pages of the flash memory; and
a wear leveler for assigning new data to empty blocks of the flash memory having a low erase count.

7. The enhanced-endurance Solid-State Drive (SSD) controller of claim 1 wherein the plurality of flash memory devices each comprise an embedded Multi-Media Card (eMMC) flash device, a Universal Flash Storage (UFS) flash device, or an Integrated Solid-State Drive (iSSD) flash device.

8. An enhanced-endurance Solid-State Drive (SSD) comprising:
a dynamic-random-access memory (DRAM) buffer for storing caches and tables;
a plurality of managed flash devices, each managed flash device having a flash memory and a managing controller that manages bad blocks within the flash memory by transferring data from worn or bad blocks within the flash memory to fresh blocks within the flash memory to perform low-level wear leveling and bad block management;
a Super Enhanced Endurance Device (SEED) controller that comprises:
a host interface for receiving host reads and host writes from a host;
a DRAM interface for managing the DRAM buffer, the DRAM buffer having a data write cache for storing host write data and a data read cache for storing data for reading by the host;
a grouping engine for grouping data stored in the data write cache into meta-pages;
an un-grouping engine for un-grouping data in stored in meta-pages into ungrouped data for storage in the data read cache;
wherein meta-pages are sent from the grouping engine to a managed flash device in the plurality of managed flash devices, and meta-pages stored in the managed flash device are received by the un-grouping engine; and
a multi-channel flash interface for transferring data from the grouping engine in a plurality of stripes for writing to the plurality of managed flash devices, and for reading a plurality of stripes from the plurality of managed flash devices for transfer to the un-grouping engine;
wherein the SEED controller further comprises:
a file type identifier for generating a data type for a host write received by the host interface from the host;
a data split manager for sorting host write data based on the data type generated by the file type identifier;
wherein the data write cache stores host write data having a user data type;
a meta-data cache, in the DRAM buffer, for storing host write data having a meta-data data type;
a paging cache, in the DRAM buffer, for storing host write data having a paging file data type;
a temp cache, in the DRAM buffer, for storing host write data having a temp data type;
wherein the temp cache is not flushed to the plurality of managed flash devices;
wherein the meta-data cache is flushed to the plurality of managed flash devices.

9. The enhanced-endurance SSD of claim 8 wherein the plurality of managed flash devices each comprise an embedded Multi-Media Card (eMMC) flash device, a Universal Flash Storage (UFS) flash device, or an Integrated Solid-State Drive (iSSD) flash device.

10. The enhanced-endurance SSD of claim 8 wherein the SEED controller further comprises:
   a first split manager for splitting data received from the plurality of managed flash devices into recently-accessed and non-recently-accessed data;
   a second split manager for splitting data received from the plurality of managed flash devices into frequently-accessed and non-frequently-accessed data;
   wherein the DRAM buffer further comprises:
   a first data read cache for storing frequently-accessed, recently-accessed data for reading by the host;
   a second data read cache for storing frequently-accessed, non-recently-accessed data for reading by the host;
   a third data read cache for storing non-frequently-accessed, recently-accessed data for reading by the host; and
   a fourth data read cache for storing non-frequently-accessed, non-recently-accessed data for reading by the host.

11. The enhanced-endurance SSD of claim 10 wherein the SEED controller further comprises:
   an encryption engine, coupled to receive host writes, for generating encrypted data; and
   a compression engine, coupled to receive host writes, for generating compressed data.

12. The enhanced-endurance SSD of claim 10 wherein the SEED controller further comprises:
   a Redundant Array of Individual Disks (RAID) manager for arranging data from the grouping engine into the plurality of stripes for writing to the plurality of managed flash devices, and for redundantly storing data across the plurality of managed flash devices wherein data is recoverable from remaining managed flash devices when a managed flash device in the plurality of managed flash devices fails.

13. The enhanced-endurance SSD of claim 10 wherein each managed flash device in the plurality of managed flash devices further comprises:
   a low-level DRAM buffer managed by the managing controller;
   a spare/swap area in the low-level DRAM buffer;
   wherein the managing controller uses the spare/swap area in the low-level DRAM buffer to merge valid data in the flash memory with new data to generate combined data when over-writing a full page or a partial page of an existing block in the flash memory by writing new data to a spare block in the low-level DRAM buffer related to the existing block in the flash memory, and when the spare block is needed by additional new data for a different block in the flash memory, writing a combination of the spare block with the new data and data from the existing block in the flash memory into a swap block in the flash memory and marking a page status for pages of the existing block in the flash memory as a garbage page.

14. A Solid-State Drive (SSD) comprising:
   a plurality of managed flash devices, each managed flash device comprising:
      a flash memory
      a managing controller that manages bad blocks within the flash memory by transferring data from worn blocks within the flash memory to fresh blocks within the flash memory to perform low-level wear leveling and bad block management;
      a low-level flash interface in the managing controller for erasing blocks and writing pages in the flash memory, wherein a block is a multiple of pages in size;
   a dynamic-random-access memory (DRAM) buffer for storing tables and caches including a write data cache and a read data cache;
   a Super Enhanced Endurance Device (SEED) controller comprising:
      a host interface for receiving host reads and host writes from a host;
      a DRAM interface for managing the DRAM buffer;
      a grouping engine for grouping data stored in the write data cache into meta-pages;
      an un-grouping engine for un-grouping data in stored in meta-pages into ungrouped data for storage in the read data cache;
      wherein meta-pages are sent from the grouping engine to a managed flash device in the plurality of managed flash devices, and meta-pages stored in the managed flash device are received by the un-grouping engine; and
      a striping flash interface for transferring data from the grouping engine in a plurality of stripes for writing to the plurality of managed flash devices, and for reading a plurality of stripes from the plurality of managed flash devices for transfer to the un-grouping engine;
      a file type identifier for generating a data type for a host write received by the host interface from the host;
      a data split manager for sorting host write data based on the data type generated by the file type identifier;
      wherein the write data cache stores host write data having a user data type;
      a meta-data cache, in the DRAM buffer, for storing host write data having a meta-data data type;
      a paging cache, in the DRAM buffer, for storing host write data having a paging file data type;
      a temp cache, in the DRAM buffer, for storing host write data having a temp data type;
      wherein the temp cache is not flushed to the plurality of managed flash devices;
      wherein the meta-data cache is flushed to the plurality of managed flash device.

15. The SSD of claim 14 wherein the SEED controller further comprises:
   a Redundant Array of Individual Disks (RAID) manager for arranging data from the grouping engine into the plurality of stripes for writing to the plurality of managed flash devices, and for redundantly storing data across the plurality of managed flash devices wherein data is recoverable from remaining managed flash devices when a managed flash device in the plurality of managed flash devices fails.

16. The SSD of claim 15 wherein the plurality of managed flash devices each comprise an embedded Multi-Media Card (eMMC) flash device, a Universal Flash Storage (UFS) flash device, or an Integrated Solid-State Drive (iSSD) flash device.

17. The SSD of claim 14 wherein the SEED controller further comprises:
   a first split manager for splitting data received from the plurality of managed flash devices into recently-accessed and non-recently-accessed data;
   a second split manager for splitting data received from the plurality of managed flash devices into frequently-accessed and non-frequently-accessed data;

wherein the DRAM buffer further comprises:
a first data read cache for storing frequently-accessed, recently-accessed data for reading by the host;
a second data read cache for storing frequently-accessed, non-recently-accessed data for reading by the host;
a third data read cache for storing non-frequently-accessed, recently-accessed data for reading by the host; and
a fourth data read cache for storing non-frequently-accessed, non-recently-accessed data for reading by the host.

* * * * *